US006903364B1

(12) United States Patent
Takayama et al.

(10) Patent No.: US 6,903,364 B1
(45) Date of Patent: Jun. 7, 2005

(54) SEMICONDUCTOR STRUCTURES USING A GROUP III-NITRIDE MATERIAL SYSTEM WITH REDUCED PHASE SEPARATION AND METHOD OF FABRICATION

(75) Inventors: Toru Takayama, Menlo Park, CA (US); Takaaki Baba, Los Altos, CA (US); James S. Harris, Jr., Stanford, CA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/442,077

(22) Filed: Nov. 16, 1999

Related U.S. Application Data

(63) Continuation-in-part of application No. 09/276,886, filed on Mar. 26, 1999, now Pat. No. 6,521,917, which is a continuation-in-part of application No. 09/365,105, filed on Jul. 30, 1999, now Pat. No. 6,229,150.

(51) Int. Cl.[7] .............................................. H01L 33/00
(52) U.S. Cl. .......................... 257/12; 257/13; 257/22; 257/96; 257/103
(58) Field of Search ................................ 257/12–14, 22, 257/94, 96, 103

(56) References Cited

U.S. PATENT DOCUMENTS

| | | |
|---|---|---|
| 5,828,684 A | 10/1998 | Van de Walle |
| 5,834,331 A | 11/1998 | Razeghi |
| 6,229,150 B1 * | 5/2001 | Takayama et al. ............ 257/12 |
| 6,521,917 B1 * | 2/2003 | Takayama et al. .......... 257/103 |

FOREIGN PATENT DOCUMENTS

| | | |
|---|---|---|
| EP | 0951077 A2 | 10/1999 |
| JP | 06164055 | 10/1994 |
| JP | 11330633 | 11/1999 |
| WO | WO 00/59084 | 10/2000 |

OTHER PUBLICATIONS

Kawanishi, H. et al., "(BAlGa)N Quaternarty System and Epitaxial Growth on (0001) 6H–SiC Substrate By Low–Pressure MO–VPE", Dept. of Electronic Engineering, Kohgakuin University, Tokyo Japan (no date).

Edgar, J.H., "Unsable Composition Region in the Wurtzite $B_{1-x-y}Ga_xAl_yN$ System", Journal of Crystal Growth, 208, Jan. 2000, pp. 179–182.

Piner, E.L. et al., "Growth and Properties of InGaN and AlInGaN Thin Films on (0001) Sapphire", MRS Internet Journal, vol. 1, Article 43, Dec. 17, 1996.

Matsuoka, T., "Phase Separation in Wurtzite $In_{1-x-y}Ba_xAl_yN$", MRS Internet Journal, Nitride Semiconductor Research, Dec. 4, 1998.

* cited by examiner

*Primary Examiner*—Minhloan Tran
(74) *Attorney, Agent, or Firm*—McDermott Will & Emery LLP

(57) ABSTRACT

Group III-nitride quaternary and pentenary material systems and methods are disclosed for use in semiconductor structures, including laser diodes, transistors, and photodetectors, which reduce or eliminate phase separation and provide increased emission efficiency. In an exemplary embodiment the semiconductor structure includes a first ternary, quaternary or pentenary material layer using BInGaAlN material system of a first conduction type formed substantially without phase separation, and a quaternary or pentenary material active layer using BInGaAlN material system substantially without phase separation, and a third ternary, quaternary or pentenary material layer using BInGaAlN material system of an opposite conduction type formed substantially without phase separation.

47 Claims, 54 Drawing Sheets

US 6,903,364 B1

SEMICONDUCTOR STRUCTURES USING A GROUP III-NITRIDE MATERIAL SYSTEM WITH REDUCED PHASE SEPARATION AND METHOD OF FABRICATION

RELATED CASES

This application is a continuation in part of U.S. patent applications Ser. No. 09/276,886 filed Mar. 26, 1999 now U.S. Pat. No. 6,521,917, entitled "Semiconductor Structures Using A Group III-Nitride Quaternary Material System with Reduced Phase Separation and Method of Fabrication" and Ser. No. 09/365,105 filed Jul. 30, 1999 now U.S. Pat. No. 6,229,150, entitled "SemiConductor Structures Using A Group III-Nitride Quaternary Material System with Reduced Phase Separation and Method of Fabrication".

FIELD OF THE INVENTION

This application relates to semiconductor structures and processes, and particularly relates to group III-nitride materials systems and methods such as might be used in laser diodes.

BACKGROUND OF THE INVENTION

The development of the blue laser light source has heralded the next generation of high density optical devices, including disc memories, DVDs, and so on. FIG. 1 shows a cross sectional illustration of a prior art semiconductor laser device. (S. Nakamura, MRS BULLETIN, Vol. 23, No. 5, pp. 37–43, 1998.) On a sapphire substrate 5, a gallium nitride (GaN) buffer layer 10 is formed, followed by an n-type GaN layer 15, and a 0.1 $\mu$m thick silicon dioxide ($SiO_2$) layer 20 which is patterned to form 4 $\mu$m wide stripe windows 25 with a periodicity of 12 $\mu$m in the GaN<1–100> direction. Thereafter, an n-type GaN layer 30, an n-type indium gallium nitride ($In_{0.1}Ga_{0.9}N$) layer 35, an n-type aluminum gallium nitride ($Al_{0.14}Ga_{0.86}N$)/GaN MD-SLS (Modulation Doped Strained-Layer Superlattices) cladding layer 40, and an n-type GaN cladding layer 45 are formed. Next, an $In_{0.02}Ga_{0.98}N/In_{0.15}Ga_{0.85}N$ MQW (Multiple Quantum Well) active layer 50 is formed followed by a p-type $Al_{0.2}Ga_{0.8}N$ cladding layer 55, a p-type GaN cladding layer 60, a p-type $Al_{0.14}Ga_{0.86}N$/GaN MD-SLS cladding layer 65, and a p-type GaN cladding layer 70. A ridge stripe structure is formed in the p-type $Al_{0.14}Ga_{0.86}N$/GaN MD-SLS cladding layer 55 to confine the optical field which propagates in the ridge waveguide structure in the lateral direction. Electrodes are formed on the p-type GaN cladding layer 70 and n-type GaN cladding layer 30 to provide current injection.

In the structure shown in FIG. 1, the n-type GaN cladding layer 45 and the p-type GaN 60 cladding layer are light-guiding layers. The n-type $Al_{0.14}Ga_{0.86}N$/GaN MD-SLS cladding layer 40 and the p-type $Al_{0.14}Ga_{0.86}N$/GaN MD-SLS cladding layer 65 act as cladding layers for confinement of the carriers and the light emitted from the active region of the InGaN MQW layer 50. The n-type $In_{0.1}Ga_{0.9}N$ layer 35 serves as a buffer layer for the thick AlGaN film growth to prevent cracking.

By using the structure shown in FIG. 1, carriers are injected into the InGaN MQW active layer 50 through the electrodes, leading to emission of light in the wavelength region of 400 nm. The optical field is confined in the active layer in the lateral direction due to the ridge waveguide structure formed in the p-type $Al_{0.14}Ga_{0.86}N$/GaN MD-SLS cladding layer 65 because the effective refractive index under the ridge stripe region is larger than that outside the ridge stripe region. On the other hand, the optical field is confined in the active layer in the transverse direction by the n-type GaN cladding layer 45, the n-type $Al_{0.14}Ga_{0.86}N$/GaN MD-SLS cladding layers 40, the p-type GaN cladding layer 60, and the p-type $Al_{0.14}Ga_{0.86}N$/GaN MD-SLS cladding layer 55 because the refractive index of the of the active layer is larger than that of the n-type GaN cladding layer 45 and the p-type GaN cladding layer 60, the n-type $Al_{0.14}Ga_{0.86}N$/GaN MD-SLS layer 40, and the p-type $Al_{0.14}Ga_{0.86}N$/GaN MD-SLS cladding layer 60. Therefore, fundamental transverse mode operation is obtained.

However, for the structure shown in FIG. 1, it is difficult to reduce the defect density to the order of less than $10^8$ $cm^{-2}$, because the lattice constants of AlGaN, InGaN, and GaN differ sufficiently different from each other that defects are generated in the structure as a way to release the strain energy whenever the total thickness of the n-type $In_{0.1}Ga_{0.9}N$ layer 35, the $In_{0.02}Ga_{0.98}N/In_{0.15}Ga_{0.85}N$ MQW active layer 50, the n-type $Al_{0.14}Ga_{0.86}N$/GaN MD-SLS cladding layer 40, the p-type $Al_{0.14}Ga_{0.86}N$/GaN MD-SLS cladding layer 65, and the p-type $Al_{0.2}Ga_{0.8}N$ cladding layer 55 exceeds the critical thickness. The defects result from phase separation and act as absorption centers for the lasing light, causing decreased light emission efficiency and increased threshold current. The result is that the operating current becomes large, which is turn causes reliability to suffer.

Moreover, the ternary alloy system of InGaN is used as an active layer in the structure shown in FIG. 1. In this case, the band gap energy changes from 1.9 eV for InN to 3.5 eV for GaN. Therefore, ultraviolet light which has an energy level higher than 3.5 eV cannot be obtained by using an InGaN active layer. This presents difficulties, since ultraviolet light is attractive as a light source for the optical pick up device in, for example, higher density optical disc memory systems and other devices.

To better understand the defects which result from phase separation in conventional ternary materials systems, the mismatch of lattice constants between InN, GaN, and AlN must be understood. The lattice mismatch between InN and GaN, between InN and AlN, and between GaN and AlN, are 11.3%, 13.9%, and 2.3%, respectively. Therefore, an internal strain energy accumulates in an InGaAlN layer, even if the equivalent lattice constant is the same as that of the substrate due to the fact that equivalent bond lengths are different from each other between InN, GaN, and AlN. In order to reduce the internal strain energy, there is a compositional range which phase separates in the InGaAlN lattice mismatched material system, where In atoms, Ga atoms, and Al atoms are inhomogeneously distributed in the layer. The result of phase separation is that In atoms, Ga atoms, and Al atoms in the InGaAln layers are not distributed uniformly according to the atomic mole fraction in each constituent layer. In turn, this means the band gap energy distribution of any layer which includes phase separation also becomes inhomogeneous. The band gap region of the phase separated portion acts disproportionately as an optical absorption center or causes optical scattering for the waveguided light. As noted above, a typical prior art solution to these problems has been to increase drive current, thus reducing the life of the semiconductor device.

As a result, there has been a long felt need for a semiconductor structure which minimizes lattice defects due to phase separation and can be used, for example, as a laser diode which emits blue or UV light at high efficiency, and for other semiconductor structures such as transistors.

SUMMARY OF THE INVENTION

The present invention substantially overcomes the limitations of the prior art by providing a semiconductor structure which substantially reduces defect densities by materially reducing phase separation between the layers of the structure. This in turn permits substantially improved emission efficiency. In general, the present invention utilizes group III-nitride quaternary and pentenary material systems and methods.

To reduce phase separation, it has been found possible to provide a semiconductor device with InGaAlN layers having homogeneous In content, Al content, Ga content distribution in each layer. In a light emitting device, this permits optical absorption loss and waveguide scattering loss to be reduced, resulting in a high efficiency light emitting device.

A quaternary material system such as InGaAlN has been found to provide, reproducibly, sufficient homogeneity to substantially reduce phase separation where the GaN mole fraction, x, and the AlN mole fraction, y, of all the constituent layers in the semiconductor structure satisfy the condition that $x+1.2y$ nearly equals a constant value.

A device according to the present invention typically includes a first layer of InGaAlN material of a first conductivity, an InGaAlN active layer, and a layer of InGaAlN material of an opposite conductivity successively formed on one another. By maintaining the mole fractions essentially in accordance with the formula $x+1.2y$ equals a constant, for example on the order of or nearly equal to one, the lattice constants of the constituent layers remain substantially equal to each other, leading to decreased generation of defects.

In an alternative embodiment, the semiconductor structure is fabricated essentially as above, using a quaternary materials system to eliminate phase separation and promote homogeneity across the layer boundaries. Thus, as before, the first cladding layer is a first conduction type and composition of InGaAlN, the active layer is InGaAlN of a second composition, and the second cladding layer is an opposite conduction type of InGaAlN having the composition of the first layer. However, in addition, the second cladding layer has a ridge structure. As before, the optical absorption loss and waveguide scattering loss is reduced, leading to higher efficiencies, with added benefit that the optical field is able to be confined in the lateral direction in the active layer under the ridge structure. This structure also permits fundamental transverse mode operation.

In a third embodiment of the invention, suited particularly to implementation as a laser diode, the semiconductor structure comprises a first cladding of a first conduction type of an $In_{1-x1-y1}Ga_{x1}Al_{y1}N$ material, an active layer of an $In_{1-x2-y2}Ga_{x2}Al_{y2}N$ material, and a second cladding layer of an opposite conduction type of an $In_{1-x3-y3}Ga_{x3}Al_{y3}N$ material, each successively formed on the prior layer. In such a materials system, x1, x2, and x3 define the GaN mole fraction and y1, y2, and y3 define the AlN mole fraction and x1, y1, x2, y2, x3, and y3 have a relationship of $0<=x1+y1<=1$, $0<x2+y2<1$, $0<=x3+y3<=1$, $1<=x1/0.80+y1/0.89$, $1<=x2/0.80+y2/0.89$, $1<=x3/0.80+y3/0.89$, $Eg_{InN}(1-x1-y1)+Eg_{GaN}x1+Eg_{AlN}y1>Eg_{InN}(1-x2-y2)+Eg_{GaN}x2+Eg_{AlN}y2$, and $Eg_{InN}(1-x3-y3)+Eg_{GaN}x3+Eg_{AlN}y3>Eg_{InN}(1-x2-y2)+Eg_{GaN}x2+Eg_{AlN}y2$, where $Eg_{InN}$, $Eg_{GaN}$, and $Eg_{AlN}$ are the band gap energy of InN, GaN, and AlN, respectively.

To provide a reproducible semiconductor structure according to the above materials system, an exemplary embodiment of InGaAlN layers have Ga content, x, and Al content, y, which satisfy the relationship $0<=x+y<=1$ and $1<=x/0.80+y/0.89$. As before, this materials system permits reduction of the optical absorption loss and the waveguide scattering loss, resulting in a high efficiency light emitting device. Moreover, the band gap energy of the InGaAlN of an active layer becomes smaller than that of the first cladding layer and the second cladding layer when x1, y2, x2, y2, x3, and y3 have a relationship of $0<=x1+y1<=1$, $0<x2+y2<1$, $0<=x3+y3<=1$, $1<=x1/0.80+y1/0.89$, $1<=x2/0.80+y2/0.89$, $1<=x3/0.80+y3/0.89$, $Eg_{InN}(1-x1-y1)+Eg_{GaN}x1+Eg_{AlN}y1>Eg_{InN}(1-x2-y2)+Eg_{GaN}x2+Eg_{AlN}y2$, and $Eg_{InN}(1-x3-y3)+Eg_{GaN}x3+Eg_{AlN}y3>Eg_{InN}(1-x2-y2)+Eg_{GaN}x2+Eg_{AlN}y2$. Under these conditions, the injected carriers are confined in the active layer. In at least some embodiments, it is preferable that the third embodiment, which can be a light emitting device, has an InGaAlN single or multiple quantum well active layer whose GaN mole fraction, xw, and AlN mole fraction, yw, of all the constituent layers satisfy the relationship of $0<xw+yw<1$ and $1<=x/0.80+y/0.89$.

One of the benefits of the foregoing structure is to reduce the threshold current density of a laser diode. This can be achieved by use of a single or multiple quantum well structure, which reduces the density of the states of the active layer. This causes the carrier density necessary for population inversion to become smaller, leading to a reduced or low threshold current density laser diode.

It is preferred that in the third embodiment, the condition of $xs+1.2ys$ nearly equals to a constant value—on the order of or near one—is satisfied, wherein xs and ys are the GaN mole fraction and the AlN mole fraction, respectively in each the constituent layers. As before, this causes the lattice constants of the each constituent layers to be nearly equal to each other, which in turn substantially minimizes defects due to phase separation In a fourth embodiment of the present invention, the semiconductor structure may comprise a first cladding layer of a first conduction type of a material $In_{1-x1-y1}Ga_{x1}Al_{y1}N$, an $In_{1-x2-y2}Ga_{x2}Al_{y2}N$ active layer, and a second cladding layer of an opposite conduction type of a material $In_{1-x3-y3}Ga_{x3}Al_{y3}N$, each successively formed one upon the prior layer. In addition, the second cladding layer has a ridge structure. For the foregoing materials system, x1, x2, and x3 define the GaN mole fraction, y1, y2, and y3 define the AlN mole fraction, and x1, y1, x2, y2, x3, and y3 have a relationship of $0<=x1+y1<=1$, $0<x2+y2<1$, $0<=x3+y3<=1$, $1<=x1/0.80+y1/0.89$, $1<=x2/0.80+y2/0.89$, $1<=x3/0.80+y3/0.89$, $Eg_{InN}(1-x1-y1)+Eg_{GaN}x1+Eg_{AlN}y1>Eg_{InN}(1-x2-y2)+Eg_{GaN}x2+Eg_{AlN}y2$, and $Eg_{InN}(1-x3-y3)+Eg_{GaN}x3+Eg_{AlN}y3>Eg_{InN}(1-x2-y2)+Eg_{GaN}x2+Eg_{AlN}y2$, where $Eg_{InN}$, $Eg_{GaN}$, and $Eg_{AlN}$ are the bandgap energy of InN, GaN, and AlN, respectively.

As with the prior embodiments, each of the InGaAlN layers have a homogeneous In content, Al content, and Ga content distribution, which can be obtained reproducibly when Ga content, x, Al content, y, of each InGaAlN layer satisfies the relationship $0<=x+y<=1$ and $1<=x/0.80+y/0.89$. The band gap energy of the InGaAlN active layer becomes smaller than that of the first cladding layer and the second cladding layer when x1, y1, x2, y2, x3, and y3 have a relationship of $0<=x1+y1<=1$, $0<x2+y2<1$, $0<=x3+y3<=1$, $1<=x1/0.80+y1/0.89$, $1<=x2/0.80+y2/0.89$, $1<=x3/0.80+y3/0.89$, $Eg_{InN}(1-x1-y1)+Eg_{GaN}x1+Eg_{AlN}y1>Eg_{InN}(1-x2-y2)+Eg_{GaN}x2+Eg_{AlN}y2$, and $Eg_{InN}(1-x3-y3)+Eg_{GaN}x3+Eg_{AlN}y3>Eg_{InN}(1-x2-y2)+Eg_{GaN}x2+Eg_{AlN}y2$. Similar to the prior embodiments, the injected carriers are confined in the active layer and the optical field is confined in the lateral direction in the active layer under the ridge structure, producing a fundamental transverse mode operation.

Also similar to the prior embodiments, the fourth embodiment typically includes an InGaAlN single or multiple quantum well active layer whose GaN mole fraction, xw, and AlN mole fraction, yw of all the constituent layers satisfy the relationship of 0<xw+yw<1 and 1<=x/0.80+y/0.89. Also, the condition xs+1.2ys nearly equals to a constant value on the order of or near one is typically satisfied, where xs and ys are the GaN mole fraction and the AlN mole fraction, respectively in each constituent layer. Similar parameters apply for other substrates, such as sapphire, silicon carbide, and so on.

In the Group-III nitride materials, BN is also attractive for the application to visible light emitting devices, visible light detectors, and high power transistor devices because of its wide band gap and high thermal conductivity. The same structural design concepts for InGaAlN material are also can be applied to the semiconductor devices using the other material systems such as BAlGaN, BGaInN, BInAlN.

In the case of the semiconductor device using BAlGaN material system, each of the BAlGaN layers have a homogeneous B content, Al content, and Ga content distribution, which can be obtained reproducibly when Al content, x, Ga content, y, of each BAlGaN layer satisfies the relationship 0<=x+y<=1 and 1<=1.04x+1.03y.

In the case of the semiconductor device using BGaInN material system, each of the BGaInN layers have a homogeneous B content, Ga content, and In content distribution, which can be obtained reproducibly when Ga content, x, In content, y, of each BGaInN layer satisfies the relationship 0<=x+y<=1 and 1<=1.03x+0.88y of 1<=0.95x+1.01y.

In the case of the semiconductor device using BInAlN material system, each of the BInAlN layers have a homogeneous B content, In content, and Al content distribution, which can be obtained reproducibly when In content, x, Al content, y, of each BInAlN layer satisfies the relationship 0<=x+y<=1 and 1<=1.01x+0.88y or 1<=0.61x+1.04y.

From the foregoing, it can be appreciated that the materials system of the present invention may be generalized with the description $B_{1-x-y-z}In_xGa_yAl_zN$, where each of x, y and z can be zero or nonzero for particular materials systems. It will be appreciated that, if one or x, y or z is zero, a quaternary materials system results. Thus, if x=0, the materials system is generally BGaAlN; if y=0, the materials system is generally BInAlN; while if z=0, the materials system is generally BInGaN. However, if the total of x, y and z equals one, then the materials system becomes InGaAlN. In each instance the relationship between the specific materials may vary as discussed above to avoid phase separation and follow the structural design concepts of the present invention, for example to provide an ultraviolet, blue, red or infrared laser diode or detector, or other semiconductor structure. It will also be appreciated that, if none of x, y or z is zero and they do not sum to one, a pentenary material system will result.

The foregoing results may be achieved with conventional processing temperatures and times, typically in the range of 500° C. to 1000° C. See "Growth of high optical and electrical quality GaN layers using low-pressure metalorganic chemical vapor deposition," *Appl. Phys. Lett.* 58 (5), 4 Feb. 1991, p. 526 et seq.

The present invention may be better appreciated by the following Detailed Description of the Invention, taken together with the attached Figures.

FIGURES

DETAILED DESCRIPTION OF THE INVENTION

The present invention is directed to methods for constructing and semiconductor structures constructed from a family of materials systems which may be generally described by the formula $B_{1-x-y-z}In_xGa_yAl_zN$, where each of x, y and z can be zero or non-zero for particular materials systems, or where the sum of x, y and z equals one. In a first embodiment discussed herein, which describes an InGaAlN materials system more particularly described as $In_{0.05}Ga_{0.75}Al_{0.2}N$, it can be seen that x+y+z=1, thus eliminating the Boron component. In a second embodiment discussed herein, an $In_{0.01}Ga_{0.96}Al_{0.03}N$ material is used; it can again be seen that x+y+z=1. A third embodiment uses cladding layers of $In_{0.15}Ga_{0.70}Al_{0.15}N$ material together with $In_{0.15}Ga_{0.84}Al_{0.01}N$ material and $In_{0.16}Ga_{0.80}Al_{0.04}N$ material for the quantum well barrier layers. Again, both materials can be seen to comply with the equation x+y+z=1.

A fifth embodiment described hereinafter uses the material system $B_{0.01}Al_{0.95}Ga_{0.04}N$ with AlN cladding material, while a sixth embodiment uses $B_{0.01}Al_{0.95}Ga_{0.04}N$ material for the cladding layers together with multiple quantum well layers of $B_{0.04}Al_{0.63}Ga_{0.33}N$ material and $B_{0.03}Al_{0.70}Ga_{0.27}N$. Each of these can be seen to have x=0 in the generalized formulation.

Similarly, a seventh embodiment employs cladding layers of a $B_{0.03}Ga_{0.96}In_{0.01}N$ material together with quantum well layers of a $B_{0.01}Ga_{0.86}In_{0.13}N$ material and a $B_{0.01}Ga_{0.90}In_{0.09}N$ material. An eighth embodiment employs a $B_{0.03}Ga_{0.96}In_{0.01}N$ material for the cladding layers together with quantum well layers of $B_{0.01}Ga_{0.86}In_{0.13}N$ material together with $B_{0.01}Ga_{0.90}In_{0.09}N$. Finally, a ninth embodiment employs $B_{0.01}In_{0.01}Al_{0.98}N$ material for the cladding layers together with quantum well layers of $B_{0.01}In_{0.08}Al_{0.91}N$ material together with $B_{0.02}In_{0.07}Al_{0.91}N$ material. In the seventh and eighth embodiments, it can be seen that the generalized formulation of $B_{1-x-y-z}In_xGa_yAl_zN$ applies, where z=0, while for the ninth and tenth embodiments y=0. It will also be appreciated that pentenary materials systems exist which follow the general formulation of the present invention and for which x, y and z are each non-zero but do not sum to one.

Figure 1:
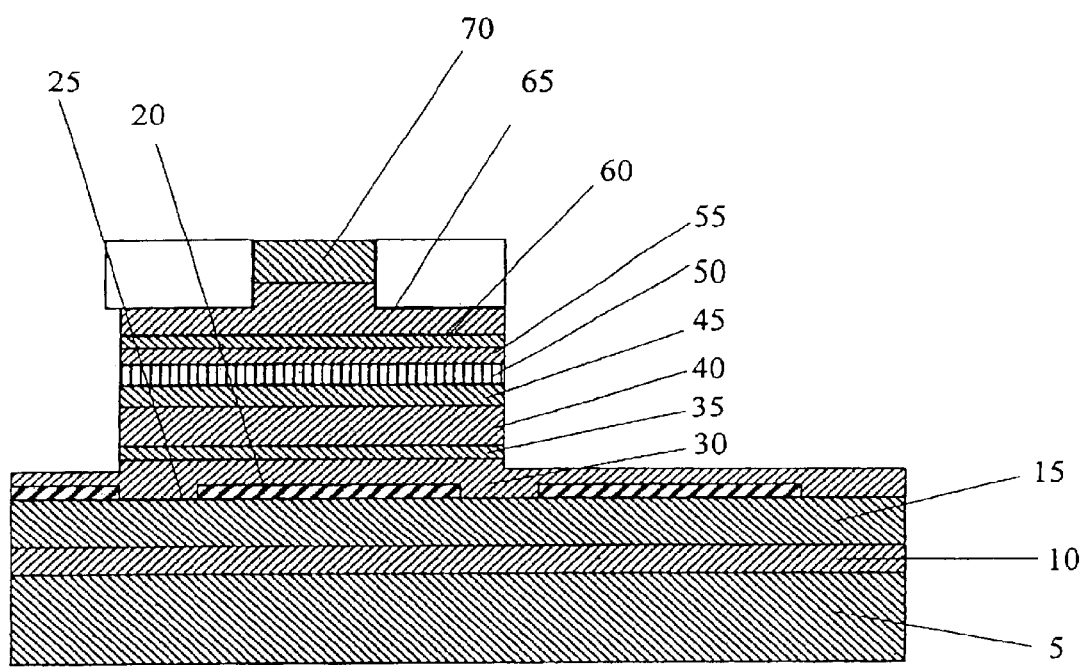
FIG. 1 shows a prior art laser diode structure using a conventional ternary materials system.
Figure 2:
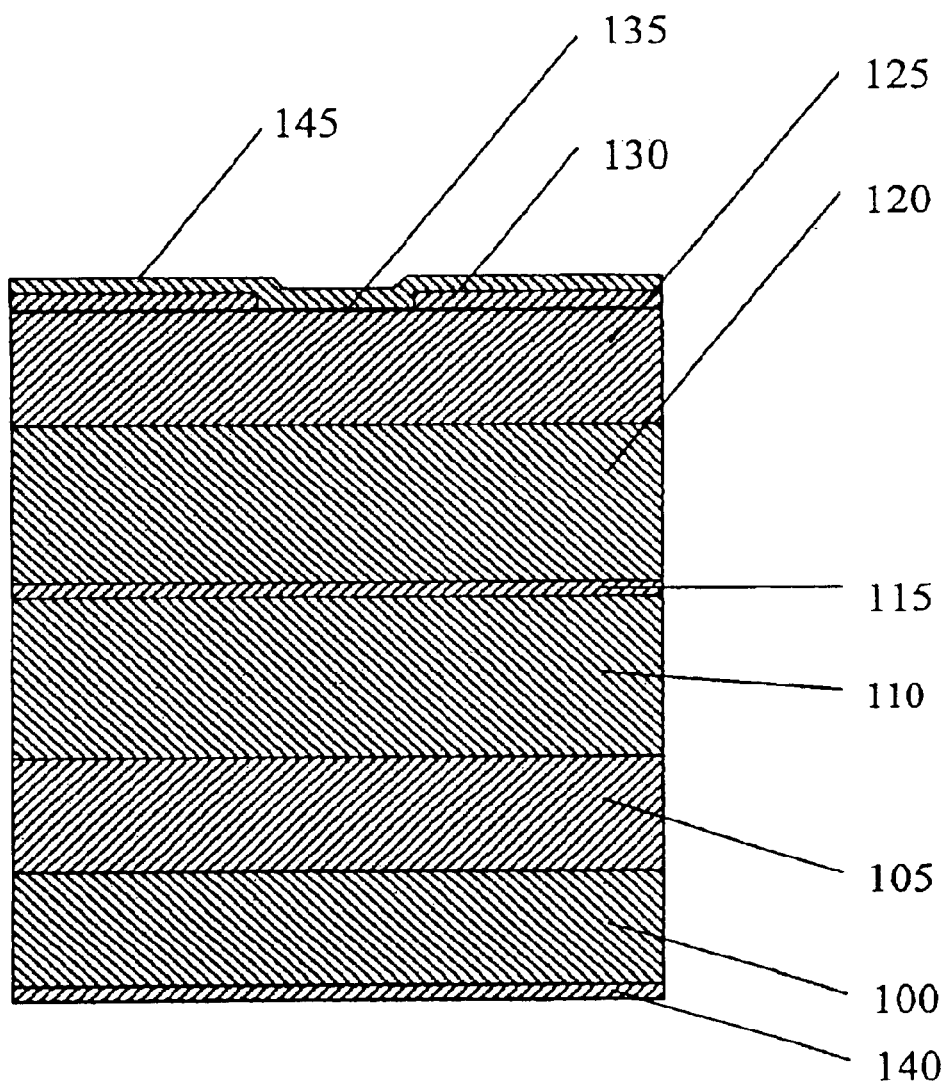
FIG. 2 shows in cross-sectional view a semiconductor structure according to a first embodiment of the invention.

Referring first to FIG. 2, shown therein in cross-sectional view is a semiconductor structure according to a first embodiment of the invention. For purposes of illustration, the semiconductor structure shown in many of the Figures will be a laser diode, although the present invention has application to a number of device types. With particular reference to FIG. 1, an n-type GaN substrate 100 is provided and an n-type GaN first cladding layer 105 (typically 0.5 μm thick) is formed thereon. Thereafter, a second cladding layer 110, typically of an n-type $In_{0.05}Ga_{0.75}Al_{0.2}N$ material which may be on the order of 1.5 μm thick, is formed thereon, followed by a multiple quantum well active layer 115 which is an exemplary arrangement may comprise three quantum well layers of $In_{0.01}Ga_{0.96}Al_{0.03}N$ material on the order of 35 A thick together with four barrier layers on $In_{0.02}Ga_{0.85}Al_{0.13}N$ material on the order of 35 A thick, arranged as three pairs. Next, a third cladding layer 120 of a p-type $In_{0.05}Ga_{0.75}Al_{0.2}N$ (typically on the order of 1.5 mm thick) is formed, followed by a p-type GaN fifth cladding layer 125 (on the order of 0.5 μm thick). A $SiO_2$ layer 130 having one stripe like window region 135 (3.0 μm width) is formed on the p-type GaN fourth cladding layer 125. A first electrode 140 is formed on the n-type GaN substrate 100, while a second electrode 145 is formed on the SiO$_2$ layer 130 and the window region 135.

In order to emit ultra violet light with a wavelength range of 350 nm from the active layer 115, the InN mole fraction, the GaN mole fraction, and the AlN mole fraction of the well layer are set to be 0.01, 0.96, and 0.03, respectively. To avoid defects due to phase separation, the lattice constants of the various constituent layers are matched to each other by setting the GaN mole fraction, x, and the AlN, y, in each of the layers to meet the condition x+1.2y nearly equals a constant value. In an exemplary embodiment, the constant value is set to nearly one, for example 1±0.1, although most embodiments will be in the range 1±0.05.

By proper selection of materials, the band gap energy of the n-type second cladding layer 110 and the p-type third cladding layer 120 are larger than that of the three pairs of multiple quantum well active layers 115. This confines the injected carriers from the n-type second cladding layer 110 and p-type third cladding layer 120 within the active layer 115, where the carriers recombine to lead to the emission of ultraviolet light. In addition, the refractive index of the n-type second cladding layer 110 and the p-type third cladding layer 120 are smaller than that of the multiple quantum well active layer 115, which confines the optical field in the transverse direction.

Because the injected current from the electrode 145 is confined to flow through the window region 135, the region in the active layer 115 under the widow region 135 is activated strongly. This causes the local modal gain in the active layer under the window region 6a to be higher than the local modal gain in the active layer under the SiO$_2$ layer. Therefore, a gain guided waveguide, leading to a lasing oscillation, is formed in the structure of the first embodiment.

Figure 3:
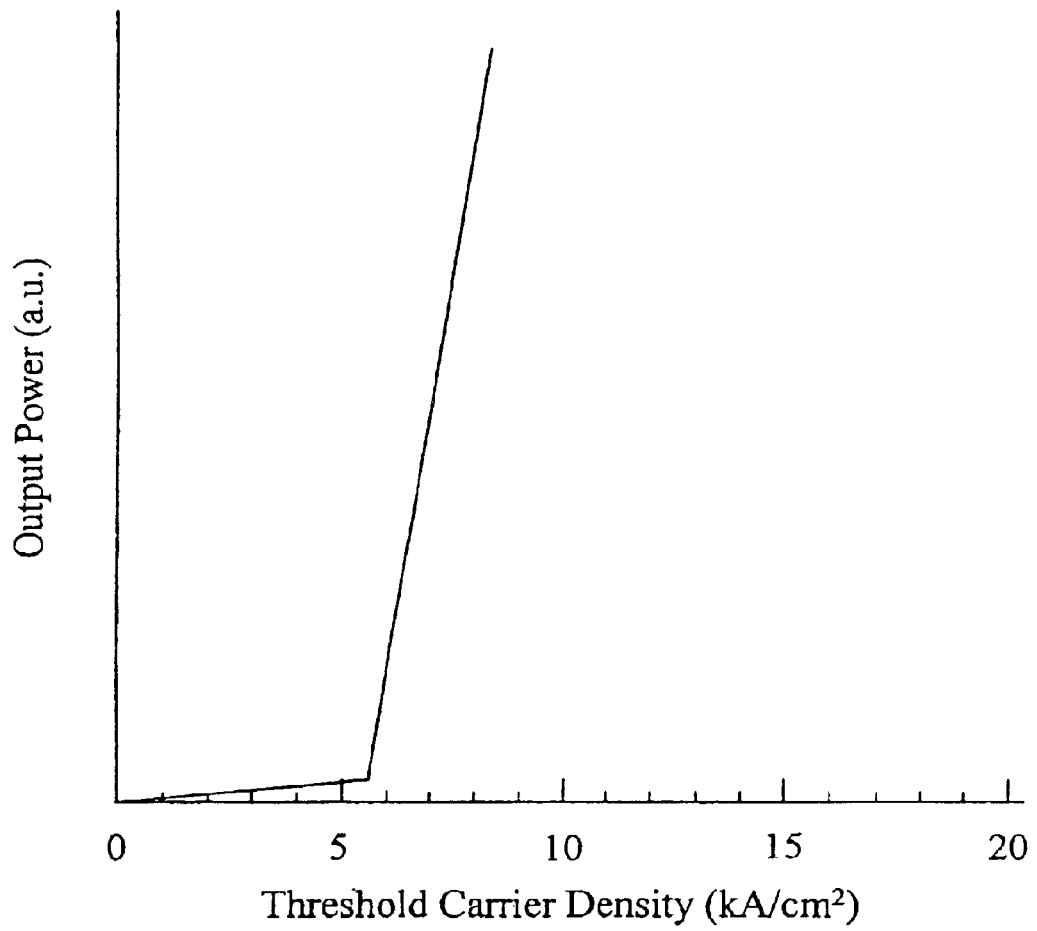
FIG. 3 shows a graph of the light-current characteristics of a laser diode according to the structure of FIG. 1.

FIG. 3 shows a plot of the emitted light versus drive current for a laser diode constructed in accordance with the first embodiment. The laser diode is driven with a pulsed current with a duty cycle of 1%. The threshold current density is found to be 5.5 kA/cm$^2$.

Figure 4A:
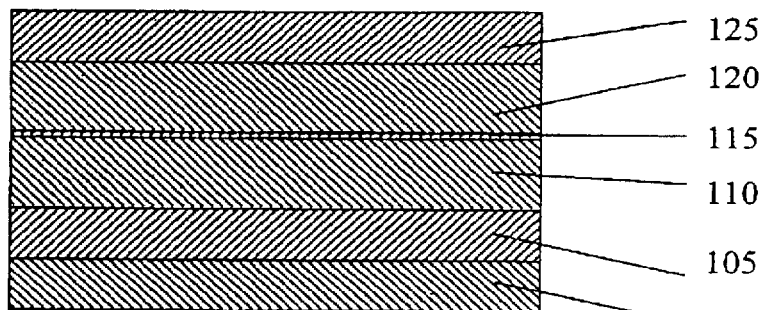
FIG. 4 shows an exemplary series of the fabrication steps for a semiconductor structure in accordance with a first embodiment of the invention.

FIGS. 4A–4D show, in sequence, a summary of the fabrication steps necessary to construct an exemplary laser diode according to the first embodiment. Since the structure which results from FIGS. 4A–4D will resemble that shown in FIG. 2, like reference numerals will be used for elements whenever possible. With reference first to FIG. 4A, an n-type GaN substrate 100 is provided, on which is grown an n-type GaN first cladding layer 105. The first cladding layer 105 is typically on the order of 0.5 μm thick. Thereafter, an n-type In$_{0.05}$Ga$_{0.75}$Al$_{0.2}$N second cladding layer 110 is formed, typically on the order of 1.5 μm thick.

Next, a multiple quantum well active layer 115 is formed by creating three quantum wells comprised of three layers of In$_{0.01}$Ga$_{0.96}$Al$_{0.03}$N material each on the order of 35 A thick, together with four barrier layers of In$_{0.02}$Ga$_{0.85}$Al$_{0.13}$N material on the order of 35 A thick. A third cladding layer 120 of p-type In$_{0.05}$Ga$_{0.75}$Al$_{0.2}$N material, on the order of 1.5 μm thick, is then formed, after which is formed a fourth cladding layer 125 of a p-type GaN on the order of 0.5 μm thick. Each of the layers is typically formed by either the Metal Organic Chemical Vapor Deposition (MOCVD) method or the Molecular Beam Epitaxy (MBE) method.

Figure 4B:
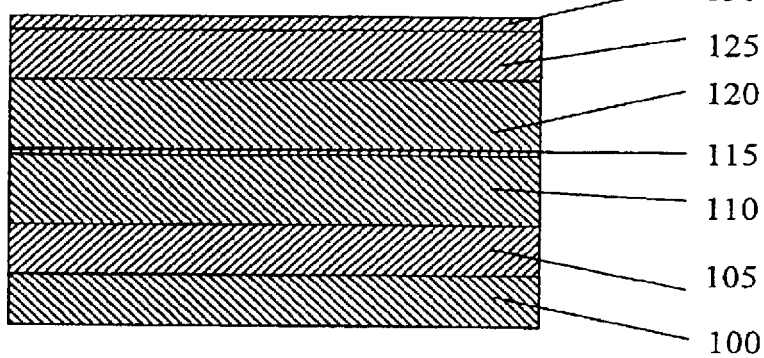
Figure 4C:
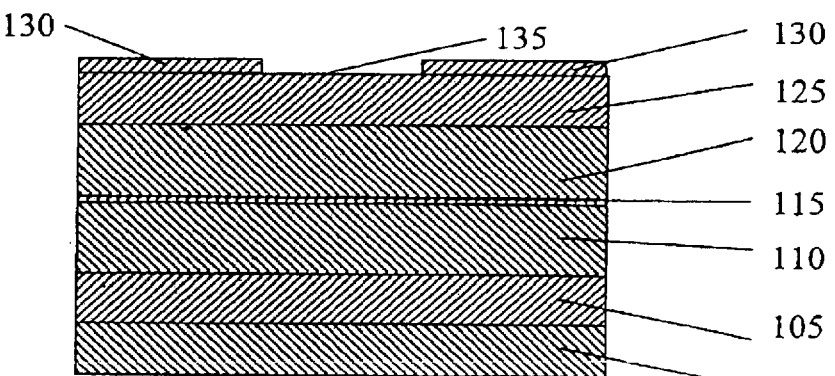
Figure 4D:
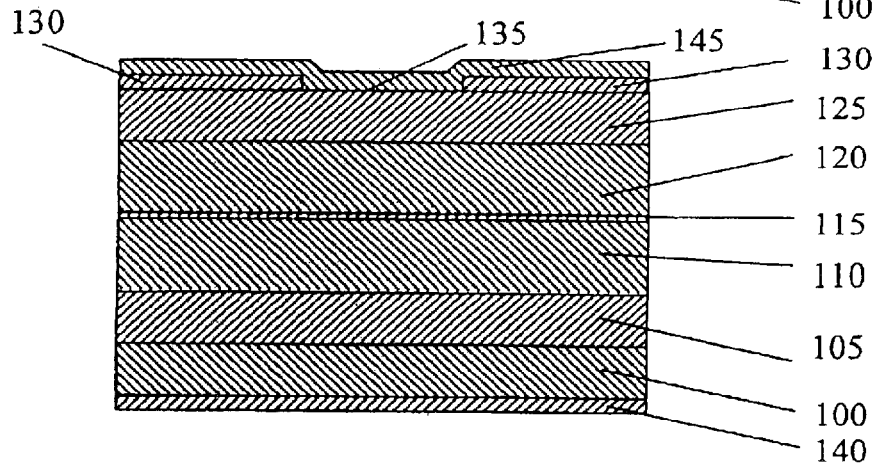

Then, as shown in FIG. 4B, a silicon dioxide (SiO$_2$) layer 130 is formed on the p-type GaN fourth cladding layer 125, for example by the Chemcial Vapor Deposition (CVD) method. Using photolithography and etching or any other suitable method, a window region 135 is formed as shown in FIG. 4C. The window region 135 may be stripe-like in at least some embodiments. Finally, a shown in FIG. 4D, a first electrode 140 and a second electrode 145 are formed on the n-type GaN substrate 100 and on the SiO$_2$ layer 130, respectively, by evaporation or any other suitable process.

Figure 5:
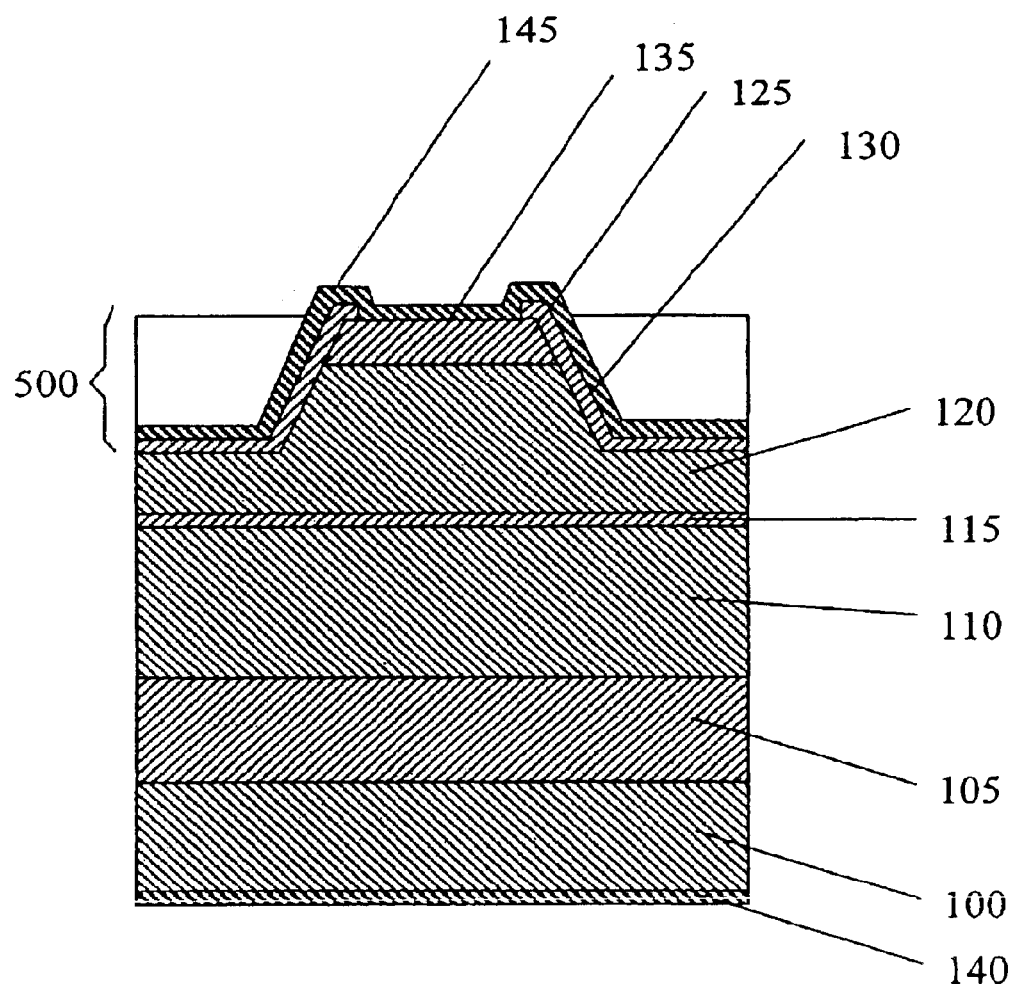
FIG. 5 shows in cross-sectional view a semiconductor structure according to a second embodiment.

Referring next to FIG. 5, a second embodiment of a semiconductor structure in accordance with the present invention may be better appreciated. As with the first embodiment, an exemplary application of the second embodiment is the creation of a laser diode. The structure of the second embodiment permits a waveguide mechanism to be built into the structure with a real refractive index guide. This provides a low threshold current laser diode which can operate with a fundamental transverse mode.

Still with reference to FIG. 5, like elements with respect to the first embodiment will be indicated with like reference numerals. On an n-type GaN substrate 100, a first cladding layer 105 is formed of an n-type GaN on the order of 0.5 μm thick. Successively, an n-type second cladding layer 110 is formed of In$_{0.05}$Ga$_{0.75}$Al$_{0.2}$N material on the order of 1.5 μm thick. Thereafter, a multiple quantum well active layer 115 is formed comprising three well layers of In$_{0.01}$Ga$_{0.96}$Al$_{0.03}$N material on the order of 35 A thick together with four barrier layers of In$_{0.02}$Ga$_{0.85}$Al$_{0.13}$N material, also on the order of 35 A thick. Next, a third, p-type cladding layer 120 formed on In$_{0.05}$Ga$_{0.75}$Al$_{0.2}$N material on the order of 1.5 μm thick is formed. Thereafter, a p-type GaN fourth cladding layer 125 on the order of 0.5 μm thick is formed over the ridge structure 500 of the third cladding layer 120. The third and fourth cladding layers are then partially removed to create a ridge structure 500. A silicon dioxide (SiO$_2$) layer 130 is then formed over over the fourth cladding layer 125 as well as the remaining exposed portion of the third cladding layer 120. A window region 135, which may be stripe-like on the order of 2.0 μm width, is formed through the SiO$_2$ layer above the fourth and third cladding layers 125 and 120, respectively. As with the first embodiment, a first electrode 140 is formed on the n-type GaN substrate 100 and a second electrode 145 is formed on the SiO$_2$ layer 130 and the window region 135.

As with the first embodiment, in order to emit ultra violet light with a wavelength in the range of 350 nm from the active layer 14, the mole fractions of InN, GaN, and AlN in the well layer are set to be 0.01, 0.96, and 0.03, respectively. Likewise, in order to match the lattice constants of each of the constituent layers to avoid defects due to phase separation, the GaN mole fraction, x, and the AlN, y, of all the layers satisfy the condition of x+1.2y nearly equals a constant value. As in the first embodiment, x+1.2y set to be nearly equals 1 so that the equivalent lattice constants of each layers become nearly equal to the lattice constant of GaN. Likewise, the band gap energy of the cladding layers is maintained larger than the band gap energy for the active layer, allowing the emission of ultraviolet light. Similarly the refractive index of the materials is as discussed in connection with the first embodiment, permitting the optical field to be confined in the transverse direction.

Similar to the operation of the first embodiment, the region of the active layer 115 under the window region 135 is activated strongly because of the constraints on the injected current by the SiO2 layer. The result, again, is that the local modal gain in the active layer under the window region 135 is higher than the local modal gain in the active layer under the SiO$_2$ layer 130. This, combined with the relatively higher effective refractive index in the transverse direction inside the ridge stripe region compared to that outside the ridge stripe region, provides an effective refractive index step (Δn). This results in a structure which has, built in, a waveguide formed by a real refractive index guide. Therefore, the design of the second embodiment provides a low threshold current laser diode which can operate with a fundamental transverse mode.

Figure 6:
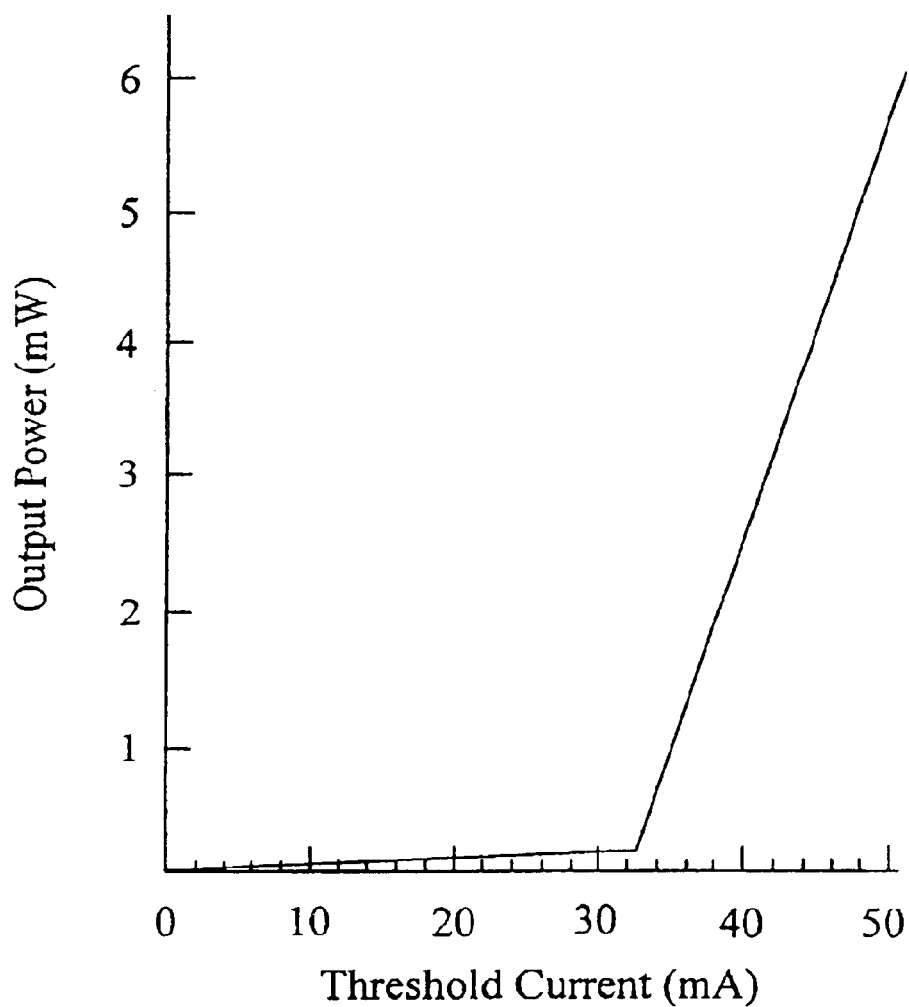
FIG. 6 shows a graph of the light-current characteristics of a laser diode according to the structure of FIG. 4.

FIG. 6 shows in graph form the emitted light versus drive current characteristics of a laser diode in accordance with the second embodiment. The laser diode is driven with a cw current. The threshold current is found to be 32.5 mA.

Referring next to FIGS. 7A–7E, a summary of the key fabrication steps is shown for an exemplary device of a semiconductor laser diode in accordance with the second embodiment.

Figure 7A:
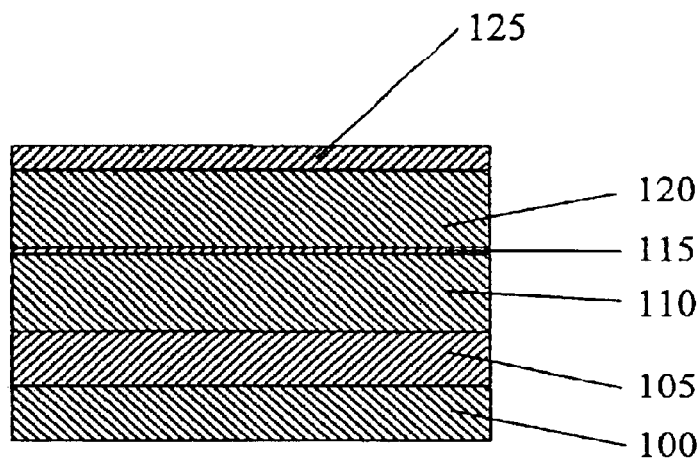
FIG. 7 shows an exemplary series of the fabrication steps for a semiconductor structure in accordance with the first embodiment of the invention.
Figure 7B:
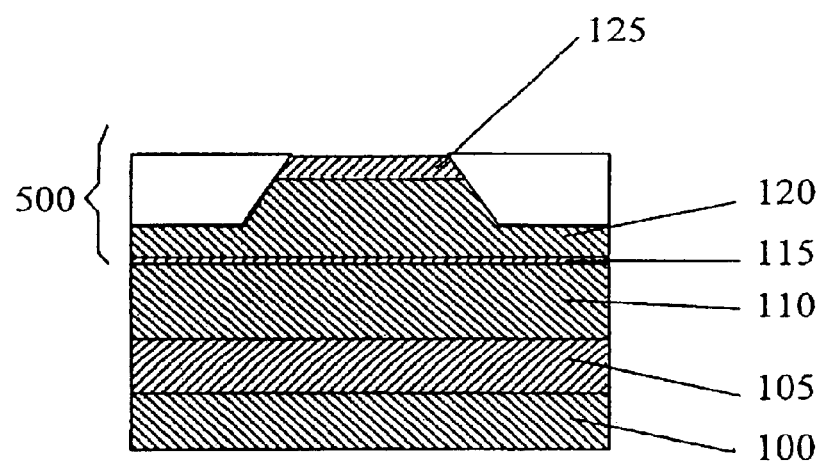

Referring first to FIGS. 7A and 7B, the formation of the first and second cladding layers 105 and 110 on an n-type GaN substrate 100, together with the three-pair multiple quantum well active layer 115 are the same as for the first embodiment. Thereafter, the third and fourth cladding layers 120 and 125 are formed and then partially removed—typically by etching—to create a ridge structure 500. As before, in an exemplary embodiment the various layers are formed successively by either the MOCVD or the MBE method.

Figure 7C:
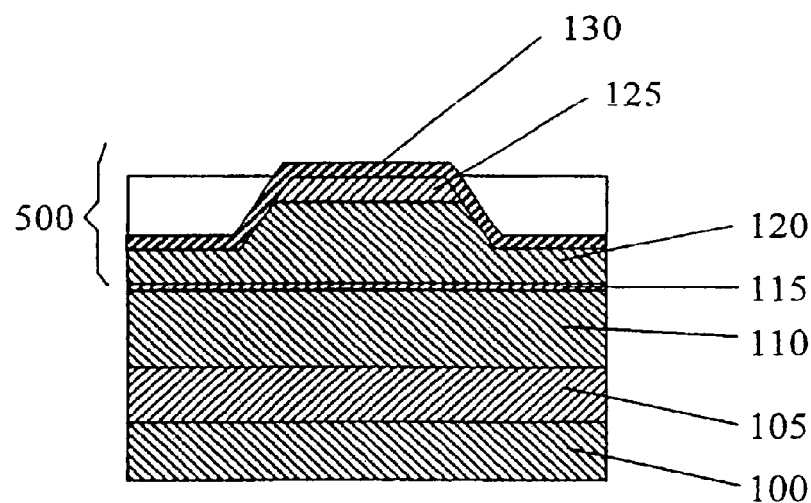
Figure 7D:
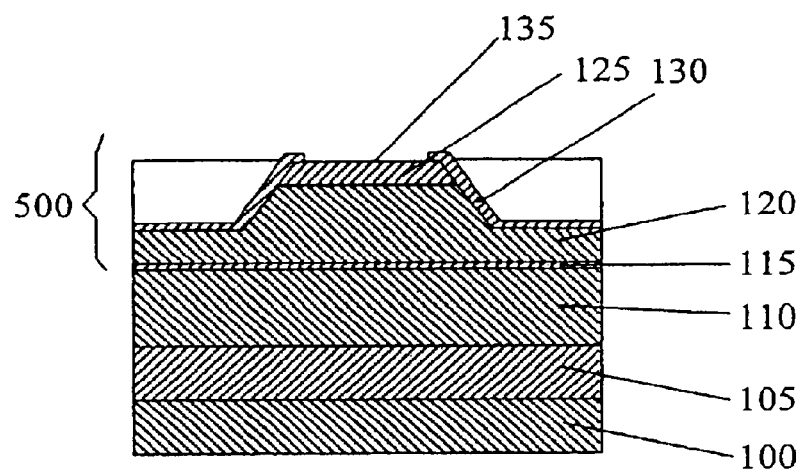
Figure 7E:
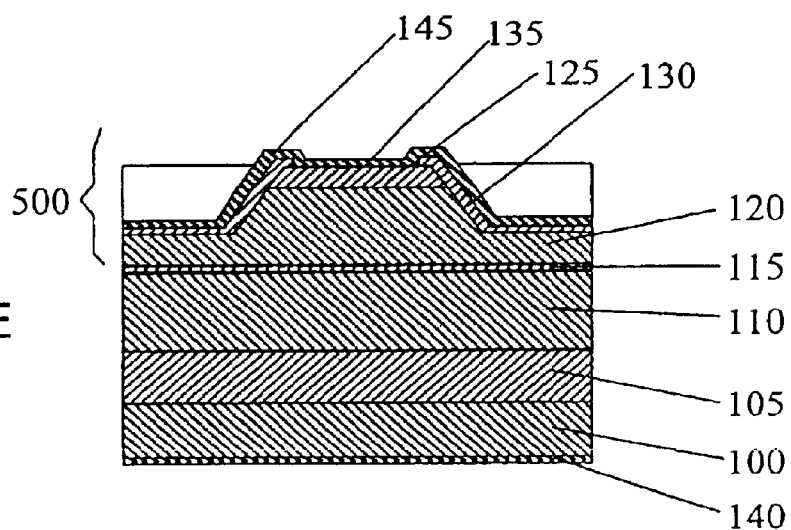

Then, as shown in FIGS. 7C–7E, a silicon dioxide layer 130 is formed over the fifth and third cladding layers 125 and 120, respectively, typically by the CVD method, after which a window region 135 is formed as with the first embodiment. Electrodes 140 and 145 are then evaporated or otherwise bonded to the structure.

Figure 8:
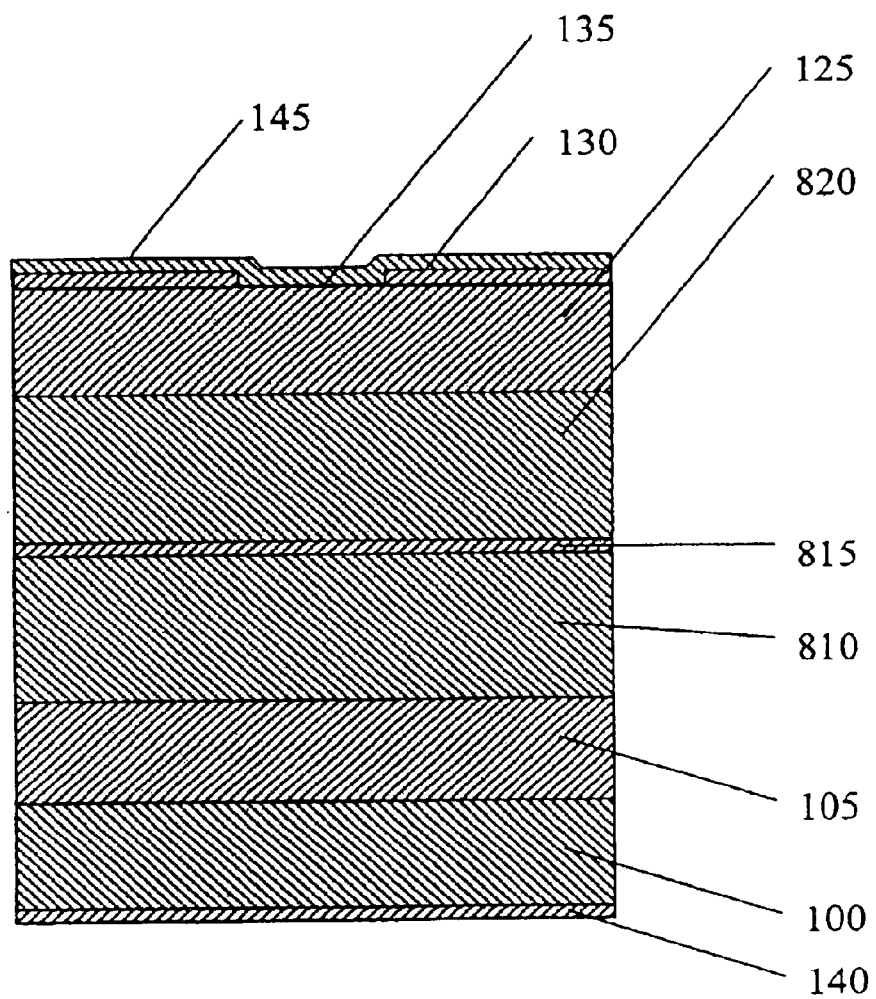
FIG. 8 is a cross-sectional illustration of a semiconductor laser diode of the third embodiment.

Referring next to FIG. 8, a third embodiment of the present invention may be better appreciated. The third embodiment provides slightly different mole fractions to permit the emission of blue light, but is otherwise similar to the first embodiment. Thus, an n-type GaN substrate 100 continues to be used, together with an n-type GaN first cladding layer 105. However, the second cladding layer 810 is typically of n-type $In_{0.15}Ga_{0.70}Al_{0.15}N$ material on the order of 1.5 μm thick, while the three-pair quantum well active layer 815 typically includes three barrier layers of $In_{0.15}Ga_{0.84}Al_{0.01}N$ material together with four barrier layers of $In_{0.15}Ga_{0.70}Al_{0.15}N$ material, while the fourth cladding layer 125 is, like the first embodiment, a p-type GaN material. The thicknesses of each layer are substantially the same as for the first embodiment. A $SiO_2$ layer 130, window region 135, and first and second electrodes 140 and 145 complete the structure.

In order to emit blue light in a wavelength range of 400 nm from the active layer 24, the mole fractions of InN, GaN, and AlN within the well layer 815 are set to be 0.15, 0.84, and 0.01, respectively. In order to match the lattice constants of the constituent layers to avoid generation of phase separation-induced defects, the GaN mole fraction, x, and the AlN mole fraction, y, of each of the layers is set to satisfy the condition x+1.2y nearly equals a constant value on the order of 0.85±0.1; as before, most embodiments will be in the range 0.85±0.05.

Although the third embodiment emits blue light whereas the first embodiment emits ultraviolet light, the band gap energies of cladding layers continue to be set higher than the band gap energy of the three pairs of the multiple quantum well active layer 815. As before, this permits carrier confinement and recombination in the active layer 815. Also as with the first embodiment, the refractive index of the second and third cladding layers is, by design, smaller than that of the active layer, causing the optical field to be confined in the transverse direction. Likewise, the strong current injection under the window region 135 yields comparatively higher local modal gain in the active layer relative to the portion of the active layer under the SiO2 layer 130, again resulting in a guided waveguide which leads to a lasing oscillation.

Figure 9:
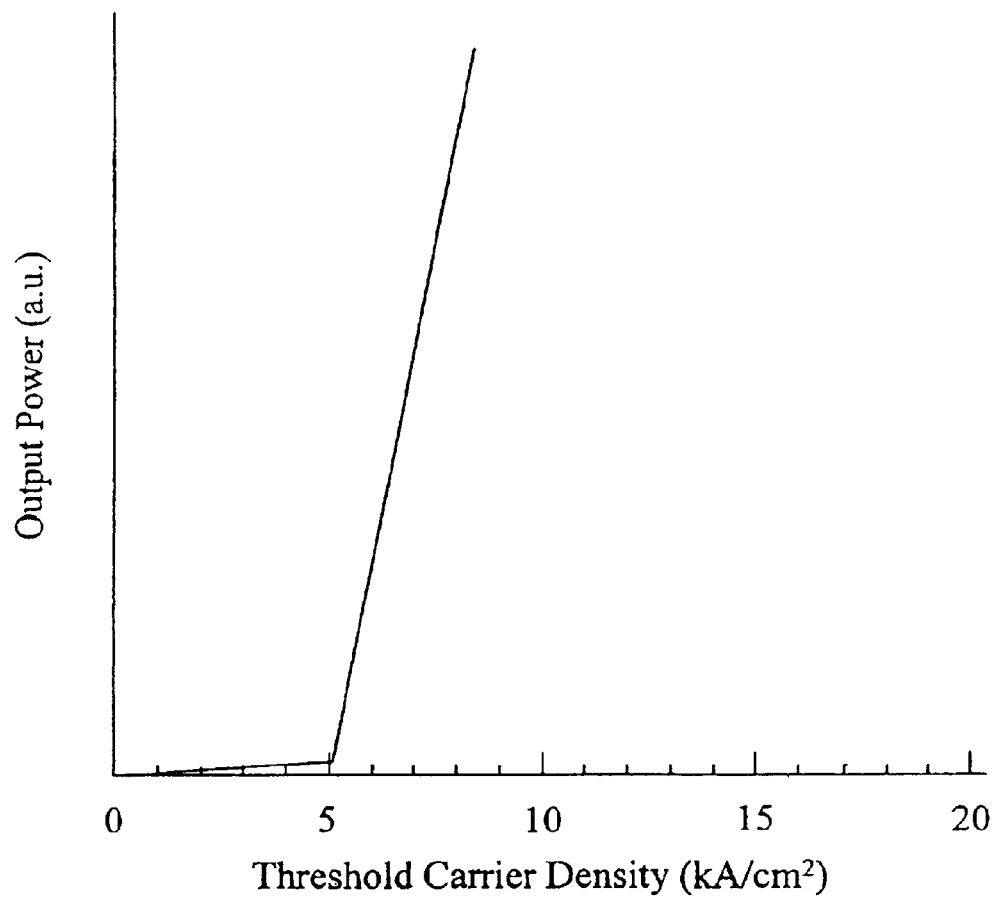
FIG. 9 shows the light-current characteristics of the laser diode of the third embodiment.
Figure 10A:
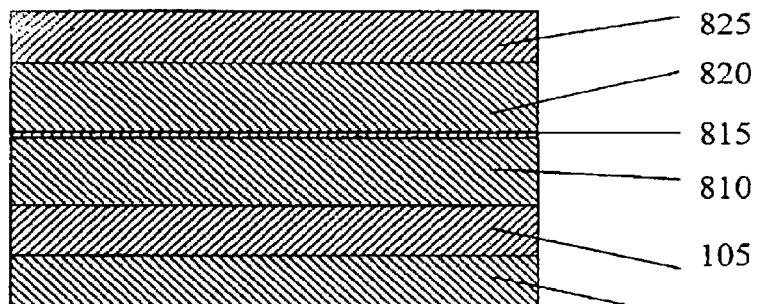
FIG. 10 shows a series of the fabrication steps of a semiconductor laser diode in one exemplary example of the third embodiment.
Figure 10B:
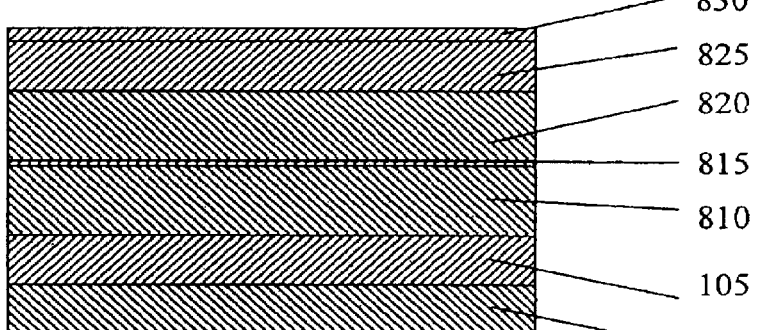
Figure 10C:
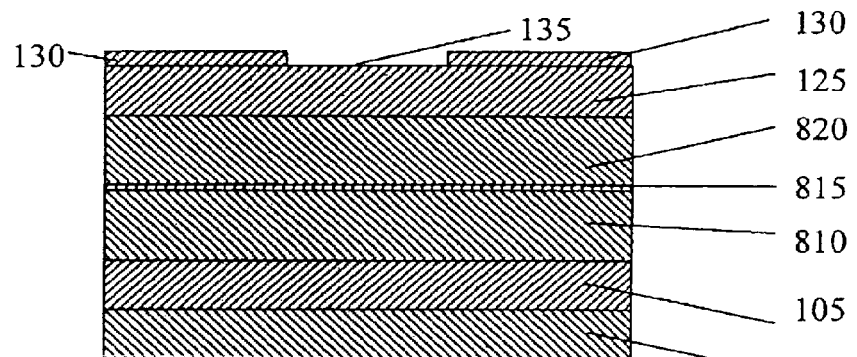
Figure 10D:
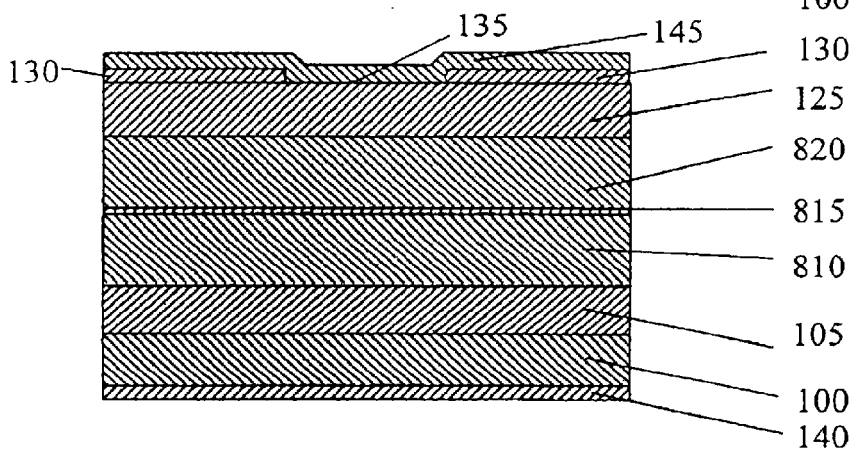

FIG. 9 shows a plot of the emitted light versus drive current characteristics of the laser diode in accordance with the third embodiment. The laser diode is driven with a pulsed current with a duty cycle of 1%. The threshold current density is found to be 5.0 $kA/cm^2$.

FIGS. 10A–10D show a series of the fabrication steps of a semiconductor laser diode in one example of the third embodiment. It will be appreciated that the fabrication steps are the same as those described in connection with FIGS. 4A–4D, and therefore are not further described.

Figure 11:
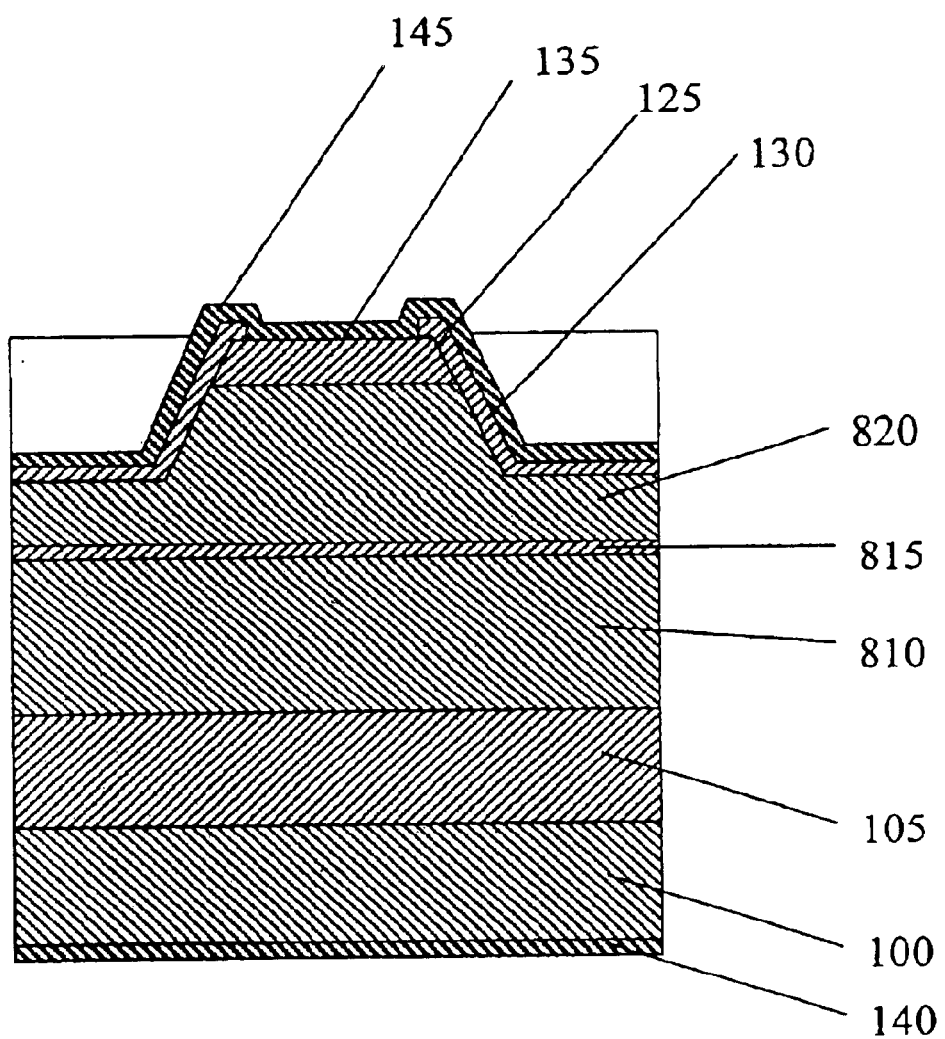
FIG. 11 is a cross-sectional illustration of a semiconductor laser diode of the fourth embodiment.

Referring next to FIG. 11, a fourth embodiment of the present invention may be better appreciated. The fourth embodiment, like the third embodiment, is designed to emit blue light and therefore has the same mole fractions as the third embodiment. However, like the second embodiment, the fourth embodiment is configured to provide a ridge structure to serve as a waveguide. Because the mole fractions are similar to those of FIG. 8, similar elements will be described with the same reference numerals used in FIG. 8.

Continuing to refer to FIG. 11, the structure of the fourth embodiment can be seen to have a GaN substrate 100 on which is a formed a first cladding layer 105 followed by a second cladding layer 810. A three-pair multiple quantum well active layer 815 is formed thereabove, followed by a third cladding layer 820. A fourth cladding layer 125, silicon dioxide layer 130, windows 135 and electrodes 140 and 145 are all formed as before. The materials, including the mole fractions of InN, GaN, and AlN, remain as shown for FIG. 8, or 0.15, 0.84, and 0.01, respectively. Likewise the GaN mole fraction, x, and the AlN mole fraction, y, of the layers is set to satisfy the condition x+1.2y is equal to or nearly equal to a constant value on the order of 0.85±0.1, as with the prior embodiments. The band gap energy, refractive index and modal gain for current injection are all substantially as discussed in connection with the third embodiment and are not further discussed.

Figure 12:
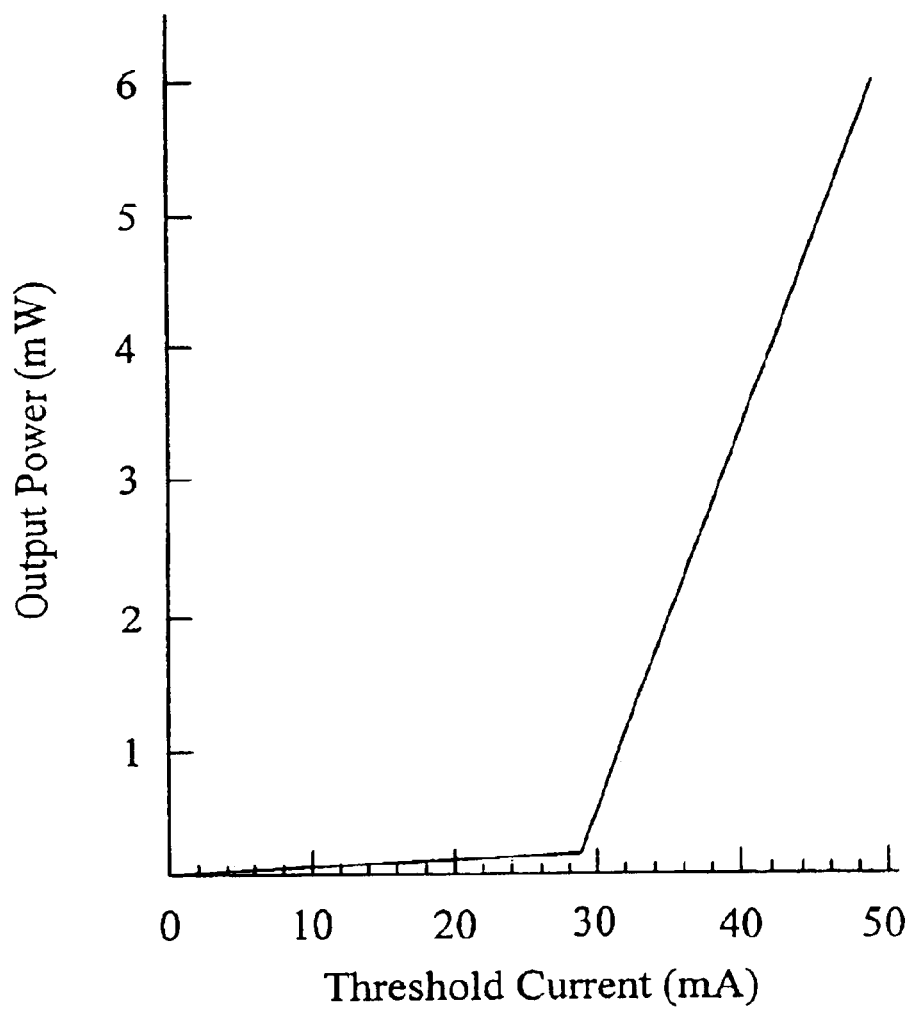
FIG. 12 shows the light-current characteristics of the laser diode of the fourth embodiment.
Figure 13A:
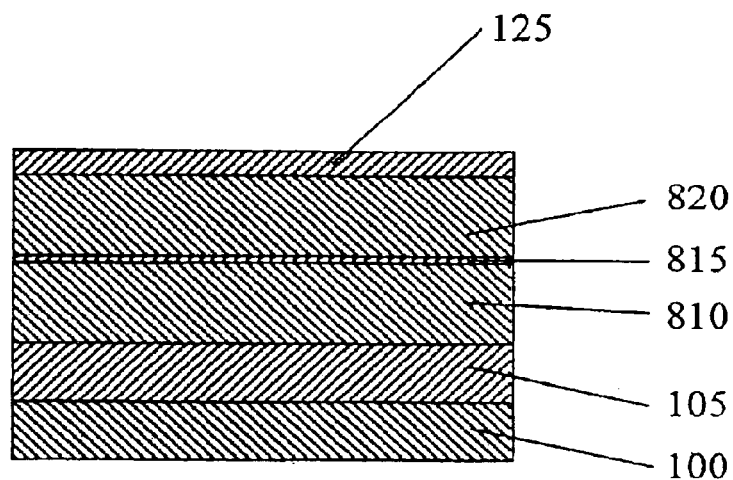
FIG. 13 shows a series of the fabrication steps of a semiconductor laser diode in one exemplary form of the fourth embodiment.
Figure 13B:
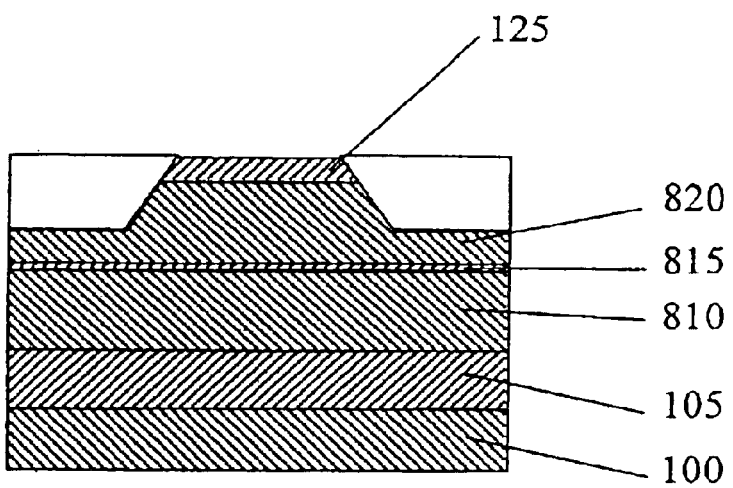
Figure 13C:
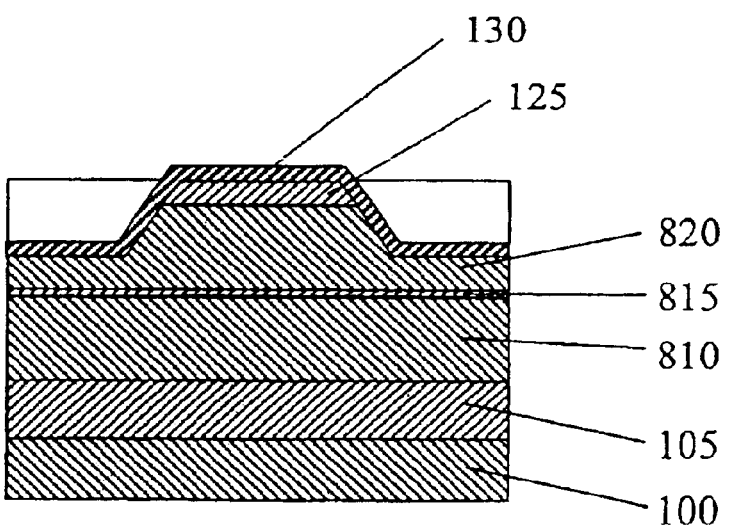
Figure 13D:
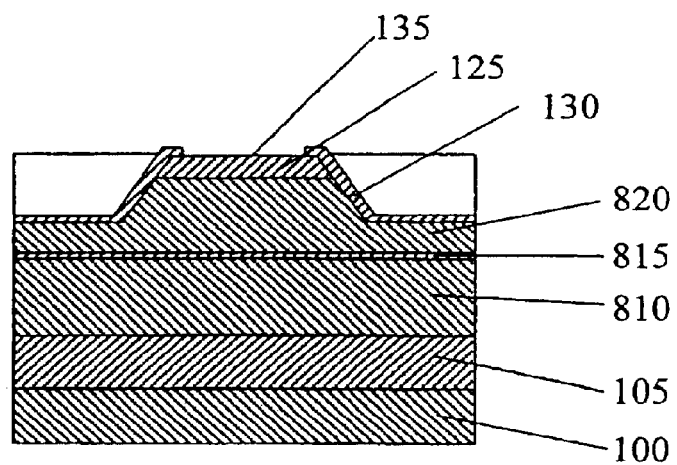
Figure 13E:
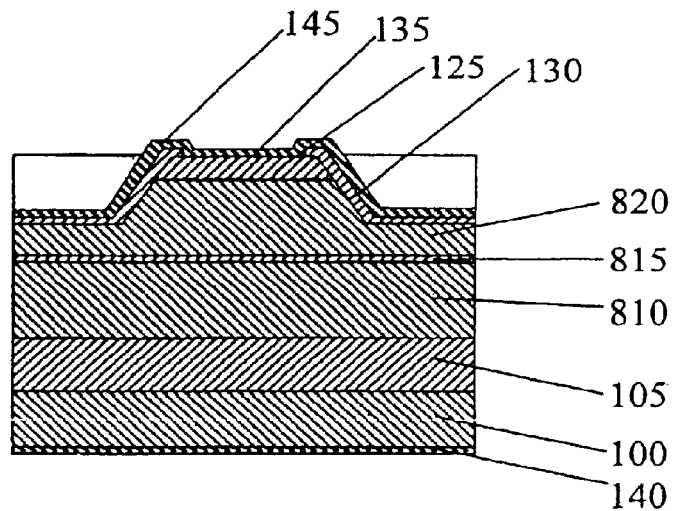

FIG. 12 plots drive current versus emitted light of a laser diode constructed in accordance with the fourth embodiment. The laser diode is driven with a cw current. The threshold current is found to be 28.5 mA.

FIG. 13 shows a summary of the fabrication steps of a semiconductor laser diode in accordance with the fourth embodiment. The steps are essentially identical to those discussed in connection with FIGS. 7A–7E and are not further discussed.

Figure 14:
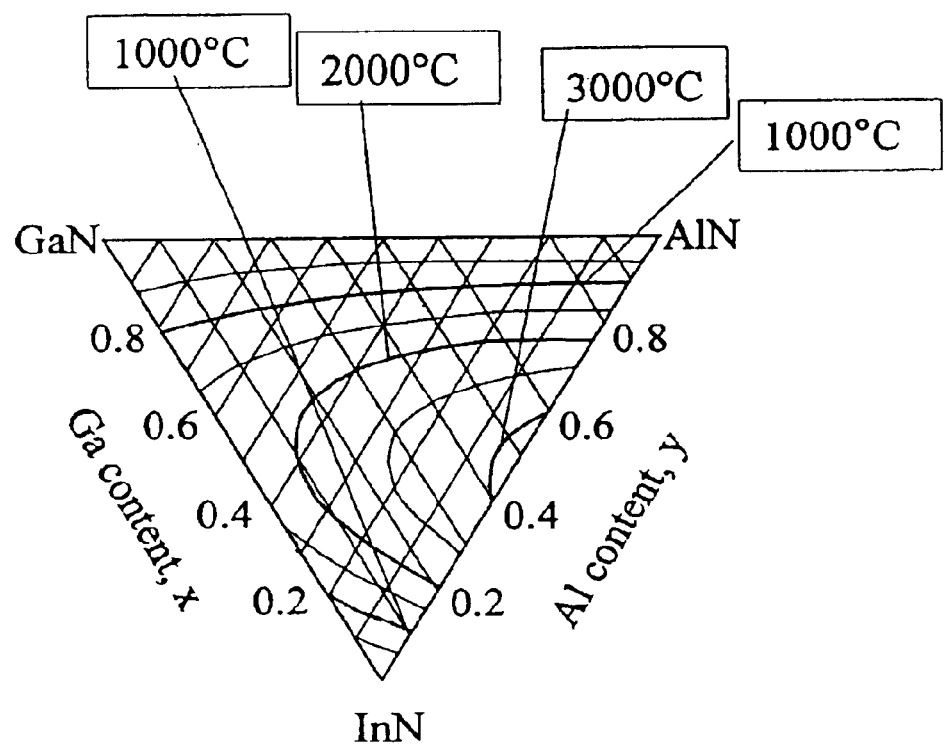
FIG. 14 shows in plot form the boundary between the phase separation region and the region without phase separation at various growth temperatures.

Referring next to FIG. 14, the selection of the GaN mole fraction, x, and the AlN mole fraction, y, and the relationship therebetween for the constituent InGaAlN layers, may be better understood. In particular, the relative mole fractions are required to satisfy, approximately, the relationship 0<x+y<1, 1<=x/0.80+y/0.89.

FIG. 14 shows the boundary of phase separation region plotted against various growth temperatures. The lines in FIG. 14 show the boundary between the compositionally unstable (phase separation) region and stable region with respect to various temperatures. The region surrounded with the InN-AlN line and the boundary line shows the phase separation content region, it has been discovered that the ternary alloys InAlN and InGaN have a large phase separation region due to the large lattice mismatch between InN and AlN, and between InN and GaN. On the other hand, it is found that the ternary alloy GaAlN has no phase separation region for crystal growth at temperatures around 1000° C., due to the small lattice mismatch between AlN and GaN.

Figure 15:
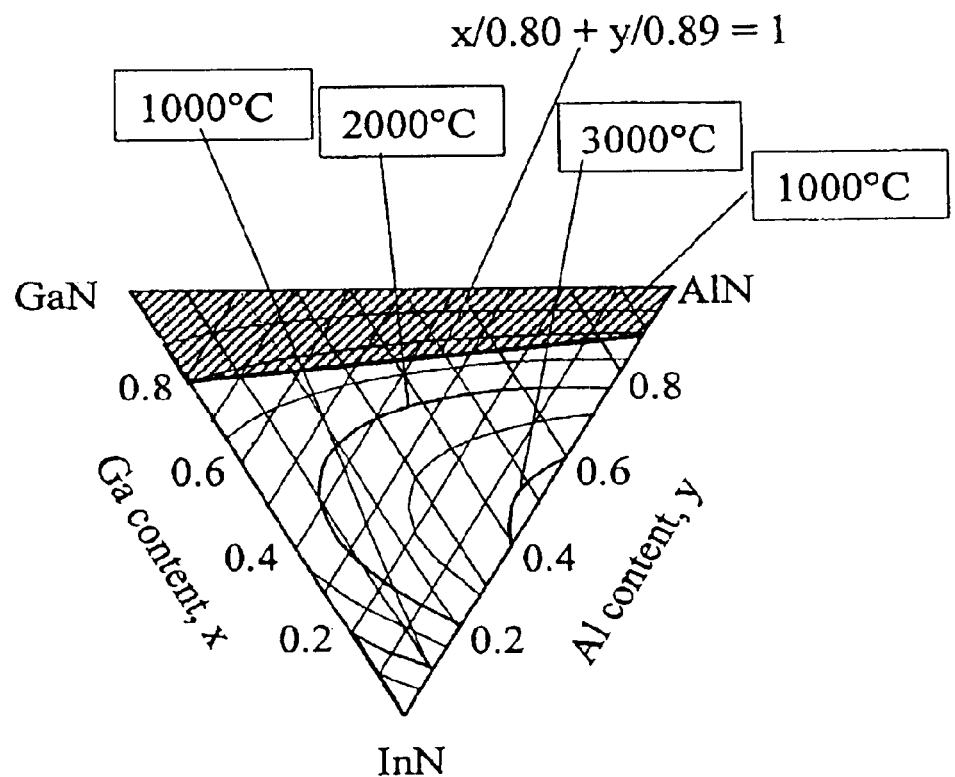
FIG. 15 shows the content choice region of Ga content and Al content in InGaAlN to avoid phase separation at a growth temperature below approximately 1000° C.

It has therefore been discovered that an InGaAlN material system can be provided in which phase separation of the In content, Ga content, and Al content of InGaAlN does not occur significantly when the crystal growth temperature is in the approximate range of around 500° C. to around 1000° C. The content choice region of Ga content and Al content in InGaAlN to avoid phase separation at a crystal growth temperature below around 1000° C. is found to be the shadow region in FIG. 15, with the line separating the two regions being approximately defined by the relationship $x/0.80+y/0.89=1$.

Therefore, for each of the four structural embodiments disclosed hereinabove, the phase separation phenomena can be avoided in an InGaAlN material system by operating at a crystal growth temperature between on the order of 500° C. and around 1000° C., when the Ga mole fraction, x, and the AlN mole fraction, y, of the all constituent layers of the laser diodes are made to satisfy approximately the relationship of $0<x+y<1$, $1<=x/0.80+y/0.89$. The result is the substantially uniform distribution of In atoms, Ga atoms, and Al atoms in each constituent layer according to the atomic mole fraction.

Figure 16:
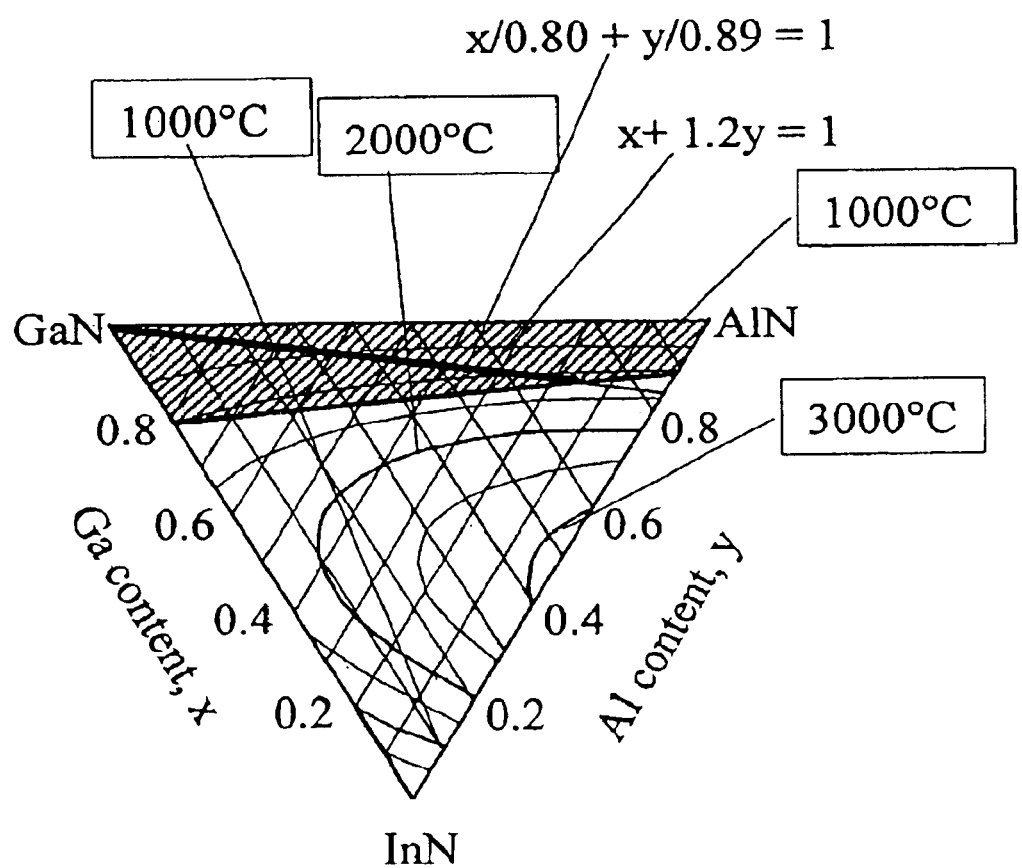
FIG. 16 shows the content choice line of Ga content and Al content in InGaAlN to avoid phase separation at a growth temperature below approximately 1000° C. which, at the same time, creates a lattice constant of InGaAlN substantially equivalent to that of GaN.

FIG. 16 shows the content choice line of Ga content, x, and Al content, y, in an InGaAlN system to avoid phase separation phenomenon at growth temperatures below around 1000° C. The line in FIG. 16 shows the exemplary line of $x+1.2y=1$. Therefore, the ensuring that the Ga content and Al content of the constituent InGaAlN layers of a laser diode formed on a GaN substrate have a relationship of $x+1.2y$ nearly equal to 1 and $0<x+y<1$, $1<=x/0.80+y/0.89$, a laser diode can be fabricated on a GaN substrate with low defect density and no or very little phase separation.

In addition, other semiconductor structures can be fabricated with the materials system discussed above. Group-III nitride materials, especially GaN and AlN, are promising for use in electronic devices which can operate under high-power and high-temperature conditions—for example, microwave power transistors. This results, in part, from their wide band gap (3.5 eV for GaN and 6.2 eV for AlN), high breakdown electronic field, and high saturation velocity. By comparison, the band gaps of AlAs, GaAs, and Si are 2.16 eV, 1.42 eV, and 1.12 eV, respectively. This has led to significant research in the use of AlGaN/GaN materials for such field effect transistors (FETs). However, as noted previously hereinabove, the different lattice constants of AlGaN and GaN cause the generation of significant defects, limiting the mobility of electrons in the resultant structure and the utility of such materials systems for FET use.

The present invention substantially overcomes these limitations, in that the InGaAlN/GaN material of the present invention has a lattice constant equal to GaN. As discussed hereinabove, a quaternary materials system of $In_{1-x-y}Ga_xAl_yN$, where the GaN mole fraction (x) and AlN mole fraction (y) satisfy the relationships $0<x+y<1$, $1<=x/0.8+y/0.89$ and $x+1.2y=1\pm0.1$ not only has a band gap greater than 3.1 eV, but also has a lattice constant substantially equal to GaN. This permits fabrication of semiconductor structures such as FETs which have substantially uniform atomic content distribution in the various layers. Therefore, by using an InGaAlN/GaN material system in accordance with the present invention, whose GaN mole fraction, x and AlN mole fraction, y satisfy the above relationships, high-power and high-temperature transistors with low defect density can be realized.

Figure 17A:
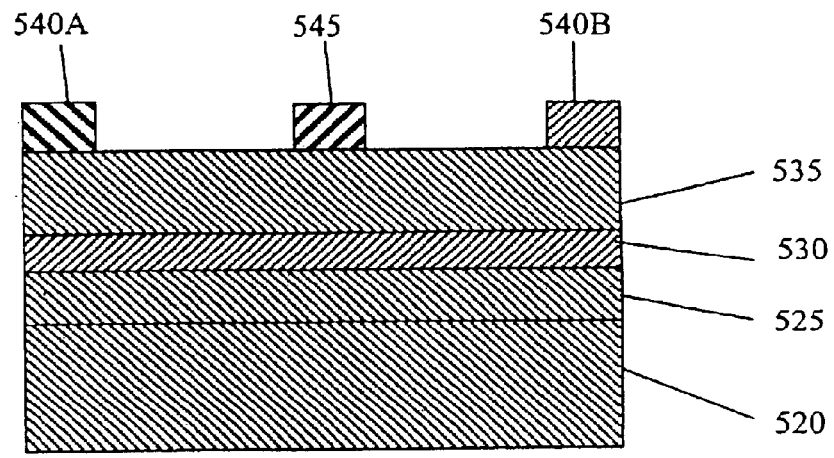
FIGS. 17A and 17B show representations of bipolar and FET transistors constructed in accordance with the materials system of the present invention.

Referring to FIG. 17A, there is shown therein an exemplary embodiment of a heterojunction field effect transistor (HFET) using InGaAlN/GaN material in accordance with the present invention. On a GaN substrate 520, a 0.5 μm i-GaN layer 525 is formed, followed by a thin, approximately 10 nm GaN conducting channel layer 530 and a 10 nm InGaAlN layer 535. Source and drain electrodes 540A-b, and gate electrode 545 are formed in a conventional manner. In the structure, the GaN mole fraction, x, and AlN mole fraction, y, of the InGaAlN layer are set to be 0.64 and 0.3, respectively. In this case, the value of x and y satisfy the relationship of $0<x+y<1$, $1<=x/0.8+y/0.89$, and $x+1.2y=1\pm0.1$. This results in an InGaAlN layer substantially without phase separation and with a lattice constant equal to GaN, In turn, this permits high electron velocities to be achieved because the two dimensional electron gas formed in the heterointerface of InGaAlN and GaN layer is not scattered by any fluctuation in atomic content of the InGaAlN layer (such as would be caused in the presence of defects). Moreover, the band gap of the InGaAlN is larger than 4 eV so that reliable high-temperature operation can be achieved by using the structure shown in FIG. 17A.

Figure 17B:
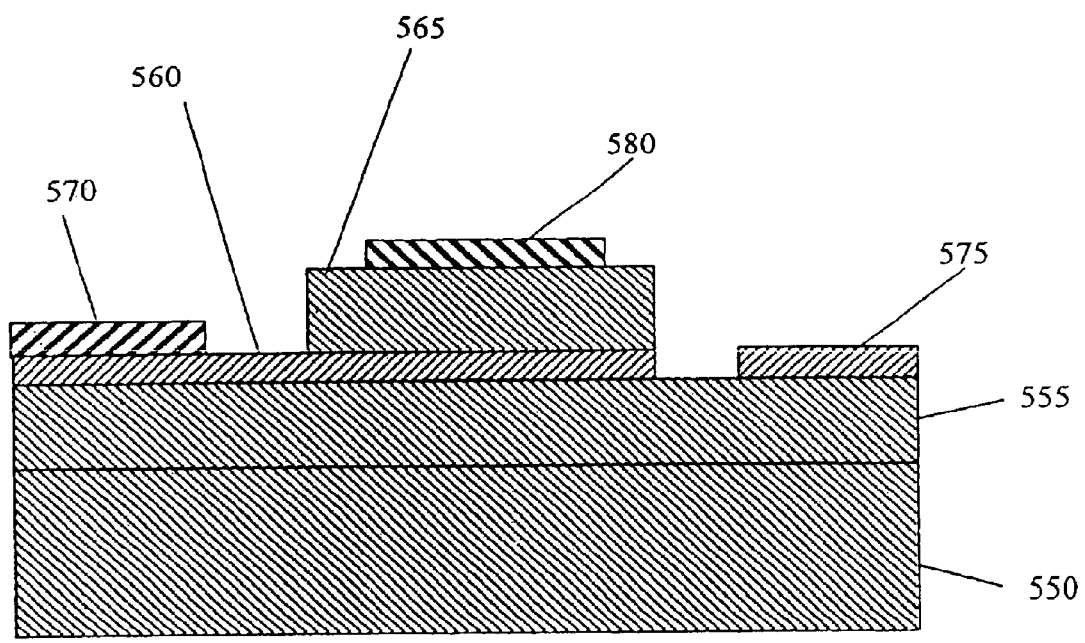

Similarly, FIG. 17B shows an embodiment of a heterojunction bipolar transistor(HBT) in accordance with the present invention. On the GaN substrate 550, a 400 nm thick n-type InGaAlN collector layer 555 is formed, followed by a 50 nm thick p-type GaN base layer 560, and a 300 nm thick emitter layer 565. Base electrode 570, collector electrode 575 and emitter electrode 580 are formed conventionally. As with FIG. 17A, for the exemplary embodiment of FIG. 17B the GaN and AlN mole fractions x and y of the InGaAlN layer are set to be 0.64 and 0.3, respectively, and x and y are required to satisfy the same relationships as discussed above. As with FIG. 17A, an InGaAlN layer without significant phase separation and with a lattice constant equal to GaN is realized, resulting in a very high quality heterojunction of InGaAlN/GaN. In addition, the band gap of the InGaAlN emitter layer (4.2 eV) is larger than that of GaN base layer (3.5 eV) so that holes generated in the p-type base layer are well confined in that base layer. This results because of the larger valence band discontinuity between GaN and InGaAlN than would occur in a GaN homojunction bipolar transistor. This has the benefit of obtaining a large current amplification of collector current relative to base current. Moreover, as mentioned above, the bandgap of the InGaAlN and the GaN layer is large so that the transistor can be used reliably in high-temperature applications.

Figure 18:
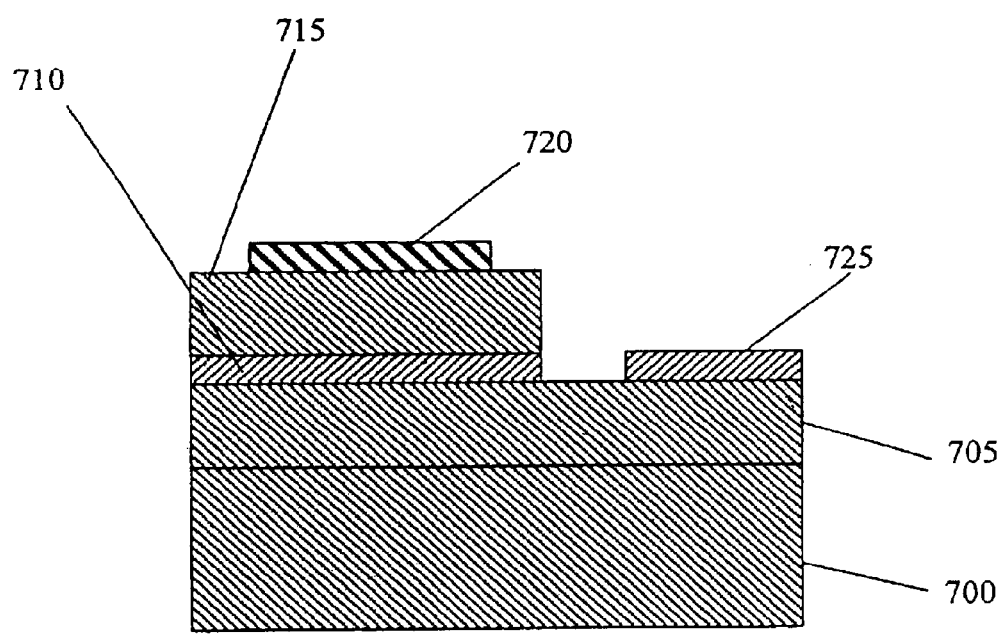
FIG. 18 shows an implementation of the present invention as a phototransistor.

Referring next to FIG. 18, there is shown therein an implementation of the present invention as a phototransistor. In this regard, GaN and AlGaN are attractive materials for photo detectors in ultraviolet(UV) range, since both GaN and AlN have a wide band gap (3.5 eV for GaN which corresponds to the light wavelength of 200 nm, 6.2 eV for AlN which corresponds to the light wavelenght of 350 nm). Due to the direct band gap and the availability of AlGaN in the entire AlN alloy composition range, AlGaN/GaN based UV photo detectors have the advantage of high quantum efficiency, as well as tunability of high cut-off wavelength. However, the lattice constant of AlGaN is sufficiently different from GaN that defects tend to be formed, which leads increased leakage current.

An $In_{1-x-y}Ga_xAl_yN$ quaternary material whose GaN mole fraction, x and AlN mole fraction, y satisfy the relationship of $0<x+y<1$, $1<=x/0.8+y/0.89$, offers not only a band gap larger than 3.1 eV, but also can be fabricated in layers with equal atomic content distribution, so that InGaAlN material also can be used for UV photo detector applications.

Moreover, the $In_{1-x-y}Ga_xAl_yN$ quaternary material whose GaN mole fraction, x and AlN mole fraction, y satisfy the relationship of x+1.2y=1 has a lattice constant equal to GaN. Therefore, by using an InGaAlN/GaN material whose GaN mole fraction, x and AlN mole fraction, y satisfy the above relationship, UV photo detectors with low defect density can be realized. In the event that detection of other frequencies is desired, for example blue light, only slight modification is required as will be understood by those skilled in the art.

As shown in FIG. 18, the semiconductor device of the present invention can be implemented as a heterojunction phototransistor(HPT) using an InGaAlN/GaN material. On the GaN substrate 700, an InGaAlN collector layer 705 is formed on the order of 500 nm thick n-type, followed by the formation of a 200 nm thick p-type GaN base layer 710. Thereafter, an emitter layer 715 on the order of 500 nm thick is formed. On the emitter layer, a ring shaped electrode 720 is formed to permit light to impinge on the base layer.

In an exemplary structure, the GaN mole fraction, x and AlN mole fraction, y of the InGaAlN layer are set to be 0.64 and 0.3, respectively. In this case, the value of x and y satisfy the relationship of 0<x+y<1, 1<=x/0.8+y/0.89, and x+1.2y=1, so that an InGaAlN layer can be formed with substantially avoids phase separation while having a lattice constant equal to GaN, thus permitting the formation of a high quality heterojunction of InGaAlN/GaN. The band gap of the InGaAlN emitter layer (4.2 eV which corresponds to the light wavelength of 290 nm) is larger than that of GaN base layer (3.5 eV which corresponds to the light wavelength of 350 nm). The light impinges on the emitter side. For the embodiment shown, impinging light in the wavelength range between 290 nm and 350 nm is transparent to the emitter layer, so that the light in that range is absorbed in the GaN base layer and generates electron and hole pairs. The holes generated by the optical absorption in the p-type base layer are well confined in the base layer because the valence band discontinuity between GaN and InGaAlN is larger than that for a conventional GaN homojunction photo transistor. This leads to the induction of a larger emitter current, which offers better electronic neutralization in the base region than in the case of the homojunction photo transistor. Therefore, UV photo detectors with high quantum efficiency and high sensitivity, and the resultant high conversion efficiency from input light to collector current, are obtained. In the event that other frequencies are to be detected, the GaN base layer may be replaced with, for example for blue light, InGaN.

Figure 19:
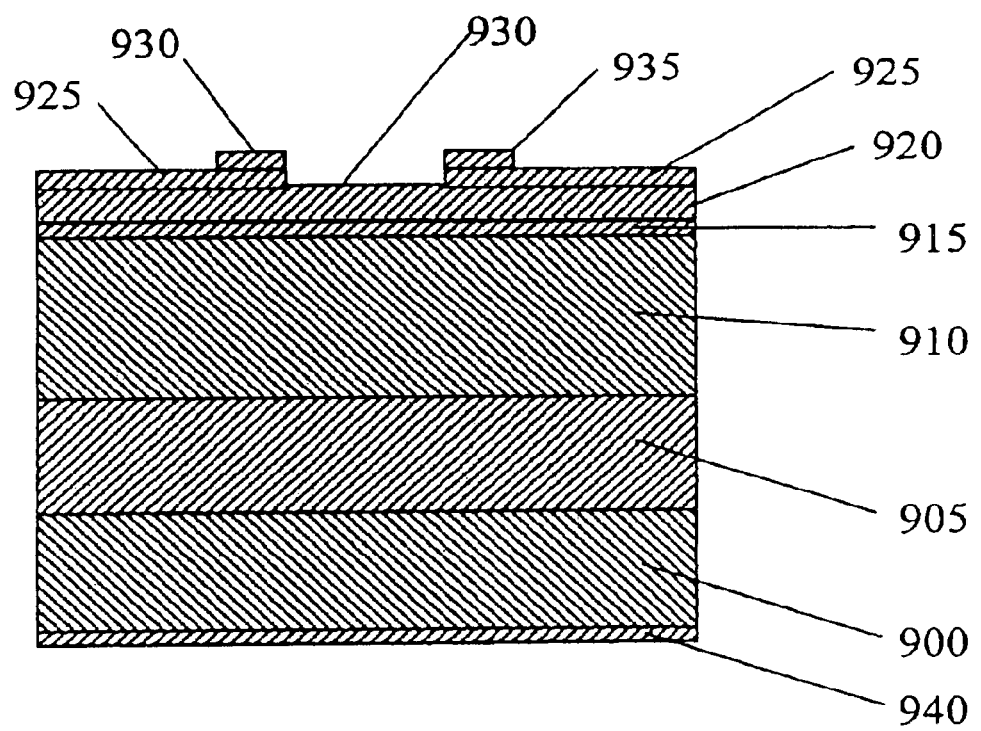
FIG. 19 shows an implementation of the present invention as a photodiode.

In addition to the phototransistor of FIG. 18, it is also possible to implement a photodiode in accordance with the present invention. Referring to FIG. 19, an n-type GaN substrate 900 is provided, on which is formed on n-type layer 910 of $In_{1-x-y}Ga_xAl_yN$ quaternary material or equivalent, which conforms to the relationships discussed above in connection with FIG. 18. An active layer 915 is thereafter formed, and above that is formed a layer 920 of p-type $In_{1-x-y}Ga_xAl_yN$ quaternary material. Then, a p-type second cladding layer 925 is formed above the layer 920, and a window 930 is formed therein to expose a portion of the layer 920. The window 930 provides a port by which light can impinge on the layer 920, causing the creation of holes. A pair of electrodes 935 and 940 may be fabricated in a conventional manner, with the electrode 935 typically being a ring electrode around the window 930. It will be appreciated that the band gap of the second cladding layer 925 is preferably larger than the band gap of the layer 920, which is in turn preferably larger than the band gap of the active layer 915; such an approach provides sensitivity to the widest range of wavelength of light. If the event a narrower range is desired, a material with a lower band gap than the layer 920 may be used for the layer 925. In addition, it is also not necessary to include the layer 925 in all embodiments, as the layers 910, 915 and 920 provide, in at least some instances, an adequate photosensitive pn-junction.

Figure 20:
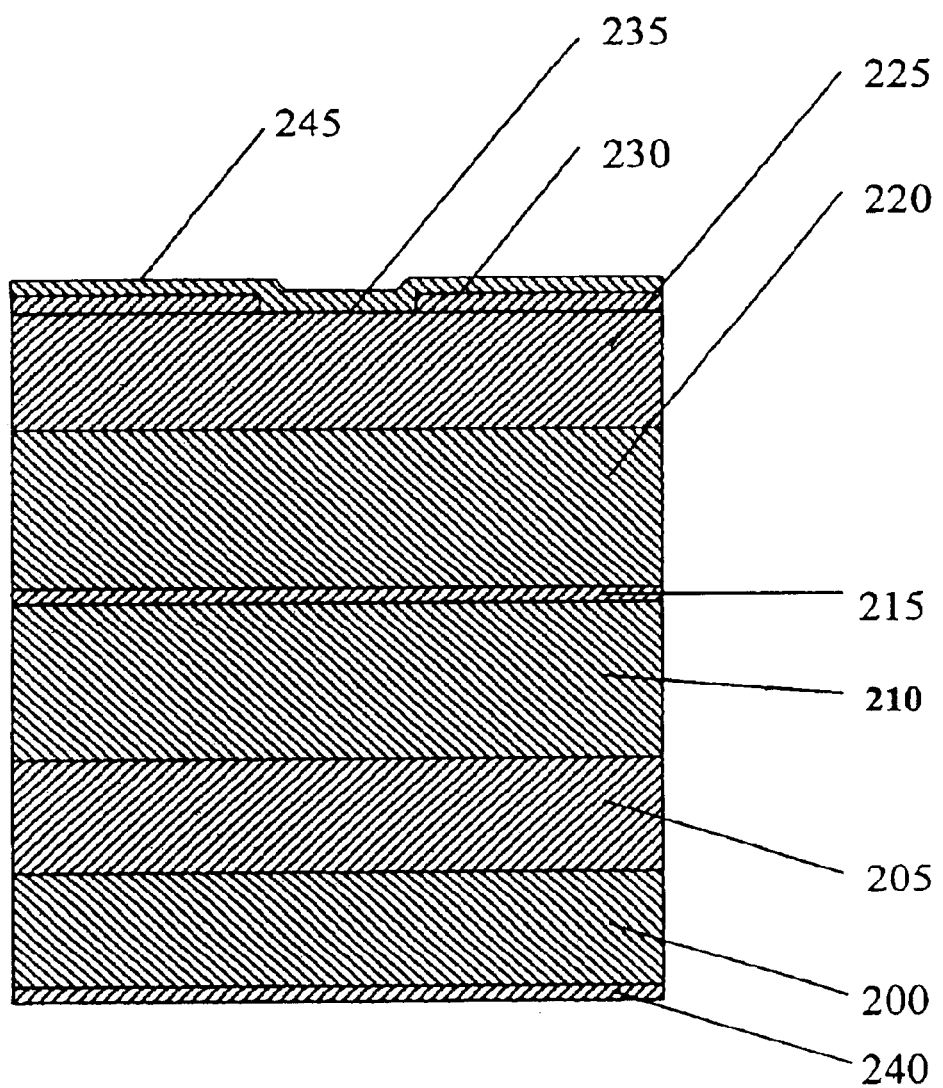
FIG. 20 shows in cross-sectional view a semiconductor structure according to a fifth embodiment of the invention.

Referring next to FIG. 20, a fifth embodiment of the present invention may be better appreciated. The fifth embodiment uses BAlGaN quaternary material system to provide an UV light emitting devices. Referring to FIG. 20, shown therein in cross-sectional view is a semiconductor structure according to a fifth embodiment of the invention. A diode of the fifth embodiment with particular reference to FIG. 20, an n-type AlN substrate 200 is provided and an n-type AlN first cladding layer 205 (typically 0.5 μm thick) is formed thereon. Thereafter, a second cladding layer 210, typically of an n-type $B_{0.01}Al_{0.95}Ga_{0.04}N$ material which may be on the order of 1.5 μm thick, is formed thereon, followed by a multiple quantum well active layer 215 which in an exemplary arrangement may comprise three quantum well layers of $B_{0.04}Al_{0.63}Ga_{0.33}N$ material on the order of 35 Å thick together with four barrier layers of $B_{0.03}Al_{0.70}Ga_{0.27}N$ material on the order of 35 Å thick, arranged as three pairs. Next, a third cladding layer 220 of a p-type $B_{0.01}Al_{0.95}Ga_{0.04}N$ (typically on the order of 1.5 μm thick) is formed, followed by a p-type AlN fifth cladding layer 225 (on the order of 0.5 μm thick). A $SiO_2$ layer 230 having one stripe like window region 235 (3.0 μm width) is formed on the p-type AlN fourth cladding layer 225. A first electrode 240 is formed on the n-type AlN substrate 200, while a second electrode 245 is formed on the $SiO_2$ layer 230 and the window region 235.

In order to emit ultra violet light with a wavelength range of 230 nm from the active layer 215, the BN mole fraction, the GaN mole fraction, and the AlN mole fraction of the well layer are set to be 0.04, 0.63, and 0.33, respectively. To avoid defects due to lattice mismatch, the lattice constants of the various constituent layers are matched to each other by setting the AlN mole fraction, x, and the GaN, y, in each of the layers to meet the condition x+1.12y nearly equals a constant value. In an exemplary embodiment, the constant value is set to nearly one, for example 1±0.1, although most embodiments will be in the range 1±0.05.

By proper selection of materials, the band gap energy of the n-type second cladding layer 210 and the p-type third cladding layer 220 are larger than that of the 3 pairs of multiple quantum well active layers 215. This confines the injected carriers from the n-type second cladding layer 210 and p-type third cladding layer 220 within the active layer 215, where the carriers recombine to lead to the emission of ultraviolet light. In addition, the refractive index of the n-type second cladding layer 210 and the p-type third cladding layer 220 are smaller than that of the multiple quantum well active layer 215, which confines the optical field in the transverse direction.

Because the injected current from the electrode 245 is confined to flow through the window region 235, the region in the active layer 215 under the widow region 235 is activated strongly. This causes the local modal gain in the active layer under the window region to be higher than the local modal gain in the active layer under the $SiO_2$ layer. Therefore, a gain guided waveguide, leading to a lasing oscillation, is able to be formed in the structure of the fifth embodiment.

Figure 21A:
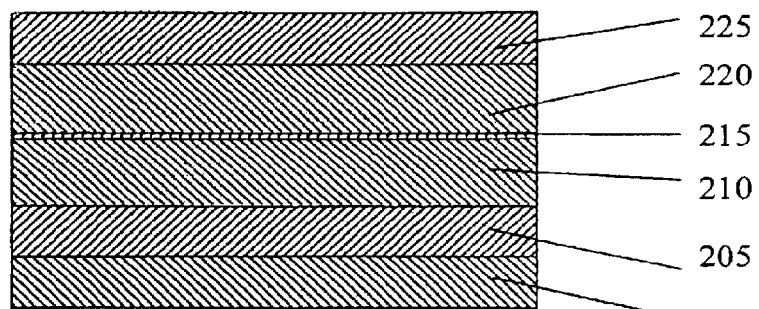
FIG. 21 shows an exemplary series of the fabrication steps for a semiconductor structure in accordance with a fifth embodiment of the invention.

FIGS. 21A–21D show, in sequence, a summary of the fabrication steps necessary to construct an exemplary laser diode according to the fifth embodiment. Since the structure which results from FIGS. 21A–21D will resemble that shown in FIG. 20, like reference numerals will be used for elements whenever possible. With reference first to FIG. 21A, an n-type AlN substrate 200 is provided, on which is grown an n-type AlN first cladding layer 205. The first cladding layer 205 is typically on the order of 0.5 $\mu$m thick. Thereafter, an n-type $B_{0.01}Al_{0.95}Ga_{0.04}N$ second cladding layer 210 is formed, typically on the order of 1.5 $\mu$m thick.

Next, a multiple quantum well active layer 215 is formed by creating three quantum wells comprised of three layers of $B_{0.04}Al_{0.63}Ga_{0.33}N$ material each on the order of 35 Å thick, together with four barrier layers of $B_{0.03}Al_{0.70}Ga_{0.27}N$ material on the order of 35 Å thick. A third cladding layer 220 of p-type $B_{0.01}Al_{0.95}Ga_{0.04}N$ material, on the order of 1.5 $\mu$m thick, is then formed, after which is formed a fourth cladding layer 225 of a p-type AlN on the order of 0.5 $\mu$m thick. Each of the layers is typically formed by either the Metal Organic Chemical Vapor Deposition (MOCVD) method or the Molecular Beam Epitaxy (MBE) method.

Figure 21B:
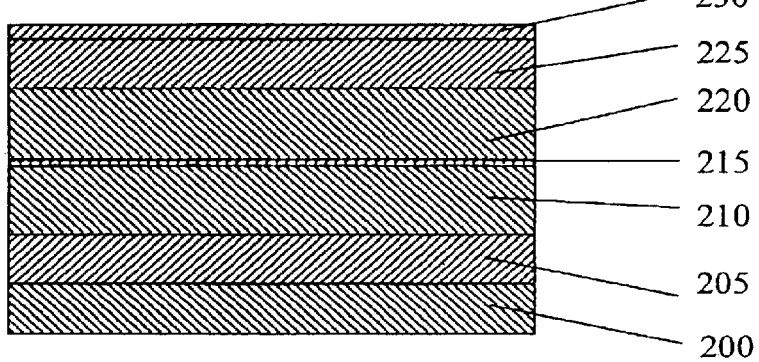
Figure 21C:
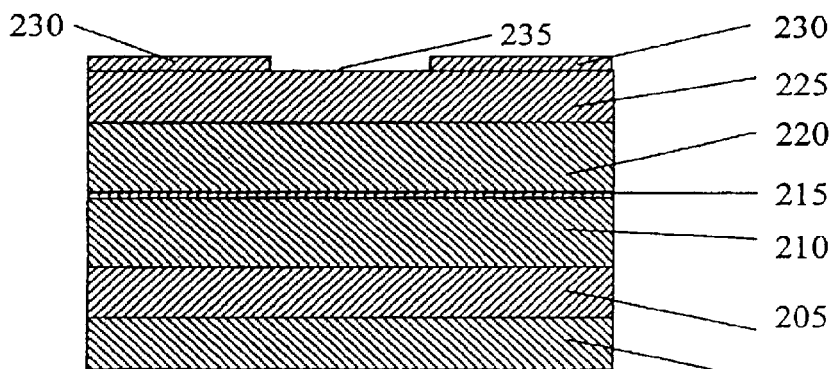
Figure 21D:
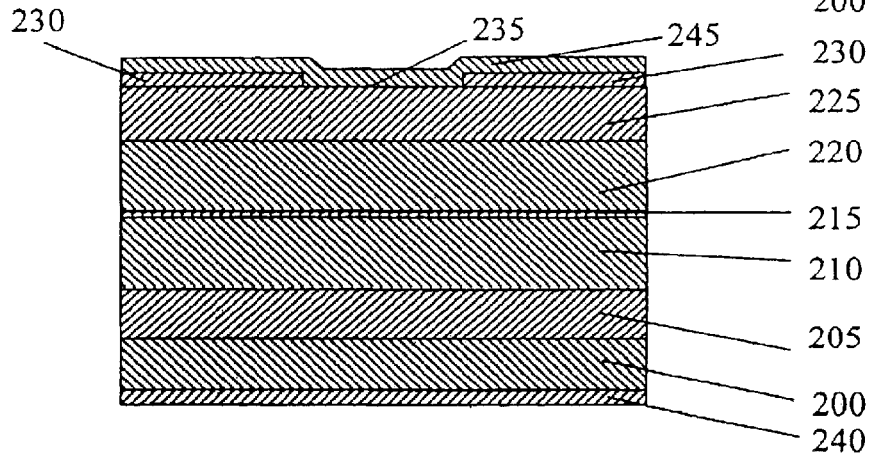

Then, as shown in FIG. 21B, a silicon dioxide ($SiO_2$) layer 230 is formed on the p-type AlN fourth cladding layer 225, for example by the Chemical Vapor Deposition (CVD) method. Using photolithography and etching or any other suitable method, a window region 235 is formed as shown in FIG. 21C. The window region 235 may be stripe-like in at least some embodiments. Finally, as shown in FIG. 21D, a first electrode 240 and a second electrode 245 are formed on the n-type AlN substrate 200 and on the $SiO_2$ layer 230, respectively, by evaporation or any other suitable process.

Figure 22:
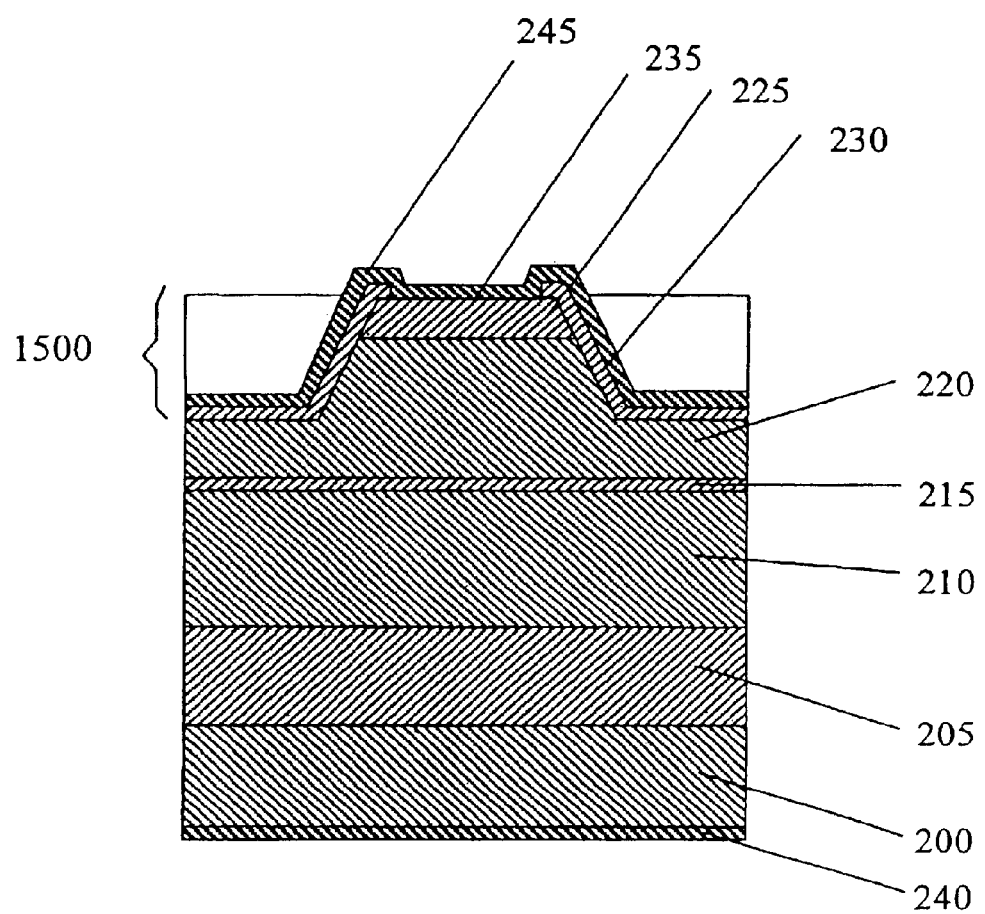
FIG. 22 shows in cross-sectional view a semiconductor structure according to a sixth embodiment.

Referring next to FIG. 22, a sixth embodiment of a semiconductor structure in accordance with the present invention may be better appreciated. As with the fifth embodiment, an exemplary application of the sixth embodiment is the creation of a laser diode. The structure of the sixth embodiment permits a waveguide with a real refractive index guide to be built into the structure. This provides a low threshold current laser diode which can operate with a fundamental transverse mode.

Continuing with reference to FIG. 22, for ease of reference, like elements will be indicated with like reference numerals. On an n-type AlN substrate 200, a first cladding layer 205 is formed on an n-type AlN on the order of 0.5 $\mu$m thick. Successively, an n-type second cladding layer 210 is formed of $B_{0.01}Al_{0.95}Ga_{0.04}N$ material on the order of 1.5 $\mu$m thick. Thereafter, a multiple quantum well active layer 215 is formed comprising three well layers of $B_{0.04}Al_{0.63}Ga_{0.33}N$ order of 35 Å thick together with four barrier layers of $B_{0.03}Al_{0.70}Ga_{0.27}N$ material, also on the order of 35 Å thick. Next, a third, p-type cladding layer 220 formed of $B_{0.01}Al_{0.95}Ga_{0.04}N$ material on the order of 1.5 $\mu$m thick is formed. Thereafter, a p-type AlN fourth cladding layer 225 on the order of 0.5 $\mu$m thick is formed over the ridge structure 1500 of the third cladding layer 220. The third and fourth cladding layers are then partially removed to create a ridge structure 1500. A silicon dioxide ($SiO_2$) layer 230 is then formed over the fourth cladding layer 225 as well as the remaining exposed portion of the third cladding layer 220. A window region 235, which may be stripe-like on the order of 2.0 $\mu$m width, is formed through the $SiO_2$ layer above the fourth and third cladding layers 225 and 220, respectively. As with the fifth embodiment, a first electrode 240 is formed on the n-type AlN substrate 200 and a second electrode 245 is formed on the $SiO_2$ layer 230 and the window region 235.

As with the fifth embodiment, in order to emit ultra violet light with a wavelength in the range of 230 nm from the active layer 215, the mole fractions of BN, GaN, and AlN in the well layer are set to be 0.04, 0.33, and 0.63, respectively. Likewise, in order to match the lattice constants of each of the constituent layers to avoid defects due to lattice mismatch, the AlN mole fraction, x, and the GaN, y, of all the layers satisfy the condition of x+1.12y nearly equals a constant value. As in the fifth embodiment, x+1.12y set to be nearly equals 1 so that the equivalent lattice constants of each layers become nearly equal to the lattice constant of AlN. Likewise, the band gap energy of the cladding layers is maintained larger than the band gap energy for the active layer, allowing the emission of ultraviolet light. Similarly the refractive index of the materials is as discussed in connection with the first embodiment, permitting the optical field to be confined in the transverse direction.

Similar to the operation of the fifth embodiment, the region of the active layer 215 under the window region 235 is activated strongly because of the constraints on the injected current by the $SiO_2$ layer. The result, again, is that the local modal gain in the active layer under the window region 235 is higher than the local modal gain in the active layer under the $SiO_2$ layer 230. This, combined with the relatively higher effective refractive index in the transverse direction inside the ridge stripe region compared to that outside the ridge stripe region, provides an effective refractive index step ($\Delta$n). This results in a structure which has, built in, a waveguide formed by a real refractive index guide. Therefore, the design of the sixth embodiment provides a low threshold current laser diode which can operate with a fundamental transverse mode.

Referring next to FIGS. 23A–23E, a summary of the key fabrication steps is shown for an exemplary device of a semiconductor laser diode in accordance with the fifth embodiment.

Figure 23A:
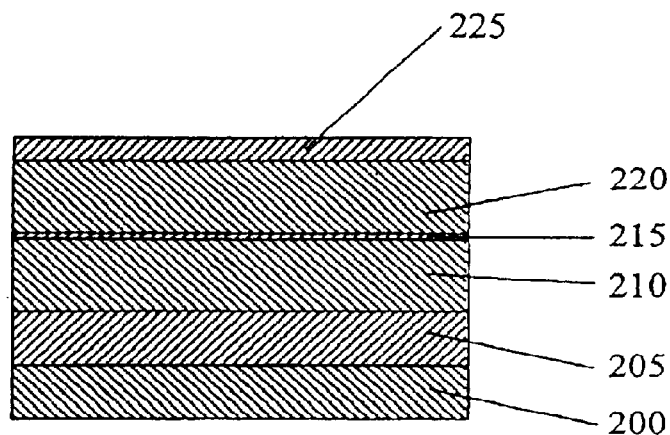
FIG. 23 shows an exemplary series of the fabrication steps for a semiconductor structure in accordance with the ninth embodiment of the invention.
Figure 23B:
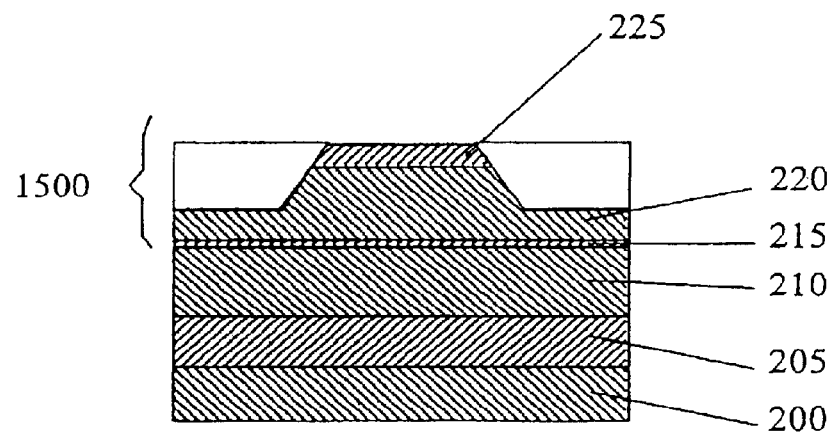

Referring first to FIGS. 23A and 23B, the formation of the first and second cladding layers 205 and 210 on an n-type AlN substrate 200, together with the three-pair multiple quantum well active layer 215 are the same as for the fifth embodiment. Thereafter, the third and fourth cladding layers 220 and 225 are formed and then partially removed— typically by etching—to create a ridge structure 1500. As before, in an exemplary embodiment the various layers are formed successively by either the MOCVD or the MBE method.

Figure 23C:
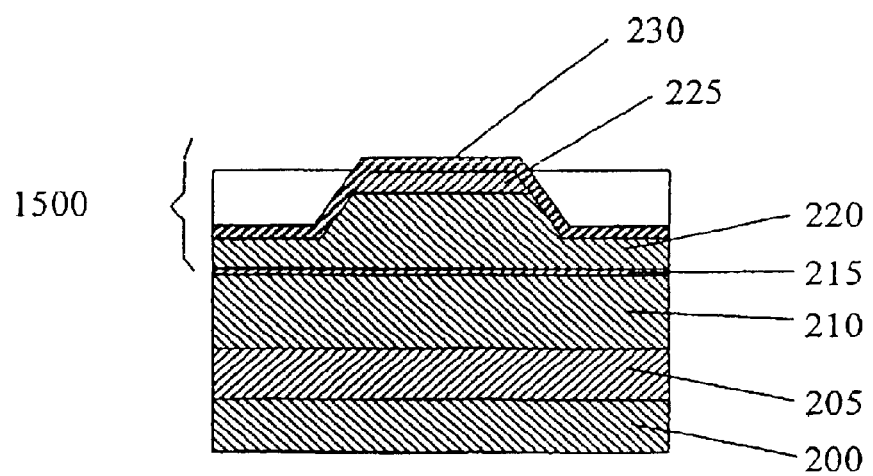
Figure 23D:
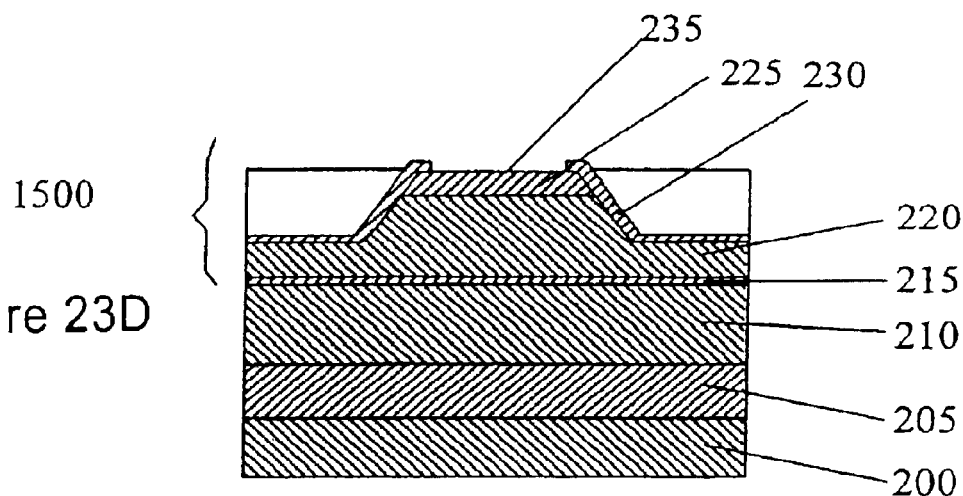
Figure 23E:
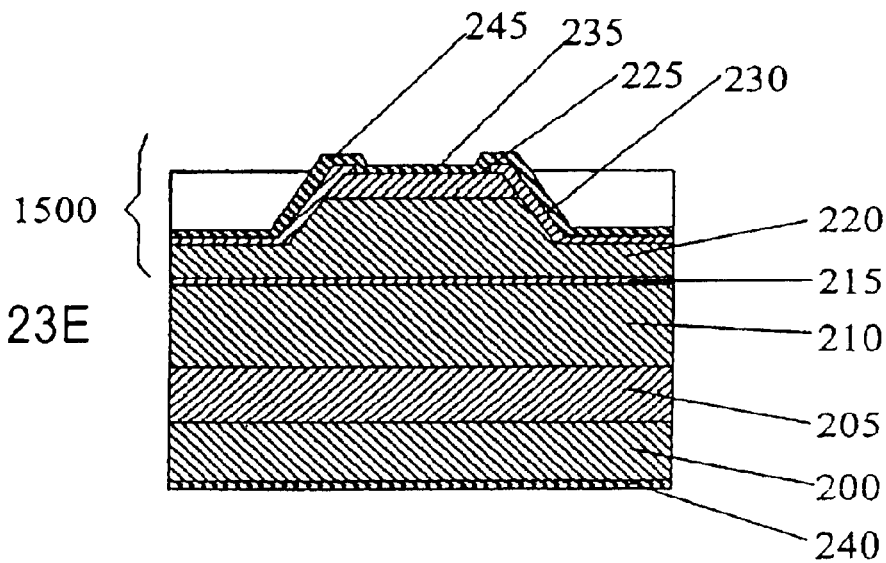

Then, as shown in FIG. 23C-23E, a silicon dioxide layer 230 is formed over the fifth and third cladding layers 225 and 220, respectively, typically by the CVD method, after which a window region 235 is formed as with the fifth embodiment. Electrodes 240 and 245 are then evaporated or otherwise bonded to the structure.

Figure 24:
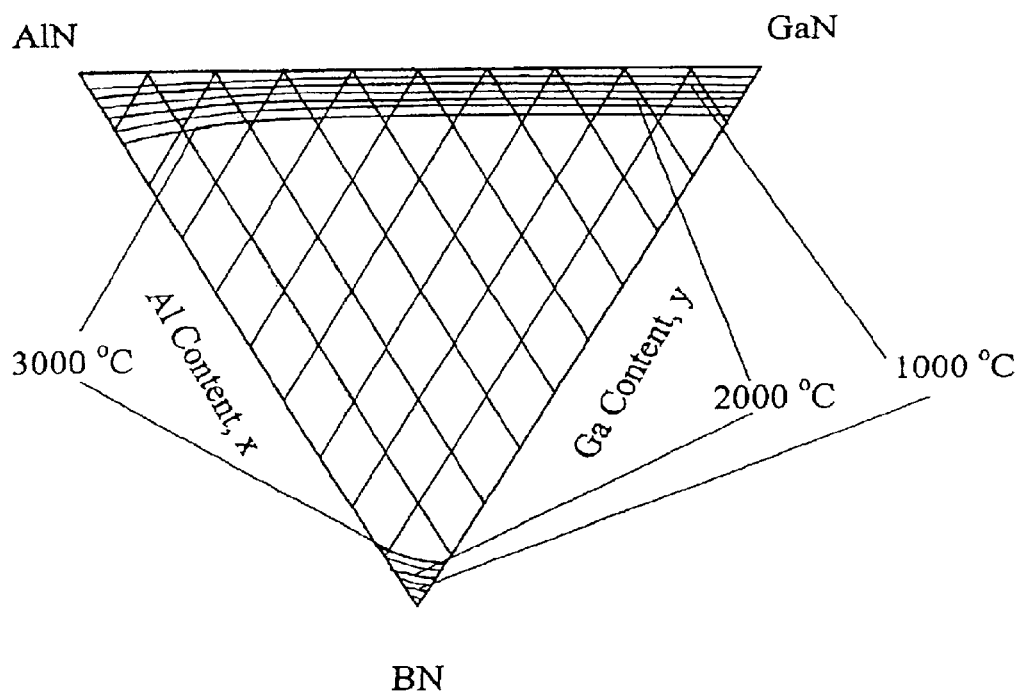
FIG. 24 shows in plot form the boundary between the phase separation region and the region without phase separation at various growth temperatures.

Referring next to FIG. 24, the selection of the AlN mole fraction, x, and the GaN mole fraction, y, and the relationship therebetween for the constituent BAlGaN layers, may be better understood. In particular, the relative mole fractions are required to satisfy, approximately, the relationship 0<x+y<1, 1<=1.04x+1.03y.

FIG. 24 shows the boundary of phase separation region plotted against various growth temperatures. The lines in FIG. 24 show the boundary between the compositionally unstable (phase separation) region and stable region with respect to various temperatures. The region surrounded with the two boundary lines for the same temperature shows the phase separation content region for each temperature. It has been discovered that the ternary alloys BAlN and BGaN have a large phase separation region due to the large lattice mismatch between BN and AlN, and between BN and GaN.

On the other hand, it is found that the ternary alloy GaAlN has no phase separation region for crystal growth at temperatures around 1000° C., due to the small lattice mismatch between AlN and GaN.

Figure 25:
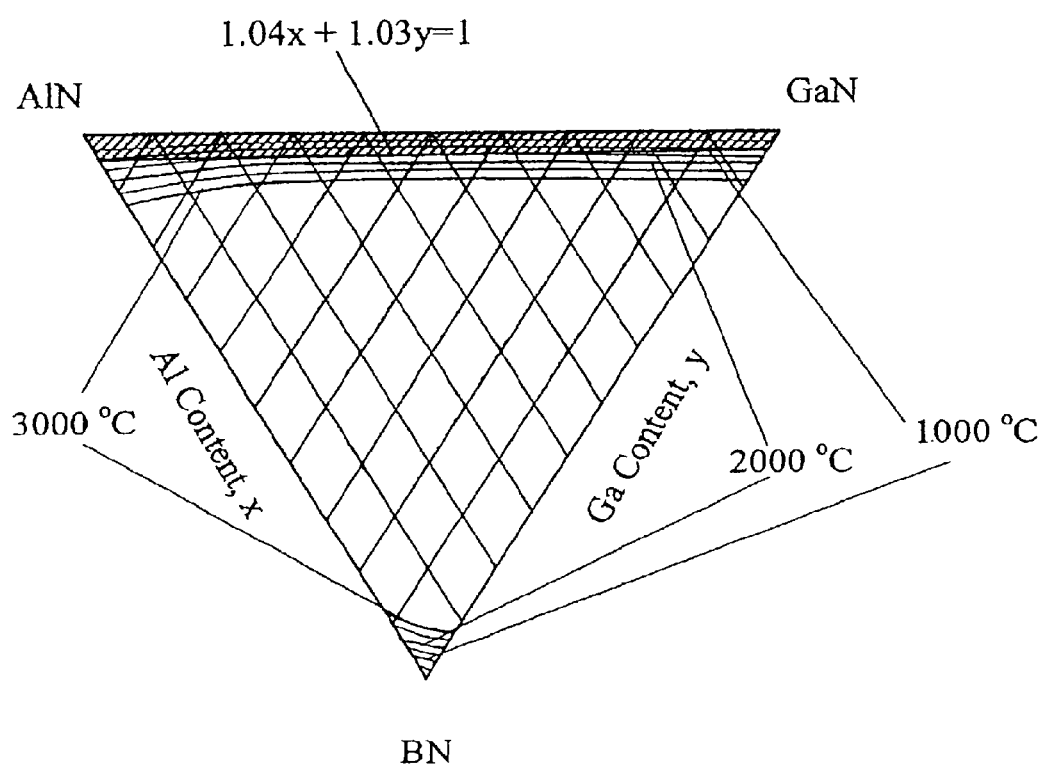
FIG. 25 shows the content choice region of Ga content and Al content in BAlGaN to avoid phase separation at a growth temperature below approximately 1000° C.

It has therefore been discovered that an BGaAlN material system can be provided in which the usual crystal growth temperature is in the approximate range of around 500° C. to around 1000° C. like in the case of InGaAlN. Likewise, it has been discovered that phase separation of the B content, Ga content, and Al content of BGaAlN does not occur significantly at processing temperatures between on the order of 500° C. and on the order of 1000° C. Finally, by combining the two, the content choice region of Ga content and Al content in BGaAlN to avoid phase separation at a crystal growth temperature below around 1000° C. is found to be the shadow region in FIG. 25, with the line separating the two regions being approximately defined by the relationship $1.04x+1.03y=1$.

Therefore, for each of the two structural embodiments using BAlGaN disclosed hereinabove, the phase separation phenomena can be avoided in an BGaAlN material system by operating at a crystal growth temperature between on the order of 500° C. and around 1000° C., when the Al mole fraction, x, and the GaN mole fraction, y, of the all constituent layers of the laser diodes are made to satisfy approximately the relationship of $0<x+y<1$, $1<=1.04x+1.03y$. The result is the substantially uniform distribution of B atoms, Ga atoms, and Al atoms in each constituent layer according to the atomic mole fraction.

Figure 26:
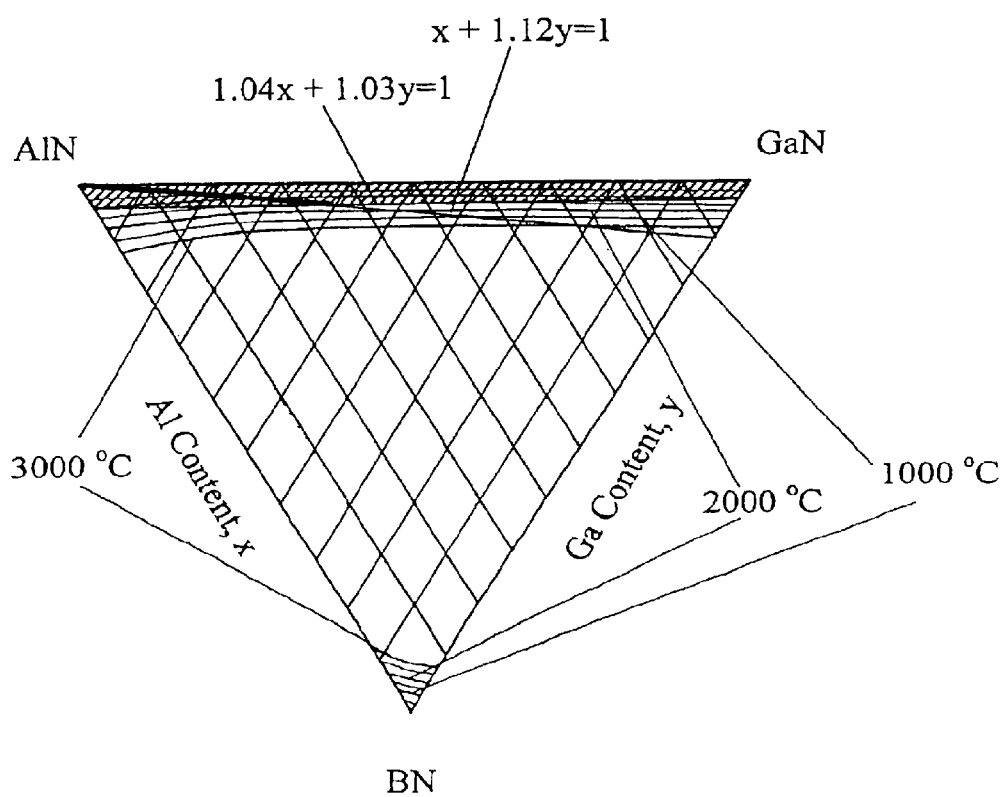
FIG. 26 shows the content choice line of Ga content and Al content in BAlGaN to avoid phase separation at a growth temperature below approximately 1000° C. which, at the same time, creates a lattice constant of BAlGaN substantially equivalent to that of AlN.

FIG. 26 shows the content choice line of Al content, x, and Ga content, y, in an BGaAlN system to avoid phase separation phenomenon at growth temperatures below around 1000° C. The line in FIG. 26 shows the exemplary line of $x+1.12y=1$. Therefore, by ensuring that the Ga content and Al content of the constituent BGaAlN layers of a laser diode formed on a AlN substrate have a relationship of $x+1.12y$ nearly equal to 1 and $0<x+y<1$, $1<=1.04x+1.03y$, a laser diode on a AlN substrate with low defect density and no or very little phase separation can be obtained.

In addition, other semiconductor structures can be fabricated with BAlGaN materials system. As discussed above, Group-III nitride materials, especially GaN and AlN, are promising for use in electronic devices which can operate under high-power and high-temperature conditions—for example, microwave power FETs by using AlGaN/GaN heterostructures. However, as noted previously hereinabove, the different lattice constants of AlGaN and GaN cause the generation of significant defects, limiting the mobility of electrons in the resultant structure and the utility of such materials systems for FET use.

The present invention also substantially overcomes these limitations, in that the BGaAlN/AlN material of the present invention has a lattice constant equal to AlN. As discussed hereinabove, a quaternary materials system of $B_{1-x-y}Al_xGa_yN$, where the AlN mole fraction (x) and GaN mole fraction (y) satisfy the relationships $0<x+y<1$, $1<=1.04x+1.03y$ and $x+1.12y=1\pm0.1$ not only has a band gap greater than 5 eV, but also has a lattice constant substantially equal to AlN. This permits fabrication of semiconductor structures such as FETs which have substantially uniform atomic content distribution in the various layers. Therefore, by using an BGaAlN/AlN material system in accordance with the present invention, whose AlN mole fraction, x and GaN mole fraction, y satisfy the above relationships, high-power and high-temperature transistors with low defect density can be realized.

Figure 27A:
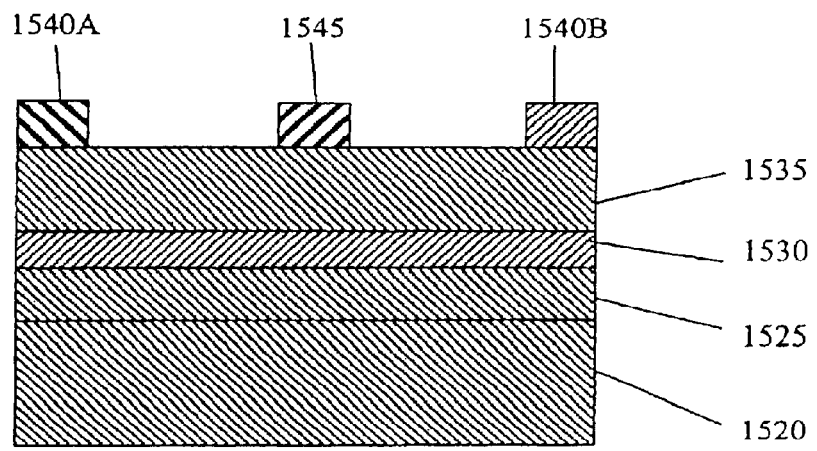
FIGS. 27A and 27B show representations of bipolar and FET transistors constructed in accordance with the materials system of the present invention.

Referring to FIG. 27A, there is shown therein an exemplary embodiment of a heterojunction field effect transistor (HFET) using BGaAlN/AlN material in accordance with the present invention. On a AlN substrate 1520, a 0.5 µm i-$B_{0.04}Al_{0.63}Ga_{0.33}N$ layer 1525 is formed, followed by a thin, approximately 10 nm $B_{0.04}Al_{0.63}Ga_{0.33}N$ conducting channel layer 1530 and a 10 nm AlN layer 1535. Source and drain electrodes 1540A-B, and gate electrode 1545 are formed in a conventional manner. In the structure, the AlN mole fraction, x, and GaN mole fraction, y, of the BGaAlN layer are set to be 0.63 and 033, respectively. In this case, the value of x and y satisfy the relationship of $0>x+y<1$, $1<=1.04x+1.03y$, and $x+1.12y=1\pm0.1$. This results in an BGaAlN layer substantially without phase separation and with a lattice constant equal to AlN, in turn, this permits high electron velocities to be achieved because the two dimensional electron gas formed in the heterointerface of BGaAlN and AlN layer is not scattered by any fluctuation in atomic content of the BGaAlN layer (such as would be caused in the presence of defects). Moreover, the band gap of the BGaAlN is larger than 5 eV so that reliable high-temperature operation can be achieved by using the structure shown in FIG. 27A.

Figure 27B:
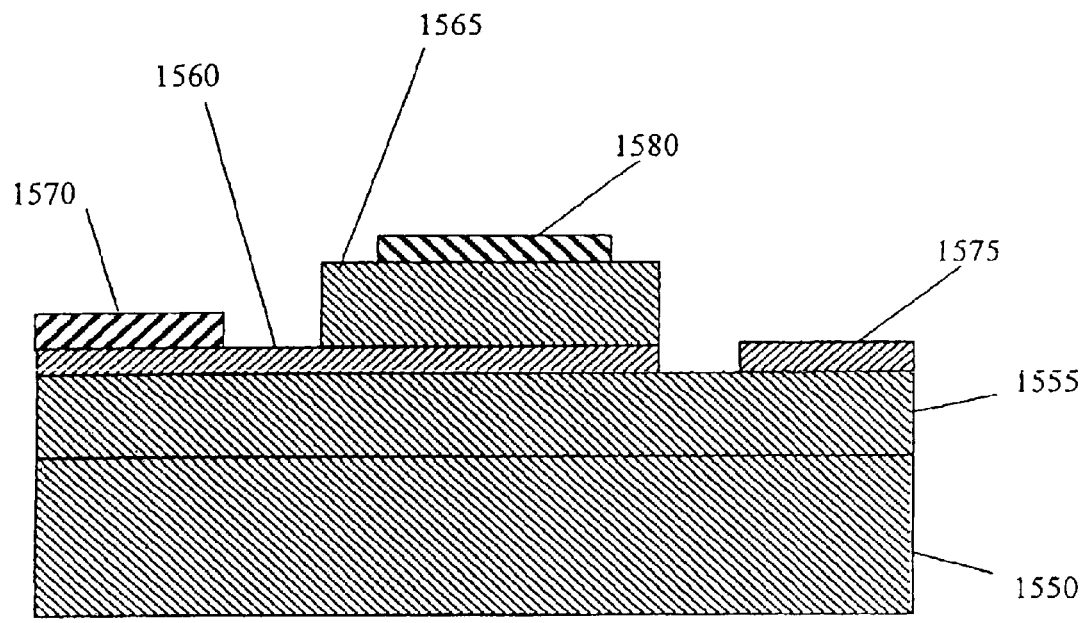

Similarly, FIG. 27B shows an embodiment of a heterojunction bipolar transistor(HBT) in accordance with the present invention. On the AlN substrate 1550, a 400 nm thick n-type AlN collector layer 1555 is formed, followed by a 50 nm thick p-type BAlGaN base layer 1560, and a 300 nm thick AlN emitter layer 1565. Base electrode 1570, collector electrode 1575 and emitter electrode 1580 are formed conventionally. As with FIG. 27A, for the exemplary embodiment of FIG. 26B the AlN and GaN mole fractions x and y of the BGaAlN layer are set to be 0.63 and 0.33, respectively, and x and y are required to satisfy the same relationships as discussed above. As with FIG. 27A, an BGaAlN layer without significant phase separation and with a lattice constant equal to AlN is realized, resulting in a very high quality heterojunction of BGaAlN/GaN. In addition, the band gap of the AlN emitter layer (6.2 eV) is larger than that of BGaAlN base layer (5.3 eV) so that holes generated in the p-type base layer are well confined in that base layer. This results because of the larger valence band discontinuity between AlN and BGaAlN than would occur in a AlN homojunction bipolar transistor. This has the benefit of obtaining a large current amplification of collector current relative to base current. Moreover, as mentioned above, the bandgap of the BGaAlN and the AlN layer is large so that the transistor can be used reliably in high-temperature applications.

Figure 28:
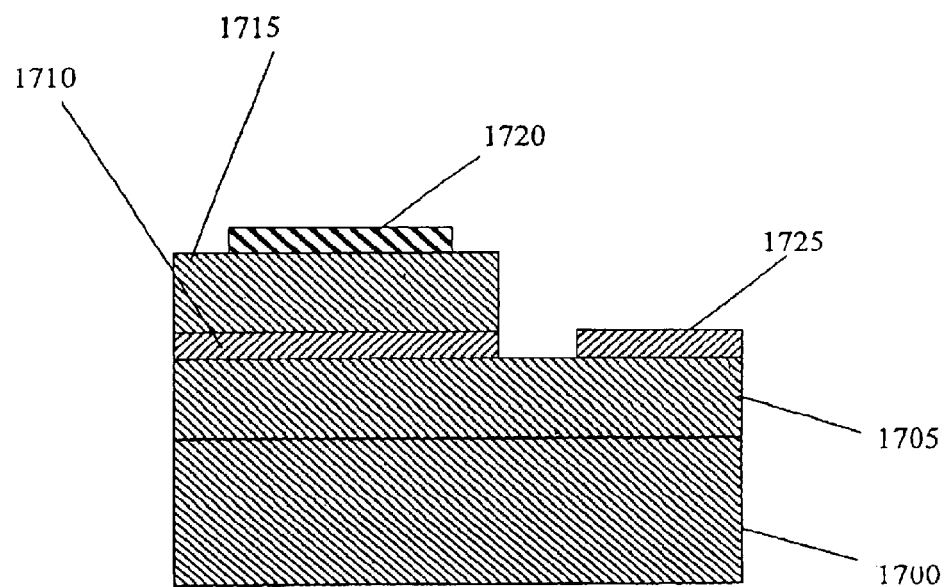
FIG. 28 shows an implementation of the presention invention as a phototransistor.

Referring next to FIG. 28, there is shown therein an implementation of the present invention as a phototransistor. $B_{1-x-y}Al_xGa_yN$ quaternary material whose AlN mole fraction, x and GaN mole fraction, y satisfy the relationship of $0<x+y<1$, $1<=1.04x+1.03y$, offers not only a band gap larger than 3.5 eV, but also can be fabricated in layers with equal atomic content distribution, so that BGaAlN material also can be used for UV photo detector applications. Moreover, the $B_{1-x-y}Al_xGa_yN$ quaternary material whose AlN mole fraction, x and GaN mole fraction, y satisfy the relationship of $x+1.12y=1$ has a lattice constant equal to AlN. Therefore, by using BGaAlN/AlN material whose AlN mole fraction, x and GaN mole fraction, y satisfy the above relationship, UV photo detectors with low defect density can be realized. In the event that detection of other frequencies is desired, for example blue light, only slight modification is required.

As shown in FIG. 28, the semiconductor device of the present invention can be implemented as a heterojunction phototransistor(HPT) using BGaAlN/AlN material. On the AlN substrate 1700, an AlN collector layer 1705 is formed on the order of 500 nm thick n-type, followed by the formation of a 200 nm thick p-type BAlGaN base layer 1710. Thereafter, an emitter layer 1715 on the order of 500 nm thick is formed. On the emitter layer, a ring shaped electrode 1720 is formed to permit light to impinge on the base layer.

In an exemplary structure, the AlN mole fraction, x and GaN mole fraction, y of the BAlGaN layer are set to be 0.63 and 0.33, respectively. In this case, the value of x and y satisfy the relationship of $0<x+y<1$, $1<=1.04x+1.03y$, and $x+1.12y=1$, so that a BGaAlN layer can be formed with substantially avoids phase separation while having a lattice constant equal to AlN, thus permitting the formation of a high quality heterojunction of BGaAlN/AlN. The band gap of the AlN emitter layer (6.2 eV which corresponds to the light wavelength of 200 nm) is larger than that of BAlGaN base layer (5.3 eV which corresponds to the light wavelength of 230 nm). The light impinges on the emitter side. For the embodiment shown, impinging light in the wavelength range between 200 nm and 230 nm is transparent to the emitter layer, so that the light in that range is absorbed in the BAlGaN base layer and generates electron and hole pairs. The holes generated by the optical absorption in the p-type base layer are well confined in the base layer because the valence band discontinuity between AlN and BAlGaN is larger than that for a conventional AlN homojunction photo transistor. This leads to the induction of a larger emitter current, which offers better electronic neutralization in the base region than in the case of the homojunction photo transistor. Therefore, UV photo detectors with high quantum efficiency and high sensitivity, and the resultant high conversion efficiency from input light to collector current, are obtained. In the event that other frequencies are to be detected, the BAlGaN base layer may be replaced with, for example for blue light, InGaN.

Figure 29:
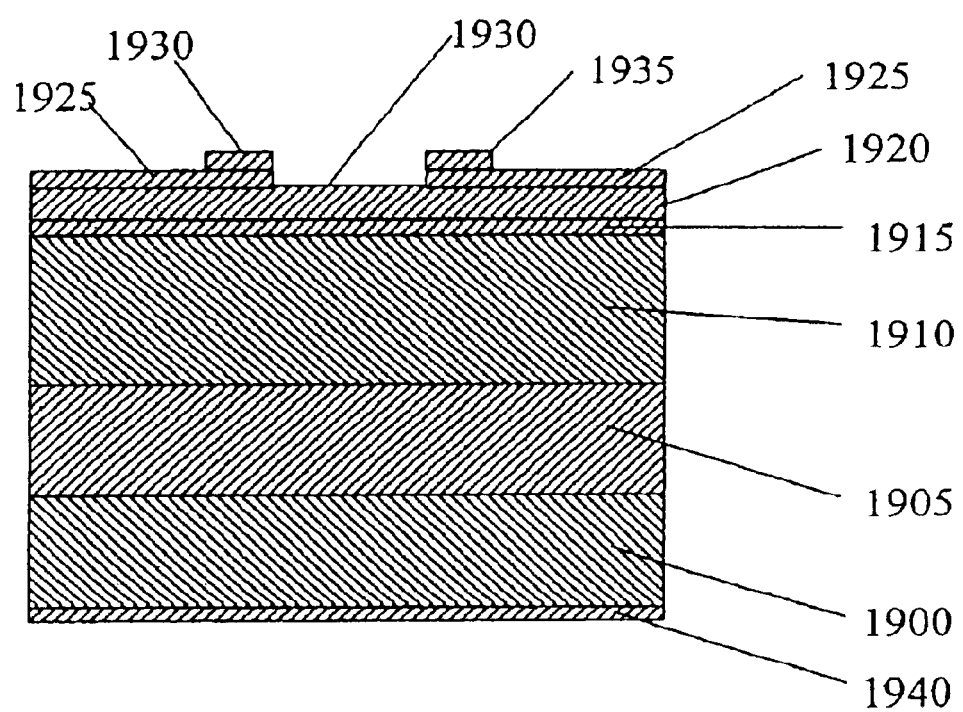
FIG. 29 shows an implementation of the present invention as a photodiode.

In addition to the phototransistor of FIG. 28, it is also possible to implement a photodiode in accordance with the present invention. Referring to FIG. 29, an n-type AlN substrate 1900 is provided, on which is formed an n-type layer 910 of $B_{1-x-y}Al_xGa_yN$ quaternary material or equivalent, which conforms to the relationships discussed above in connection with FIG. 28. An active layer 1915 is thereafter formed, and above that is formed a layer 1920 of p-type $B_{1-x-y}Al_xGa_yN$ quaternary material. Then, a p-type second cladding layer 1925 is formed above the layer 1920, and a window 1930 is formed therein to expose a portion of the layer 1920. The window 1930 provides a port by which light can impinge on the layer 1920, causing the creation of holes. A pair of electrodes 1935 and 1940 may be fabricated in a conventional manner, with the electrode 1935 typically being a ring electrode around the window 1930. It will be appreciated that the band gap of the second cladding layer 1925 is preferably larger than the band gap of the layer 1920, which is in turn preferably larger than the band gap of the active layer 1915; such an approach provides sensitivity to the widest range of wavelength of light. If the event a narrower range is desired, a material with a lower band gap than the layer 1920 may be used for the layer 1925. In addition, it is also not necessary to include the layer 1925 in all embodiments, as the layers 1910, 1915 and 1920 provide, in at least some instances, an adequate photosensitive pn-junction.

Figure 30:
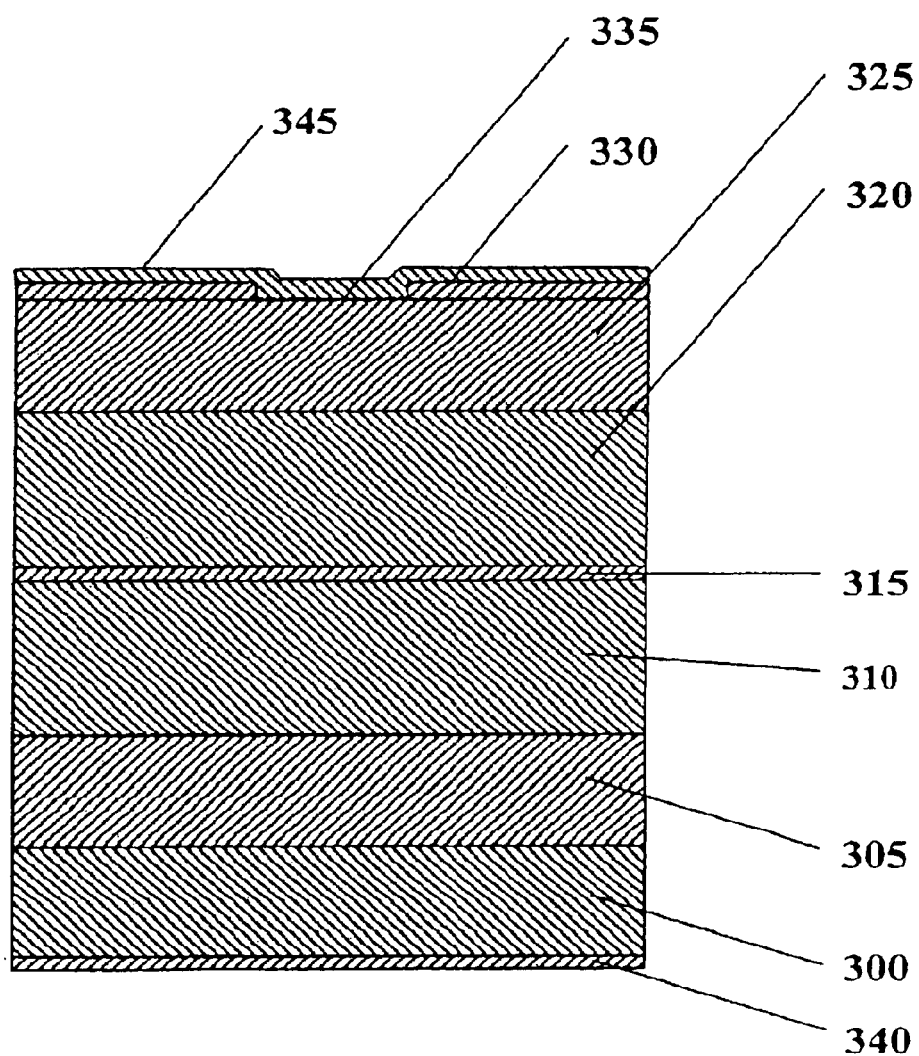
FIG. 30 shows in cross-sectional view a semiconductor structure according to a seventh embodiment of the invention.

Referring next to FIG. 30, a seventh embodiment of the present invention may be better appreciated. The seventh embodiment uses BGaInN quaternary material system to provide blue light emitting devices. Referring to FIG. 28, shown therein cross-sectional view is a semiconductor structure according to a seventh embodiment of the invention. A diode of the seventh embodiment with particular reference to FIG. 30, an n-type GaN substrate 300 is provided and an n-type GaN first cladding layer 305 (typically 0.5 μm thick) is formed thereon. Thereafter, a second cladding layer 310, typically of an n-type $B_{0.03}Ga_{0.96}In_{0.01}N$ material which may be on the order of 1.5 μm thick, is formed thereon, followed by a multiple quantum well active layer 315 which in an exemplary arrangement may comprise three quantum well layers of $B_{0.01}Ga_{0.86}In_{0.13}N$ material on the order of 35Å thick together with four barrier layers of $B_{0.01}Ga_{0.90}In_{0.09}N$ material on the order of 35Å thick, arranged as three pairs. Next, a third cladding layer 320 of a p-type $B_{0.03}Ga_{0.96}In_{0.01}N$ (typically on the order of 1.5 μm thick) is formed, followed by a p-type GaN fifth cladding layer 325 (on the order of 0.5 μm thick). A $SiO_2$ layer 330 having one stripe like window region 335 (3.0 μm width) is formed on the p-type GaN fourth cladding layer 325. A first electrode 340 is formed on the n-type GaN substrate 300, while a second electrode 345 is formed on the $SiO_2$ layer 330 and the window region 335.

In order to emit blue light with a wavelength range of 400 nm from the active layer 315, the BN mole fraction, the GaN mole fraction, and the InN mole fraction of the well layer are set to be 0.01, 0.86, and 0.13, respectively. To avoid defects due to lattice mismatch, the lattice constants of the various constituent layers are matched to each other by setting the GaN mole fraction, x, and the InN, y, in each of the layers to meet the condition $x+1.56y$ nearly equals a constant value. In an exemplary embodiment, the constant value is set to nearly 1.01, for example 1.01±0.1, although most embodiments will be in the range 1.01±0.05.

By proper selection of materials, the band gap energy of the n-type second cladding layer 310 and the p-type third cladding layer 320 are larger than that of the 3 pairs of multiple quantum well active layers 315. This confines the injected carriers from the n-type second cladding layer 310 and p-type third cladding layer 320 within the active layer 315, where the carriers recombine to lead to the emission of blue light. In addition, the refractive index of the n-type second cladding layer 310 and the p-type third cladding layer 320 are smaller than that of the multiple quantum well active layer 315, which confines the optical field in the transverse direction.

Because the injected current from the electrode 345 is confined to flow through the window region 335, the region in the active layer 315 under the widow region 335 is activated strongly. This causes the local modal gain in the active layer under the window region to be higher than the local modal gain in the active layer under the $SiO_2$ layer. Therefore, a gain guided waveguide is formed, leading to lasing oscillation in the structure of the seventh embodiment.

Figure 31A:
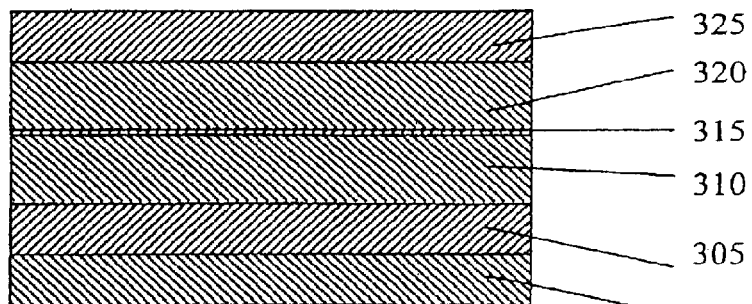
FIG. 31 shows an exemplary series of the fabrication steps for a semiconductor structure in accordance with a seventh embodiment of the invention.

FIGS. 31A–31D show, in sequence, a summary of the fabrication steps necessary to construct an exemplary laser diode according to the seventh embodiment. Since the structure which results from FIGS. 31A–31D will resemble that shown in FIG. 30, like reference numerals will be used for elements whenever possible. With reference first to FIG. 31A, an n-type GaN substrate 300 is provided, on which is grown an n-type GaN first cladding layer 305. The first cladding layer 305 is typically on the order of 0.5 μm thick. Thereafter, an n-type $B_{0.03}Ga_{0.96}Ga_{0.01}N$ second cladding layer 310 is formed, typically on the order of 1.5 μm thick.

Next, a multiple quantum well active layer 315 is formed by creating three quantum wells comprised of three layers of of $B_{0.01}Ga_{0.86}In_{0.13}N$ material each on the order to 35Å thick, together with four barrier layers of $B_{0.01}Ga_{0.90}In0.09N$ material on the order to 35Å thick. A third cladding layer 320 of p-type $B_{0.01}Ga_{0.90}In0.09N$ material on the the order of 1.5 µm thick, is then formed, after which is formed a fourth cladding layer 325 of a p-type GaN on the order of 0.5 µm thick. Each of the layers is typically formed by either the Metal Organic Chemical Vaper Deposition (MOCVD) method or the Molecular Beam Epitaxy (MBE) method.

Figure 31B:
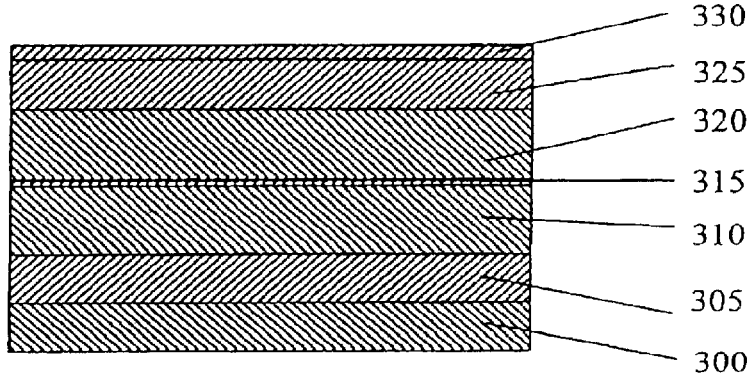
Figure 31C:
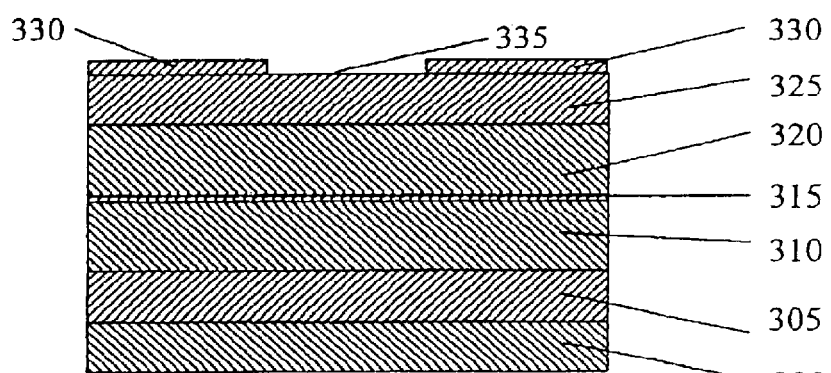
Figure 31D:
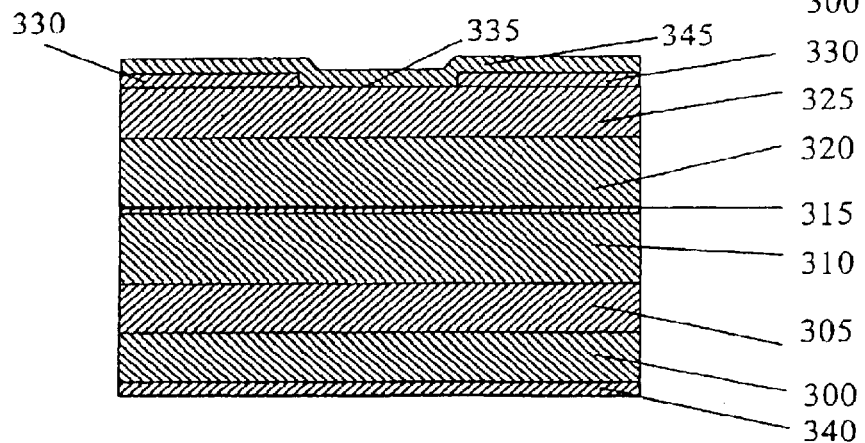

Then, as shown in FIG. 31B, a silicon dioxide ($SiO_2$) layer 330 is formed on the p-type GaN fourth cladding layer 325, for example by the Chemical Vapor Deposition (CVD) method. Using photolithography and etching or any other suitable method, a window region 335 is formed as shown in FIG. 31C. The window region 335 may be stripe-like in at least some embodiments. Finally, as shown in FIG. 31D, a first electrode 340 and a second electrode 345 are formed on the n-type GaN substrate 300 and on the $SiO_2$ layer 330, respectively, by evaporation or any other suitable process.

Figure 32:
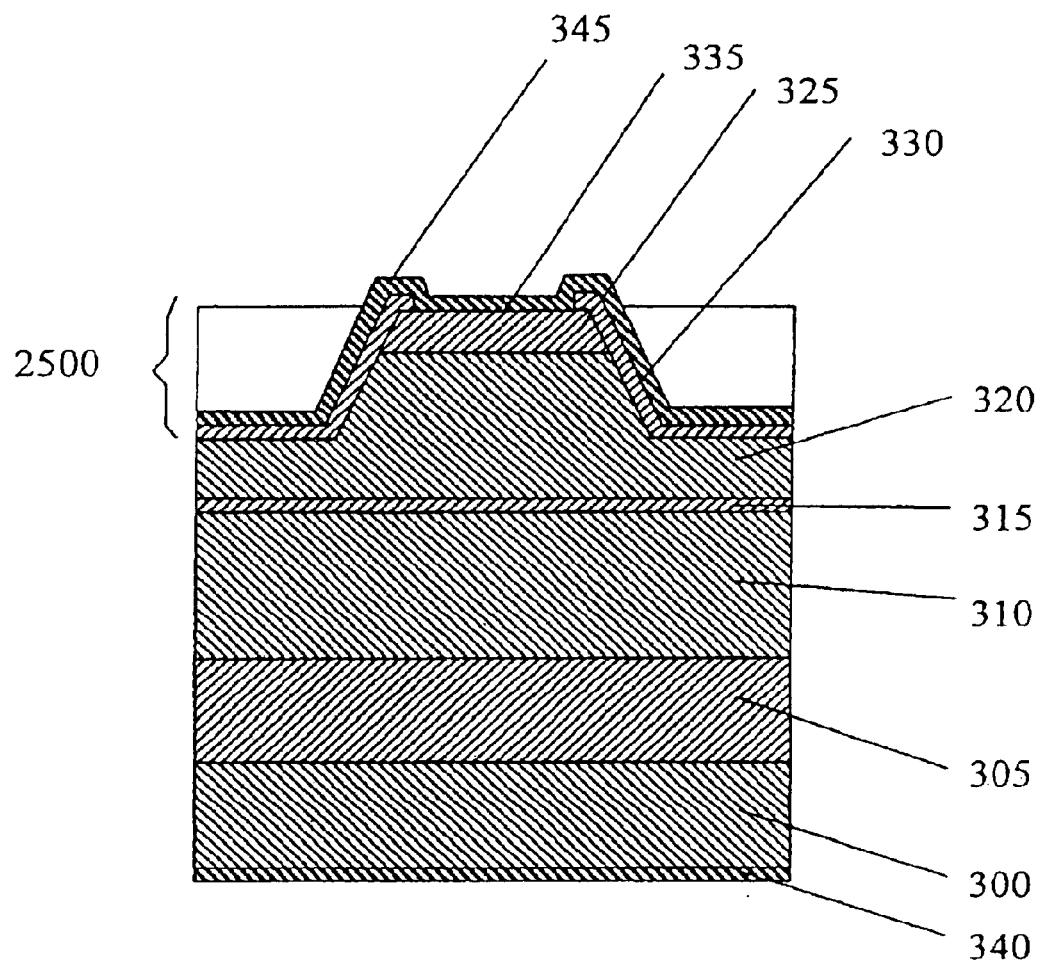
FIG. 32 shows in cross-sectional view a semiconductor structure according to an eighth embodiment.

Referring next to FIG. 32, an eighth embodiment of a semiconductor structure in accordance with the present invention may be better appreciated. As with the seventh embodiment, an exemplary application of the eighth embodiment is the creation of a laser diode. The structure of the eighth embodiment permits a waveguide with a real refractive index guide to be built into the structure. This provides a low threshold current laser diode which can operate with a fundamental transverse mode.

Continuing with reference to FIG. 32, for ease of reference, like elements will be indicated with like reference numerals. On an n-type GaN substrate 300, a first cladding layer 305 is formed of an n-type GaN on the order of 0.5 µm thick. Successively, an n-type second cladding layer 310 is formed of $B_{0.03}Ga_{0.96}In_{0.01}N$ material on the order of 1.5 µm thick. Thereafter, a multiple quantum well active layer 315 is formed comprising three well layers of $B_{0.01}Ga_{0.86}In_{0.13}N$ material on the order of 35Å thick together with four barrier layers of $B_{0.01}Ga_{0.90}In_{0.09}N$ material, also on the order of 35Å thick. Next, a third, p-type cladding layer 320 formed of $B_{0.03}Ga_{0.96}In_{0.01}N$ material on the order of 1.5 µm thick is formed. Thereafter, a p-type GaN fourth cladding layer 325 on the order of 0.05 µm thick is formed over the ridge structure 2500 of the third cladding layer 320. The third and fourth cladding layers are then partially removed to create a ridge structure 2500. A silicon dioxide ($SiO_2$) layer 330 is then formed over the fourth cladding layer 325 as well as the remaining exposed portion of the third cladding layer 320. A window region 335, which may be stripe-like on the order of 2.0 µm width, is formed through the $SiO_2$ layer above the fourth and third cladding layers 325 and 320, respectively. As with the seventh embodiment, a first electrode 340 is formed on the n-type GaN substrate 300 and a second electrode 345 is formed on the $SiO_2$ layer 330 and the window region 335.

As with the seventh embodiment, in order to emit blue light with a wavelength in the range of 400 nm from the active layer 315, the mole fractions of BN, GaN, and AlN in the well layer are set to be 0.01, 0.86, and 0.13, respectively. Likewise, in order to match the lattice constants of each of the constituent layers to avoid defects due to lattice mismatch, the GaN mole fraction, x, and the AlN, y, of all the layers satisfy the condition of x+1.56 y nearly equals a constant value. As in the seventh embodiment, x+1.56 y set to be nearly equals 1.01 so that the equivalent lattice constants of each layers become nearly equal to the lattice constant of GaN. Likewise, the band gap energy of the cladding layers is maintained larger than the band gap energy for the active layer, allowing the emission of ultraviolet light. Similarly the refractive index of the materials is as discussed in connection with the first embodiment, permitting the optical field to be confined in the transverse direction.

Similar to the operation of the fifth embodiment, the region of the active layer 315 under the window region 335 is activated strongly because of the constraints on the injected current by the $SiO_2$ layer. The result, again, is that the local modal gain in the active layer under the window region 335 is higher than the local modal gain in the active layer under the $SiO_2$ layer 330. This, combined with the relatively higher effective refractive index in the transverse direction inside the ridge stripe region compared to that outside the ridge strip region, provides an effective refractive index step ($\Delta$n). This results in a structure which has, built in, a waveguide with a real refractive index guide. Therefore, the design of the sixth embodiment provides a low threshold current laser diode which can operate with a fundamental transverse mode.

Referring next to FIGS. 33A–33E, a summary of the key fabrication steps is shown for an exemplary device of a semiconductor laser diode in accordance with the seventh embodiment.

Figure 33A:
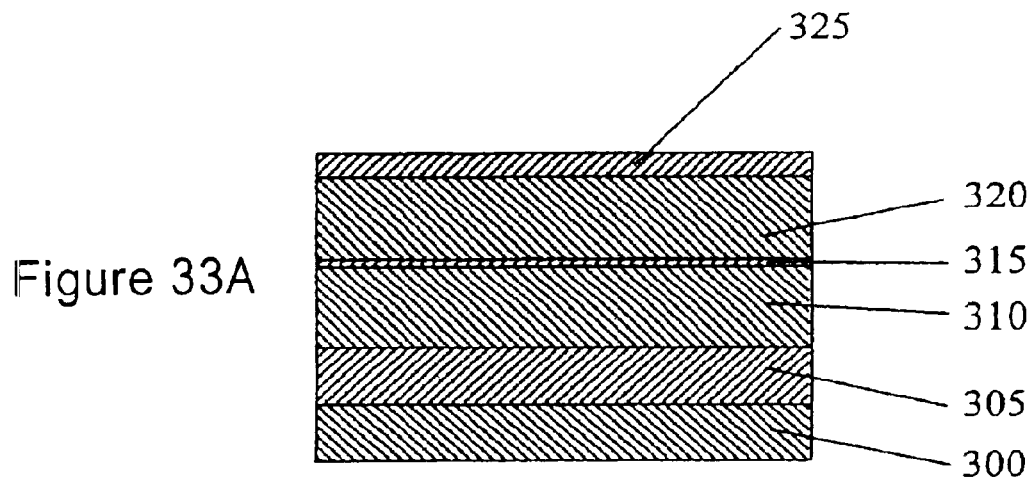
FIG. 33 shows an exemplary series of the fabrication steps for a semiconductor structure in accordance with the eighth embodiment of the invention.
Figure 33B:
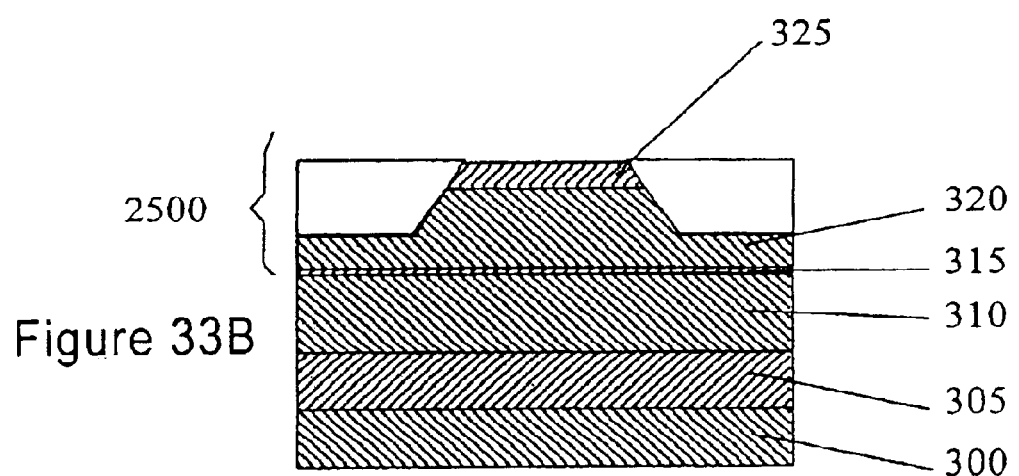

Referring first to FIGS. 33A and 33B, the formation of the first and second cladding layers 305 and 310 on an n-type GaN substrate 300, together with the three-pair multiple quantum well active layer 315 are the same as for the seventh embodiment. Thereafter, the third and fourth cladding layers 320 and 325 are formed and then partially removed—typically by etching—to create a ridge structure 2500. As before, in an exemplary embodiment the various layers are formed successively by either the MOCVD or the MBE method.

Figure 33C:
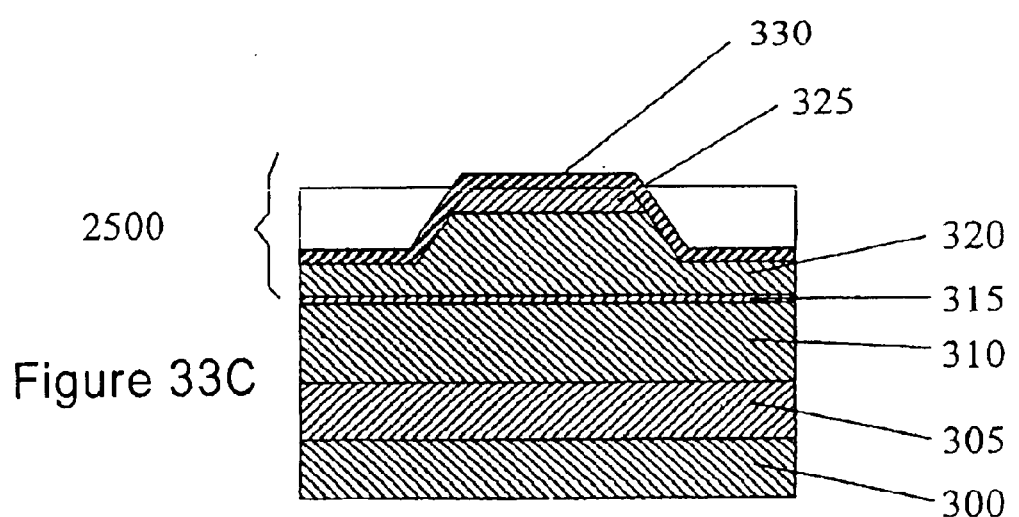
Figure 33D:
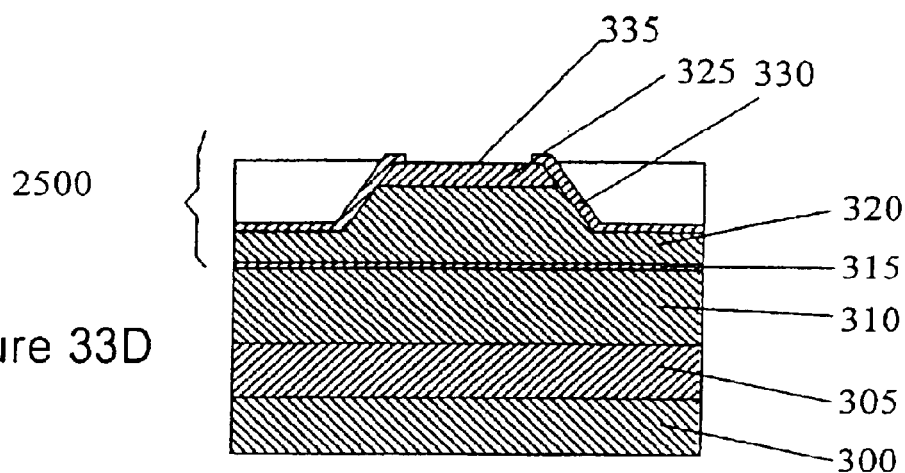
Figure 33E:
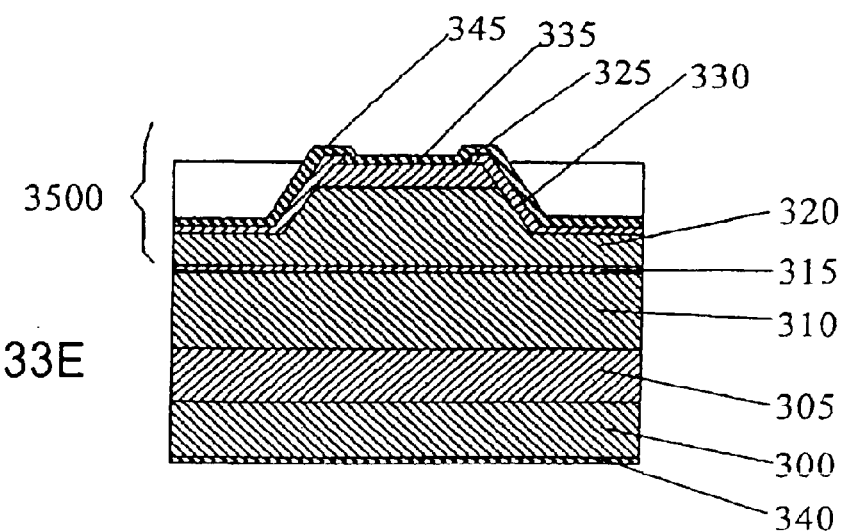

Then, as shown in FIG. 33C–33E, a silicon dioxide layer 330 is formed over the fifth and third cladding layers 325 and 320, respectively, typically by the CVD method, after which a window region 335 is formed as with the fifth embodiment. Electrodes 340 and 345 are then evaporated or otherwise bonded to the structure.

Figure 34:
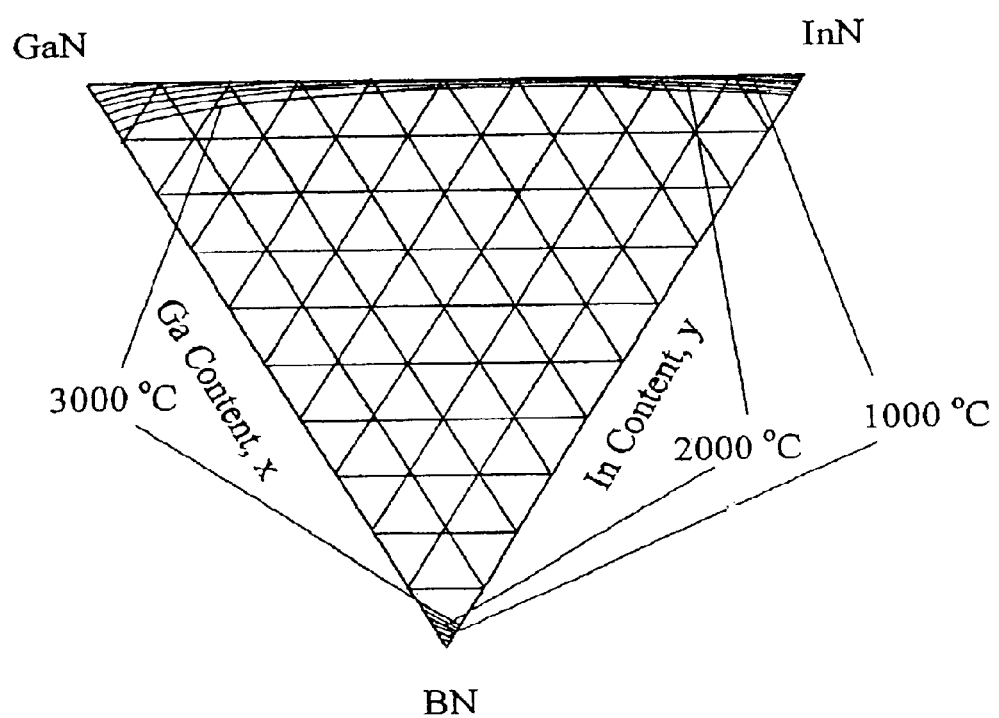
FIG. 34 shows in plot form the boundary between the phase separation region and the region without phase separation at various growth temperatures.

Referring next to FIG. 34, the selection of the GaN mole fraction, x, and the AlN mole fraction, y, and the relationship therebetween for the constituent BGaInN layers, may be better understood. In particular, the relative mole fractions are required to satisfy, approximately, the relationship $0<=x+y<=1$ and $1<=1.03\ x+0.88\ y$, or $0<=x+y<1$ and $1<=0.95\ x+1.01\ y$.

FIG. 34 shows the boundary of phase separation region plotted against various growth temperatures. The lines in FIG. 34 show the boundary between the compositionally unstable (phase separation) region and stable region with respect to various temperatures. The region surrounded with the two boundary lines for the same temperature shows the phase separation content region for each temperature. It has been discovered that the ternary alloys BGaN, BInN, and InGaN have a large phase separation region due to the large lattice mismatch between BN and GaN, between BN and InN, and between InN and GaN. Therefore, the quaternary alloy BGaInN has a wide phase separation region, and also each atomic content of B, Ga, and In should be chosen carefully for the application of the devices.

Figure 35:
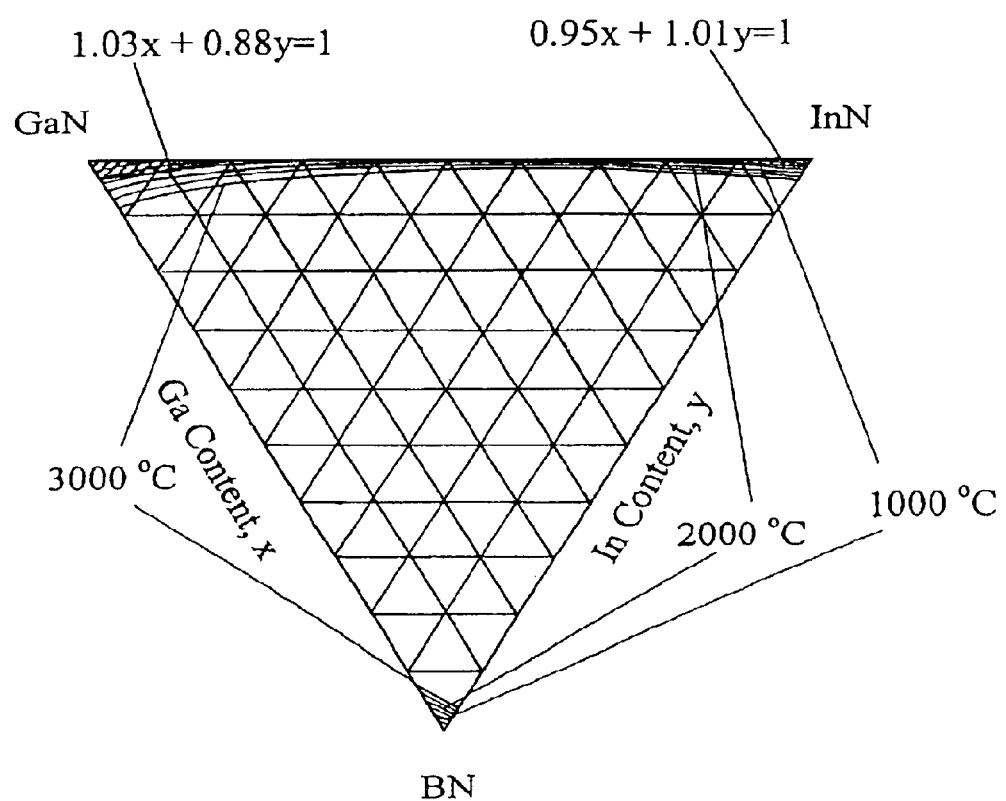
FIG. 35 shows the content choice region of Ga content and In content in BGaInN to avoid phase separation at a growth temperature below approximately 1000° C.

It has been discovered that an BGaInN material system can be provided in which the usual crystal growth temperature is in the approximate range of around 500° C. to around 1000° C. like in the case of InGaAlN. Likewise, it has been discovered that phase separation of the B content, Ga content, and In content of BGaInN does not occur significantly at processing temperatures between on the order of 500° C. and on the order of 1000° C. Finally, by combining the two, the content choice region of Ga content and in content in BGaInN to avoid phase separation at a crystal growth temperature below around 1000° C. is found to be the shadow region in FIG. 35, with the line separating the two regions being approximately defined by the relationship 1.03 x+0.88 y=1 and 0.95 x+1.01 y=1.

Therefore, for each of the two structural embodiments using BGaInN disclosed hereinabove, the phase separation phenomena can be avoided in an BGaInN material system by operating at a crystal growth temperature between on the order of 500° C. and around 1000° C., when the Ga mole fraction, x, and the InN mole fraction, y, of the all constituent layers of the laser diodes are made to satisfy approximately the relationship of 0<=x+y<=1 and 1<=1.03 x+0.88 y, or 0<=x+y<=1 and 1<=0.95 x+1.01 y. The result is the substantially uniform distribution of B atoms, Ga atoms, and In atoms in each constituent layer according to the atomic mole fraction.

Figure 36:
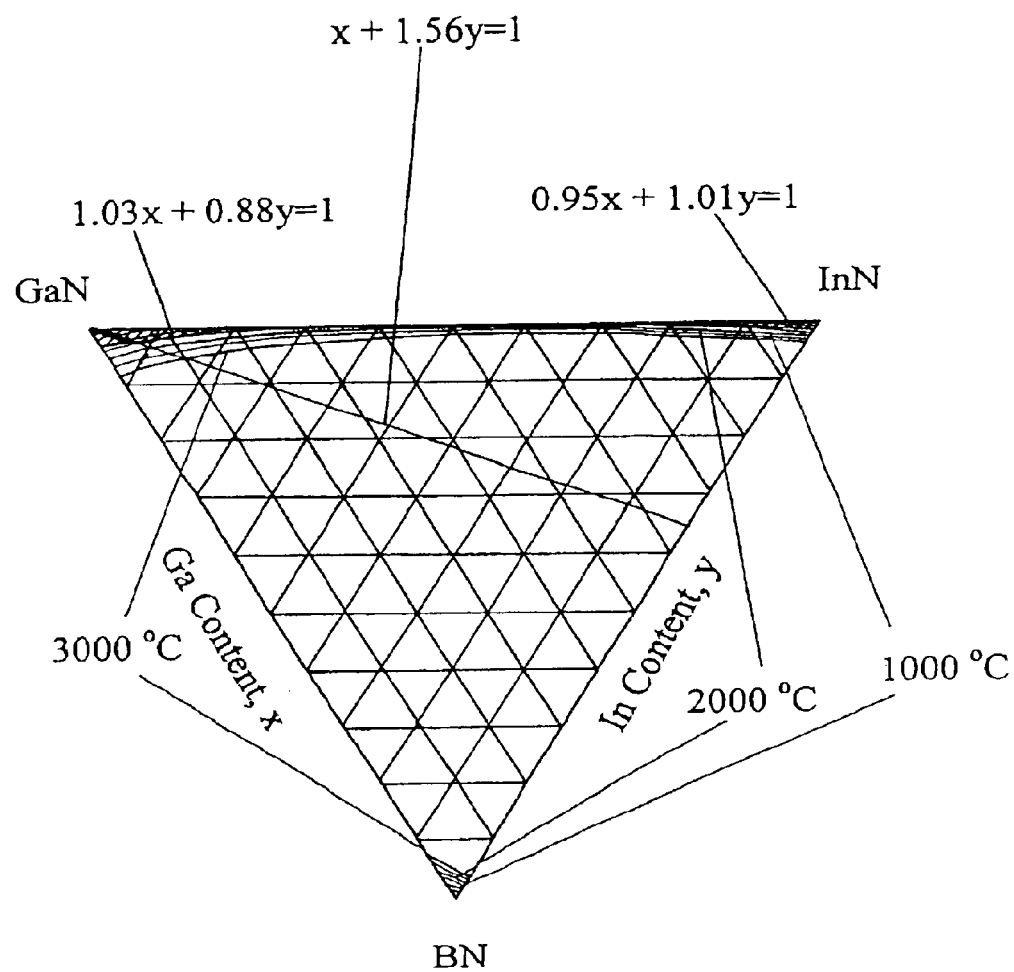
FIG. 36 shows the content choice line of Ga content and In content in BGaInN to avoid phase separation at a growth temperature below approximately 1000° C. which, at the same time, creates a lattice constant of BGaInN substantially equivalent to that of GaN.

FIG. 36 shows the content choice line of Ga content, x, and Al content, y, in an BGaInN system to avoid phase separation phenomenon at growth temperatures below around 1000° C. The line in FIG. 36 shows the exemplary line of x+1.56 y=1.08. Therefore, by ensuring that the Ga content and in content of the constituent BGaAlN layers of a laser diode formed on a GaN substrate have a relationship of x+1.56 y nearly equal to 1.01, 0<=x+y<=1, and 1<=1.03 x+0.88 y, a laser diode on a GaN substrate with low defect density and no or very little phase separation can be obtained. GaN and AlN, are promising for use in electronic devices which can operate under high-power and high-temperature conditions—for example, microwave power FETs by using AlGaN/GaN heterostructures. However, as noted previously hereinabove, the different lattice constants of AlGaN and GaN cause the generate of significant defects, limiting the mobility of electrons in the resultant structure and the utility of such materials systems for FET use.

The present invention also substantially overcomes these limitations, in that the BGaInN/GaN material of the present invention has a lattice constant equal to GaN. As discussed hereinabove, a quaternary materials system of $B_{1-x-y}Ga_xIn_yN$, where the GaN mole fraction (x) and InN mole fraction (y) satisfy the relationships 0<=x+y<=1, 1<=1.03 x+0.88 y, and x+1.56 y=1.01±0.1 not only has a band gap greater than 3.3 eV, but also has a lattice constant substantially equal to GaN. This permits fabrication of semiconductor structures such as FETs which have substantially uniform atomic content distribution in the various layers. Therefore, by using an BGaInN/GaN material system in accordance with the present invention, whose GaN mole fraction, x and AlN mole fraction, y satisfy the above relationships, high-power and high-temperature transistors with low defect density can be realized.

Figure 37A:
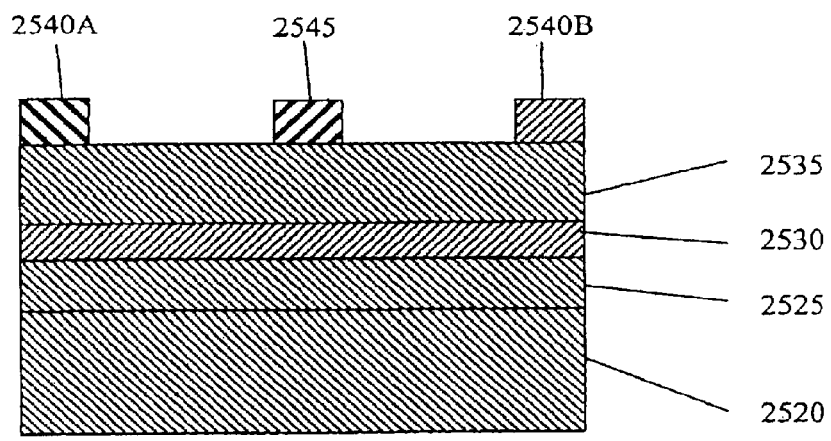
FIGS. 37A and 37B show representations of bipolar and FET transistors constructed in accordance with the materials system of the present invention.

Referring to FIG. 37, there is shown therein an exemplary embodiment of a heterojunction field effect transistors (HFET) using BGaInN/GaN material in accordance with the present invention. On a GaN substrate 2520, a 0.5 μm i-$B_{0.01}Ga_{0.86}In_{0.13}N$ layer 2525 is formed, followed by a thin, approximately 10 nm i-$B_{0.01}Ga_{0.86}In_{0.13}N$ conducting channel layer 2530 and a 10 nm GaN layer 2535. Source and drain electrodes 2540A-B, and gate electrode 2545 are formed in a conventional manner. In the structure, the GaN mole fraction x, and AlN mole fraction, y, of the BGaInN layer are set to be 0.86 and 0.13, respectively. In this case, the value of x and y satisfy the relationship of 0<=x+y<=1, 1<=1.03 x+0.88 y, and x+1.56 y=1.01±0.1. This results in an BGaInN layer substantially without phase separation and with a lattice constant almost equal to GaN, in turn, this permits high electron velocities to be achieved because the two dimensional electron gas formed in the heterointerface of BGaInN and GaN layer is not scattered by any fluctuation in atomic content of the BGaInN layer (such as would be caused in the presence of defects). Moreover, the band gap of the BGaInN is larger than 3.3 eV so that reliable high-temperature operation can be achieved by using the structure shown in FIG. 35A.

Figure 37B:
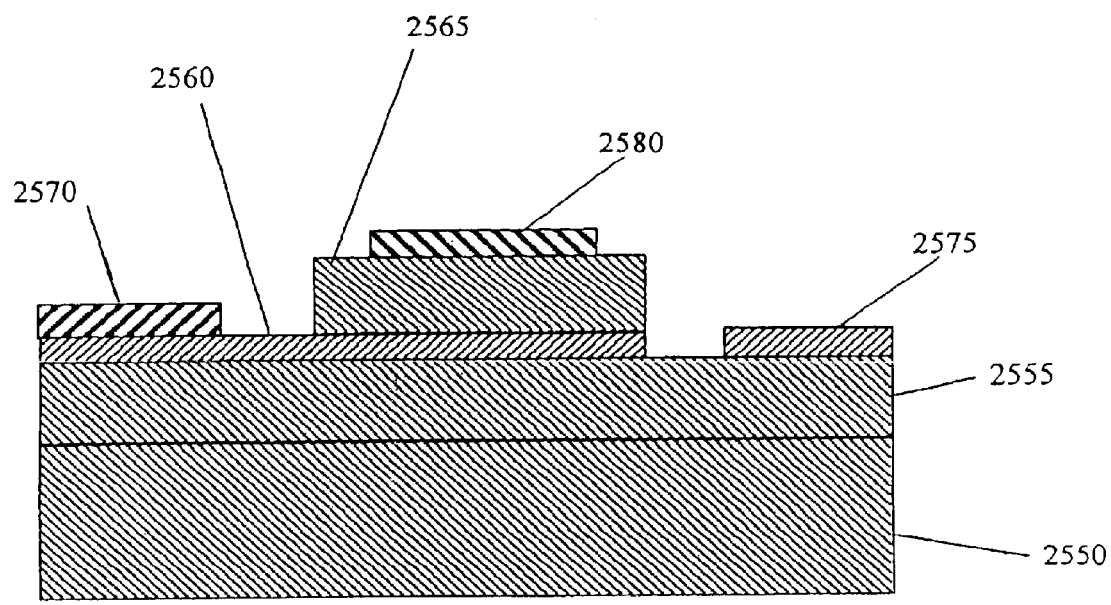

Similarly, FIG. 37B shows an embodiment of a heterojunction bipolar transistors (HBT) in accordance with the present invention. On the GaN substrate 2550, a 400 nm thick n-type GaN collector layer 2555 is formed, followed by a 50 nm thick p-type BGaInN base layer 2560, and a 300 nm thick GaN emitter layer 2565. Base electrode 2570, collector electrode 2575 and emitter electrode 2580 are formed conventionally. As with FIG. 37A, for the exemplary embodiment of FIG. 37B the GaN and AlN mole fractions x and y of the BGaInN layer are set to be 0.86 and 0.13, respectively, and x and y are required to satisfy the same relationships as discussed above. As with FIG. 37A, an BGaInN layer without significant phase separation and with a lattice constant equal to GaN is realized, resulting in a very high quality heterojunction of GBaInN/GaN. In addition, the band gap of the GaN emitter layer (3.5 eV) is larger than that of GBaInN base layer (3.3 ev) so that holes generated in the p-type base layer are well confined in that base layer. This results because of the larger valence band discontinuity between GaN and GBaInN than would occur in a GaN homojunction bipolar transistor. This has the benefit of obtaining a large current amplification of collector current relative to base current. Moreover, as mentioned above, the bandgap of the BGaInN and the GaN layer is large so that the transistor can be used reliably in high-temperature applications.

Figure 38:
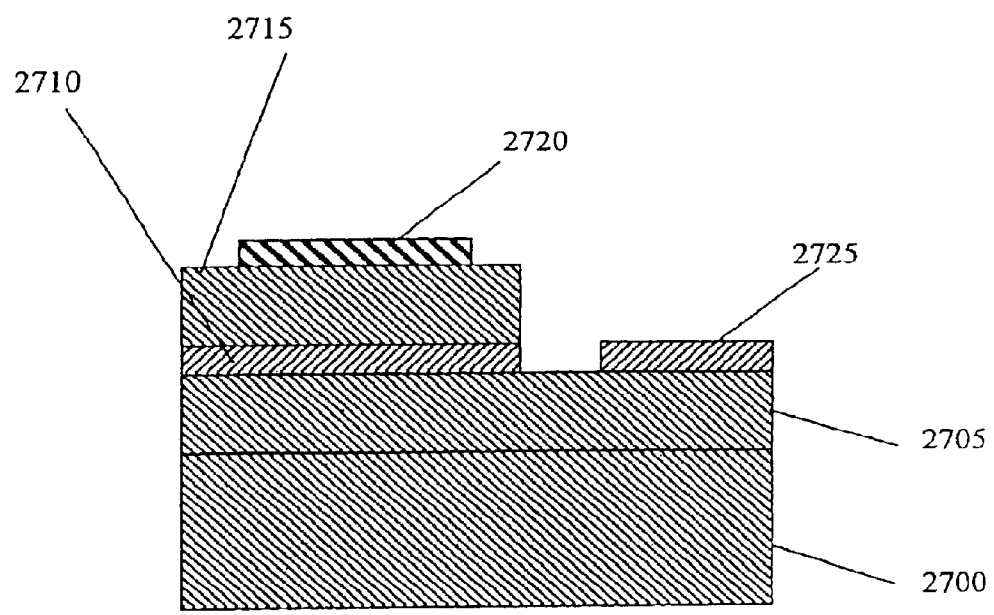
FIG. 38 shows an implementation of the presentation invention as a phototransistor.

Referring next to FIG. 38, there is shown therein an implementation of the present invention as a phototransistor.

$B_{1-x-y}Ga_xIn_yN$ quaternary material whose GaN mole fraction, x and AlN mole fraction, y satisfy the relationship of 0<=x+y<=1, 1<=1.03 x+0.88 y, offers not only a band gap larger than 3.2 eV, but also can be fabricated in layers with equal atomic content distribution, so that BGaInN material also can be used for blue photo detector applications. Moreover, the $B_{1-x-y}Ga_xIn_yN$ quaternary material whose GaN mole fraction, x and AlN mole fraction, y satisfy the relationship of x+1.56 y=1 has a lattice constant equal to GaN. Therefore, by using BGaInN/GaN material whose GaN mole fraction, x and AlN mole fraction, y satisfy the above relationship, blue photo detectors with low defect density can be realized. In the event that detection of other frequencies is desired, for example blue light, only slight modification is required.

As shown in FIG. 38, the semiconductor device of the present invention can be implemented as a heterojunction phototransistors(HPT) using BGaInN/GaN material. On the GaN substrate 2700, an GaN collector layer 2705 is formed on the order of 500 nm thick n-type, followed by the formation of a 200 nm thick p-type BGaInN base layer 2710. Thereafter, an emitter layer 2715 on the order of 500 nm thick is formed. On the emitter layer, a ring shaped electrode 2720 is formed to permit light to impinge on the base layer.

In an exemplary structure, the GaN mole fraction, x and AlN mole fraction, y of the BGaInN layer are set to be 0.86 and 0.13, respectively. In this case, the value of x and y satisfy the relationship of 0<=x+y<=1, 1<=1.03 x+0.88 y, and x+1.56 y=1.06, so that a BGaInN layer can be formed with substantially avoids phase separation while having a lattice constant almost equal to GaN, thus permitting the formation of a high quality heterojunction of BGaInN/GaN. The band gap of the GaN emitter layer (3.5 eV which corresponds to the light wavelength of 380 nm) is larger than that of BGaInN base layer (3.3 eV which corresponds to the light wavelength of 370 nm). The light impinges on the emitter side. For the embodiment shown, impinging light in the wavelength range between 370 nm and 380 nm is transparent to the emitter layer, so that the light in that range is absorbed in the BGaInN base layer and operates electron and hole pairs. The hole generated by the optical absorption in the p-type base layer are well confined in the base layer because the valence band discontinuity between GaN and BGaInN is larger than that for a conventional GaN homojunction photo transistor. This leads to the induction of a larger emitter current, which offers better electronic neutralization in the base region than in the case of the homojunction photo transistor. Therefore, blue photo detectors with high quantum efficiency and high sensitivity, and the resultant high conversion efficiency from input light to collector current, are obtained. In the event that other lower frequencies are to be detected, the BGaInN base layer may be replaced with, for example for blue-green light, InGaN.

Figure 39:
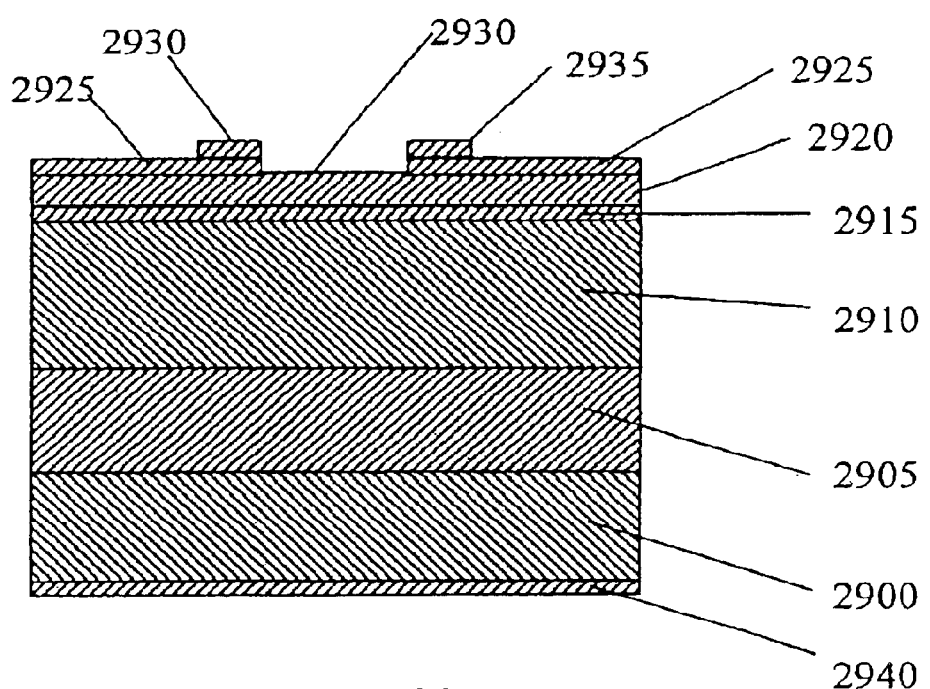
FIG. 39 shows an implementation of the present invention as a photodiode.

In addition to the phototransistor of FIG. 38, it is also possible to implement a photodiode in accordance with the present invention. Referring to FIG. 39, an n-type GaN substrate 1900 is provided, on which is formed an n-type layer 1910 of $B_{1-x-y}Ga_xIn_yN$ quaternary material or equivalent, which conforms to the relationships discussed above in connection with FIG. 38. An active layer 2915 is thereafter formed, and above that is formed a layer 2920 of p-type $B_{1-x-y}Ga_xIn_yN$ quaternary material. Then, a p-type second cladding layer 2925 is formed above the layer 2920, and a window 2930 is formed therein to expose a portion of the layer 2920. The window 2930 provides a port by which light can impinge on the layer 2920, causing the creation of holes. A pair of electrodes 2935 and 2940 may be fabricated in a conventional manner, with the electrode 2935 typically being a ring electrode around the window 2930. It will be appreciated that the band gap of the second cladding layer 2925 is preferably larger than the band gap of the layer 2920, which is in turn preferably larger than the band gap of the active layer 2915; such an approach provides sensitivity to the widest range of wavelength of light. If the event a narrower range is desired, a material with a lower band gap than the layer 2920 may be used for the layer 2925. In addition, it is also not necessary to include the layer 2925 in all embodiments, as the layers 2910, 2915 and 2920 provide, in at least some instances, an adequate photosensitive pn-junction.

Figure 40:
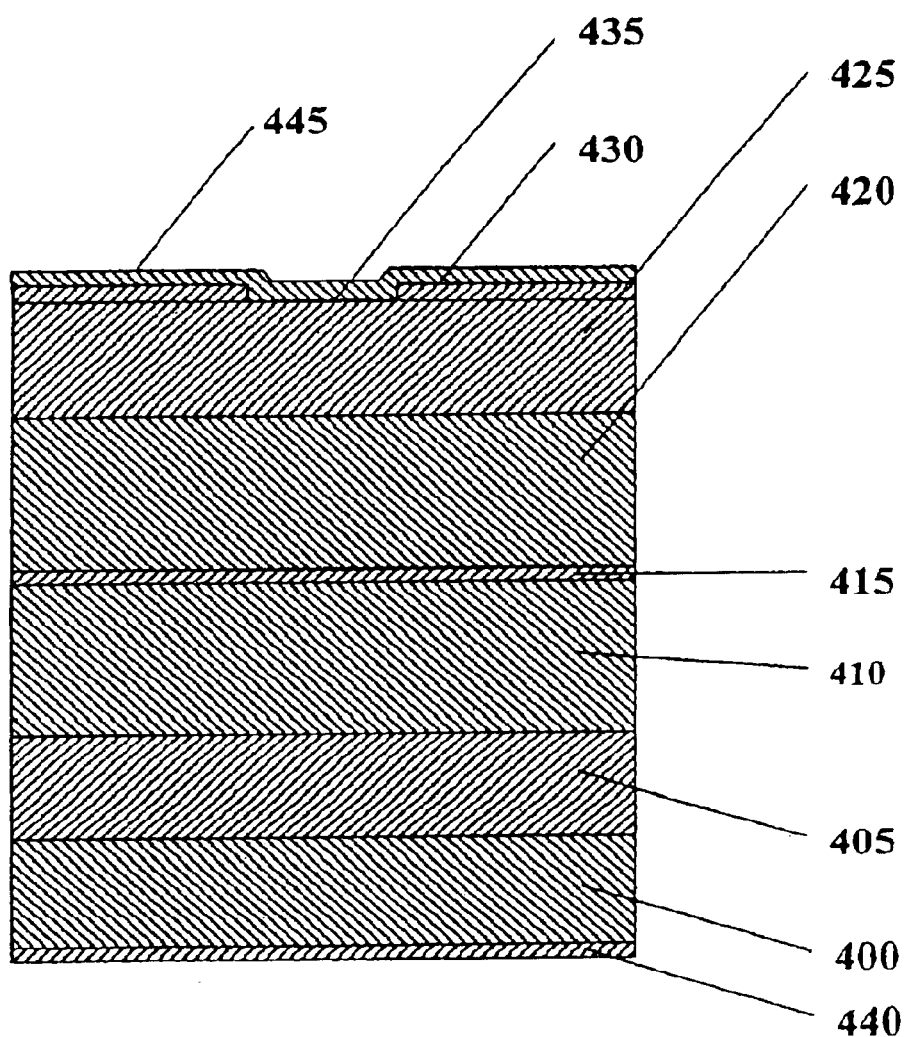
FIG. 40 shows in cross-sectional view a semiconductor structure according to a ninth embodiment of the invention.

Referring next to FIG. 40, a ninth embodiment of the present invention may be better appreciated. The ninth embodiment uses BInAlN quaternary material system to provide an ultra violet light emitting device. Referring to FIG. 40, shown therein in cross-sectional view is a semiconductor structure according to a ninth embodiment of the invention. A diode of the ninth embodiment with particular reference to FIG. 40, an n-type AlN substrate 400 is provided and an n-type AlN first cladding layer 405 (typically 0.5 μm thick) is formed thereon. Thereafter, a second cladding layer 410, typically of an n-type $B_{0.01}In_{0.01}Al_{0.98}N$ material which may be on the order of 1.5 μm thick, is formed thereon, followed by a multiple quantum well active layer 415 which in an exemplary arrangement may comprise three quantum well layers of $B_{0.01}In_{0.08}Al_{0.91}N$ material on the order of 35Å thick together with four barrier layers of $B_{0.02}In_{0.07}Al_{0.91}N$ material on the order of 35Å thick, arranged as three pairs. Next, a third cladding layer 420 of a p-type $B_{0.01}In_{0.01}Al_{0.98}N$ (typically on the order of 1.5 μm thick) is formed, followed by a p-type AlN fifth cladding layer 425 (on the order of 0.5 μm thick). A SiO$_2$ layer 430 having one stripe like window region 435 (3.0 μm width) is formed on the p-type AlN fourth cladding layer 425. A first electrode 440 is formed on the n-type AlN substrate 400, while a second electrode 445 is formed on the SiO$_2$ layer 430 and the window region 435.

In order to emit ultra violet light with a wavelength range of 220 nm from the active layer 415, the BN mole fraction, the InN mole fraction, and the AlN mole fraction of the well layer are set to be 0.01, 0.08, and 0.91, respectively. To avoid defects due to lattice mismatch, the lattice constants of the various constituent layers are matched to each other by setting the InN mole fraction, x, and the AlN, y, in each of the layers to meet the condition 1.75 x+y nearly equals a constant value. In an exemplary embodiment, the constant value is set to nearly 1.03, for example 1.03±0.1, although most embodiments will be in the range 1.03±0.05.

By proper selection of materials, the band gap energy of the n-type second cladding layer 410 and the p-type third cladding layer 420 are larger than that of the 3 pairs of multiple quantum well active layers 415. This confines the injected carriers from the n-type second cladding layer 410 and p-type third cladding layer 420 within the active layer 415, where the carriers recombine to lead to the emission of ultra violet light. In addition, the refractive index of the n-type second cladding layer 410 and the p-type third cladding layer 420 are smaller than that of the multiple quantum well active layer 415, which confines the optical field in the transverse direction.

Because the injected current from the electrode 445 is confined to flow through the window region 435, the region in the active layer 415 under the widow region 435 is activated strongly. This causes the local modal gain in the active layer under the window region to be higher than the local modal gain in the active layer under the SiO$_2$ layer. Therefore, a gain guided waveguide is formed leading to lasing oscillation in the structure of the ninth embodiment.

Figure 41A:
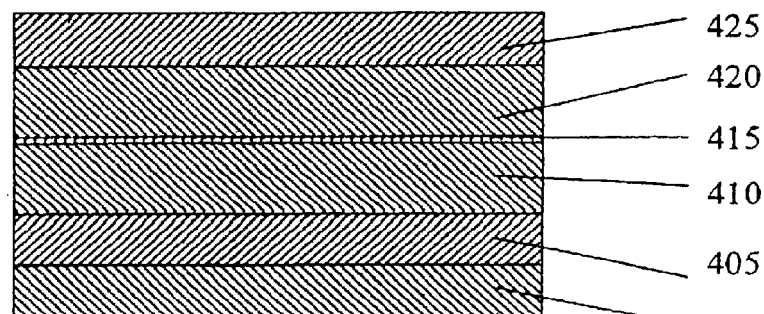
FIG. 41 shows an exemplary series of the fabrication steps for a semiconductor structure in accordance with a ninth embodiment of the invention.

FIGS. 41A–41D show, in sequence, a summary of the fabrication steps necessary to construct an exemplary laser diode according to the ninth embodiment. Since the structure which results from FIGS. 41A–41D will resemble that shown in FIG. 40, like reference numerals will be used for elements whenever possible. With reference first to FIG. 41A, an n-type AlN substrate 400 is provided, on which is grown an n-type AlN first cladding layer 405. The first cladding layer 405 is typically on the order of 0.5 μm thick. Thereafter, an n-type $B_{0.01}In_{0.01}Al_{0.98}N$ second cladding layer 410 is formed, typically on the order of 1.5 μm thick.

Next, a multiple quantum well active layer 415 is formed by creating three quantum wells comprised of three layers of of $B_{0.01}In_{0.08}Al_{0.91}N$ material each on the order of 35Å thick, together with four barrier layers of $B_{0.02}In_{0.07}Al_{0.91}N$ material on the order of 35Å thick. A third cladding layer 420 of p-type $B_{0.01}In_{0.01}Al_{0.98}N$ material, on the order of 1.5 μm thick, is then formed, after which is formed a fourth cladding layer 425 of a p-type AlN on the order of 0.5 μm thick. Each of the layers is typically formed by either the Metal Organic Chemical Vapor Deposition (MOCVD) method or the Molecular Beam Epitaxy (MBE) method.

Figure 41B:
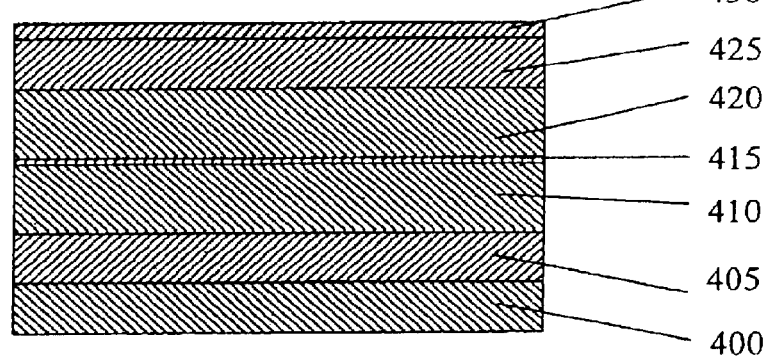
Figure 41C:
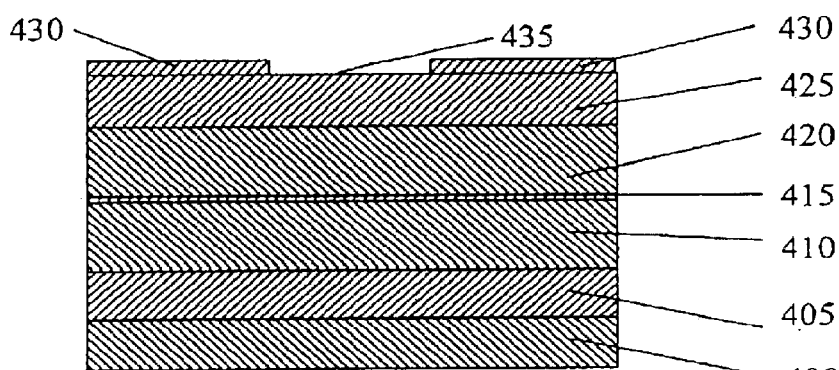
Figure 41D:
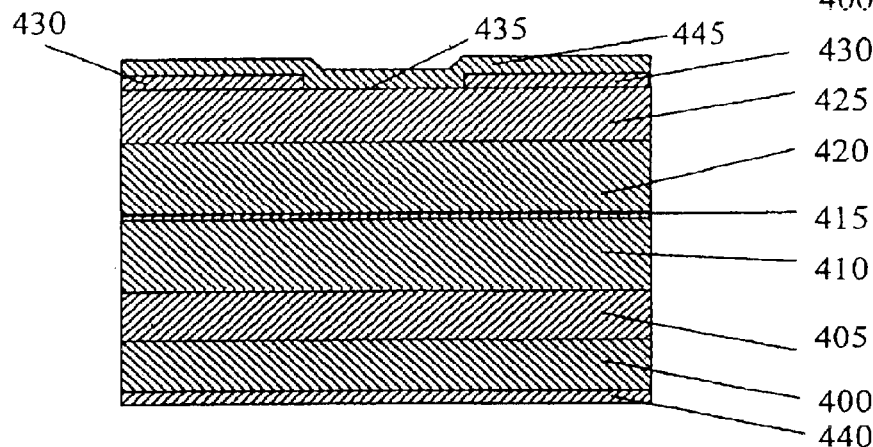

Then, as shown in FIG. 41B, a silicon dioxide ($SiO_2$) layer 430 is formed on the p-type AlN fourth cladding layer 425, for example by the Chemical Vapor Deposition (CVD) method. Using photolithography and etching or any other suitable method, a window region 435 is formed as shown in FIG. 41C. The window region 435 may be stripe-like in at least some embodiments. Finally, as shown in FIG. 41D, a first electrode 440 and a second electrode 445 are formed on the n-type AlN substrate 400 and on the $SiO_2$ layer 430, respectively, by evaporation or any other suitable process.

Figure 42:
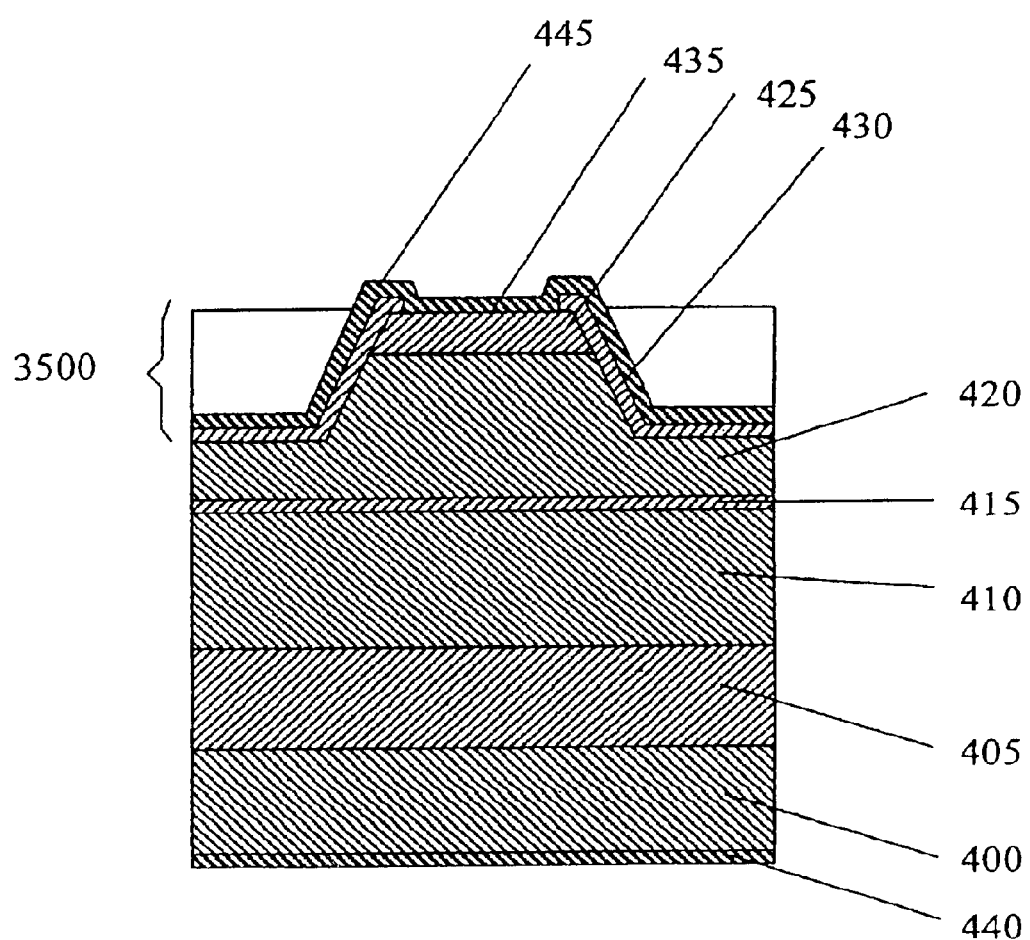
FIG. 42 shows in cross-sectional view a semiconductor structure according to a tenth embodiment.

Referring next to FIG. 42, a tenth embodiment of a semiconductor structure in accordance with the present invention may be better appreciated. As with the ninth embodiment, an exemplary application of the tenth embodiment is the creation of a laser diode. The structure of the tenth embodiment permits a waveguide with a real refractive index guide to be built into the structure. This provides a low threshold current laser diode which can operate with a fundamental transverse mode.

Continuing with reference to FIG. 42, for ease of reference, like elements will be indicated with like reference numerals. On an n-type AlN substrate 400, a first cladding layer 405 is formed of an n-type AlN on the order of 0.5 $\mu$m thick. Successively, an n-type second cladding layer 410 is formed of $B_{0.01}In_{0.01}Al_{0.98}N$ material on the order of 1.5 $\mu$m thick. Thereafter, a multiple quantum well active layer 415 is formed comprising three well layers of $B_{0.01}In_{0.08}Al_{0.91}N$ material on the order of 35Å thick together with four barrier layers of $B_{0.02}In_{0.07}Al_{0.91}N$ material, also on the order of 35Å thick. Next, a third, p-type cladding layer 420 formed of $B_{0.01}In_{0.01}Al_{0.98}N$ material on the order of 1.5 $\mu$m thick is formed. Thereafter, a p-type AlN fourth cladding layer 425 on the order of 0.5 $\mu$m thick is formed over the ridge structure 3500 of the third cladding layer 420. The third and fourth cladding layers are then partially removed to create a ridge structure 3500. A silicon dioxide ($SiO_2$) layer 430 is then formed over the fourth cladding layer 425 as well as the remaining exposed portion of the third cladding layer 420. A window region 435, which may be stripe-like on the order of 2.0 $\mu$m width, is formed through the $SiO_2$ layer above the fourth and third cladding layers 425 and 420, respectively. As with the ninth embodiment, a first electrode 440 is formed on the n-type AlN substrate 400 and a second electrode 445 is formed on the $SiO_2$ layer 430 and the window region 435.

A with the ninth embodiment, in order to emit ultra violet light with a wavelength in the range of 220 nm from the active layer 415, the mole fractions of BN, InN, and AlN in the well layer are set to be 0.01, 0.08, and 0.91, respectively. Likewise, in order to match the lattice constants of each of the constituent layers to avoid defects due to lattice mismatch, the InN mole fraction, x, and the AlN, y, of all the layers satisfy the condition of 1.75 x+y nearly equals a constant value. As in the eighth embodiment, 1.75 x+y set to be nearly equals 1.03 so that the equivalent lattice constant of each layers become nearly equal to the lattice constant of AlN. Likewise, the band gap energy of the cladding layers is maintained larger than the band gap energy for the active layer, allowing the emission of ultraviolet light. Similarly the refractive index of the materials is as discussed in connection with the eighth embodiment, permitting the optical field to be confined in the transverse direction.

Similar to the operation of the ninth embodiment, the region of the active layer 415 under the window region 435 is activated strongly because of the constraints on the injected current by the $SiO_2$ layer. The result, again, is that the local modal gain in the active layer under the window region 435 is higher than the local modal gain in the active layer under the $SiO_2$ layer 430. This, combined with the relatively higher effective refractive index in the transverse direction inside the ridge stripe region compared to that outside the ridge stripe region, provides an effective refractive index step ($\Delta$n). This results in a structure which has, built in, a waveguide formed by a real refractive index guide. Therefore, the design of the tenth embodiment provides a low threshold current laser diode which can operate with a fundamental transverse mode.

Referring next to FIGS. 43A–43E, a summary of the key fabrication steps is shown for an exemplary device of a semiconductor laser diode in accordance with the tenth embodiment.

Figure 43A:
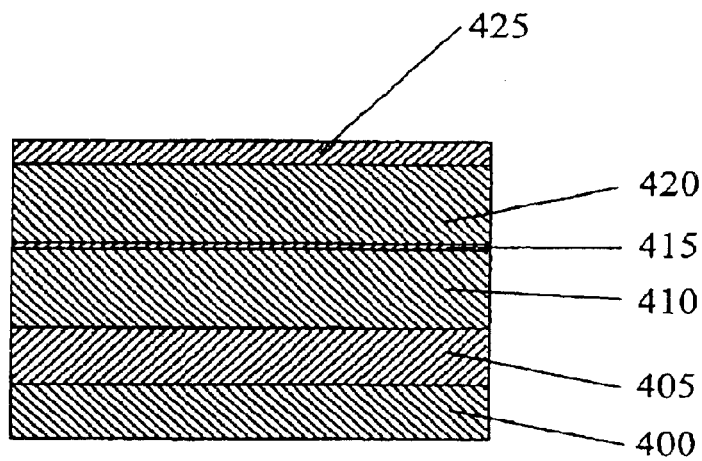
FIG. 43 shows an exemplary series of the fabrication steps for a semiconductor structure in accordance with the tenth embodiment of the invention.
Figure 43B:
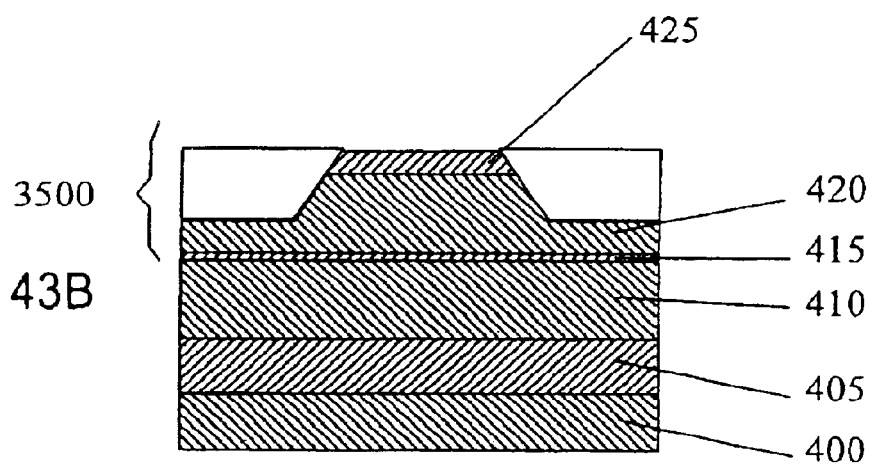

Referring first to FIGS. 43A and 43B, the formation of the first and second cladding layers 405 and 410 on an n-type AlN substrate 400, together with the three-pair multiple quantum well active layer 415 are the same as for the eighth embodiment. Thereafter, the third and fourth cladding layers 420 and 425 are formed and then partially removed—typically by etching—to create a ridge structure 3500. As before, in an exemplary embodiment the various layers are formed successively by either the MOCVD or the MBE method.

Figure 43C:
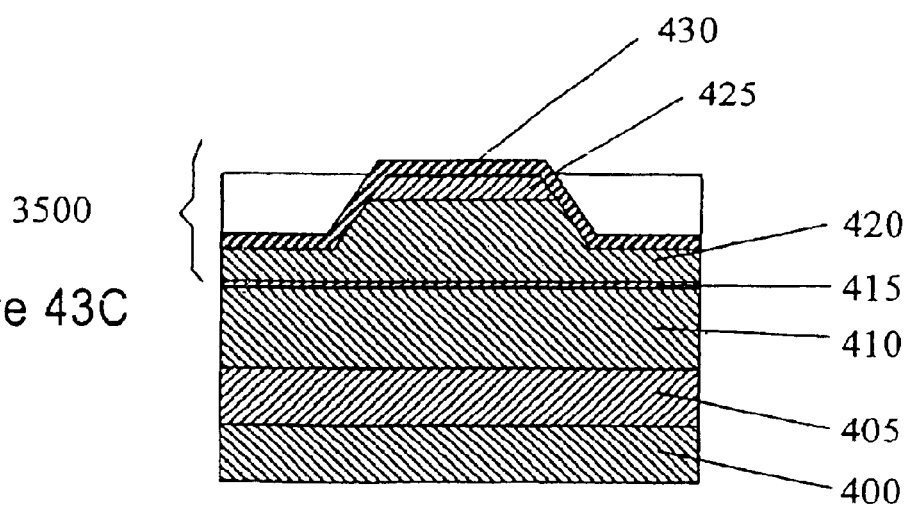
Figure 43D:
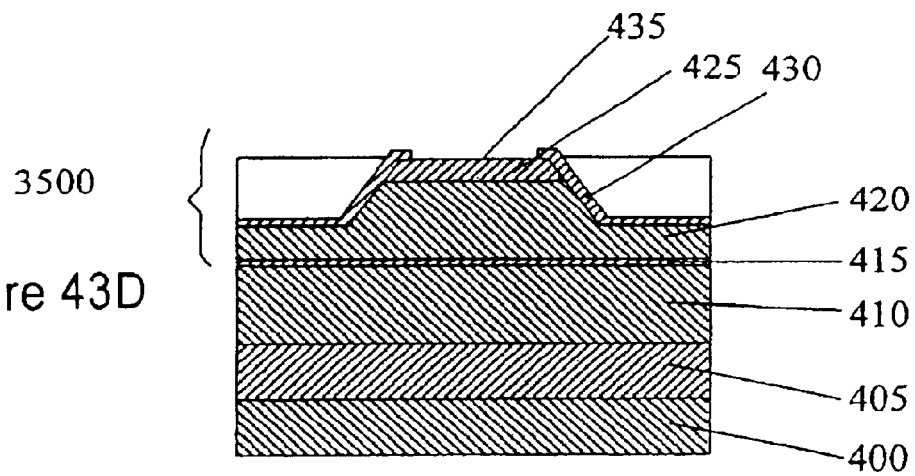
Figure 43E:
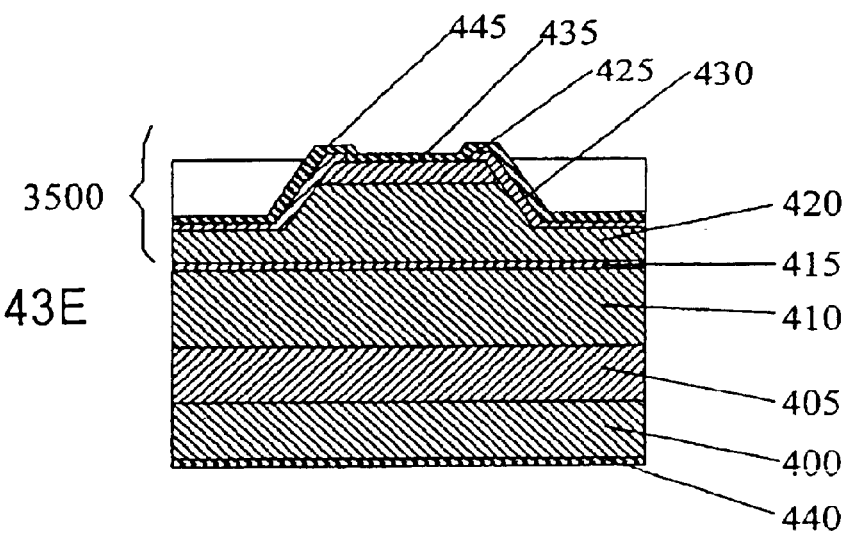

Then, as shown in FIG. 43C–43E, a silicon dioxide layer 430 is formed over the fifth and third cladding layers 425 and 420, respectively, typically by the CVD method, after which a window region 435 is formed as with the ninth embodiment. Electrodes 440 and 445 are then evaporated or otherwise bonded to the structure.

Figure 44:
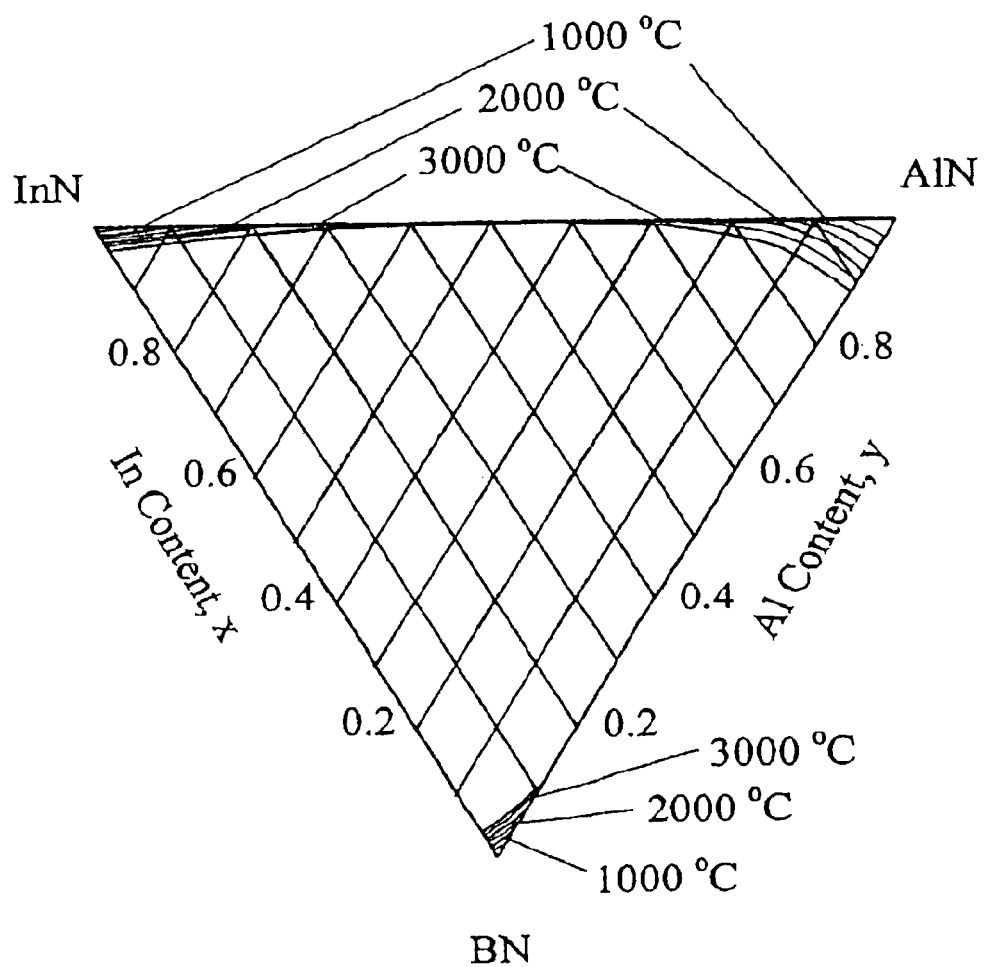
FIG. 44 shows in plot form the boundary between the phase separation region and the region without phase separation at various growth temperatures.

Referring next to FIG. 44, the selection of the InN mole fraction, x, and the AlN mole fraction, y, and the relationship therebetween for the constituent BInAlN layers, may be better understood. In particular, the relative mole fractions are required to satisfy, approximately, the relationship 0<=x+y<=1 and 1<=1.01 x+0.88 y, or 0<=x+y<=1 and 1<=0.61 x+1.04 y.

Figure 45:
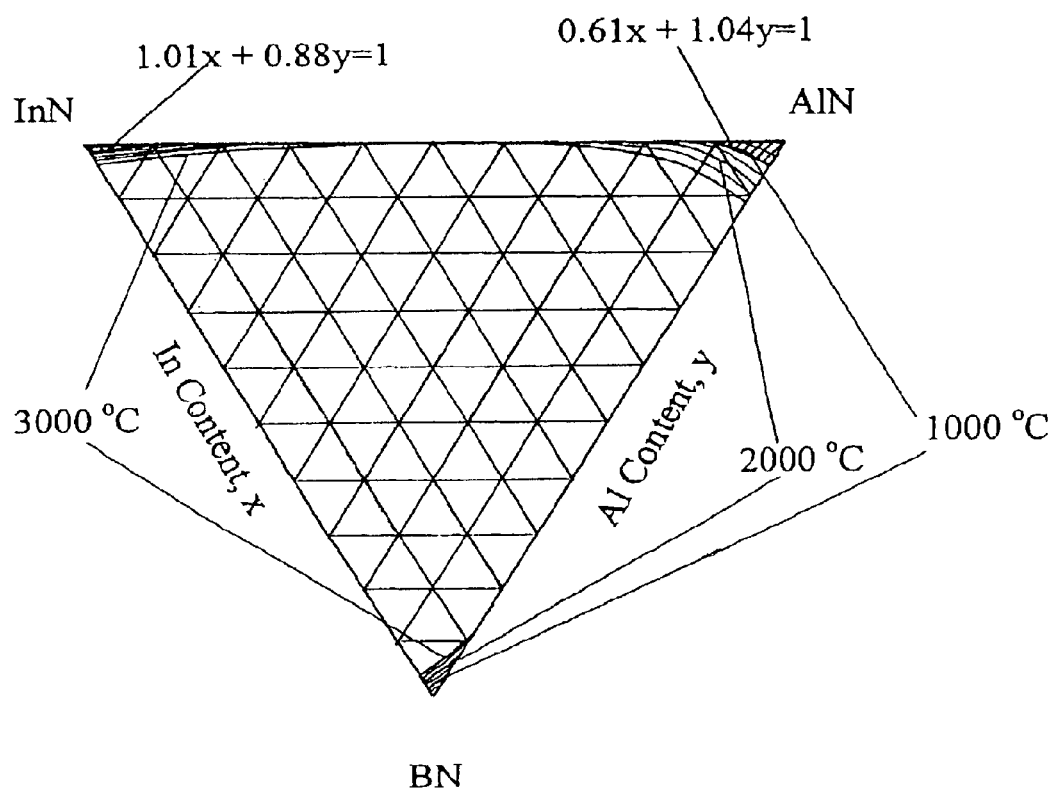
FIG. 45 shows the content choice region of In content and Al content in BInAlN to avoid phase separation at a growth temperature below approximately 1000° C.

FIG. 45 shows the boundary of phase separation region plotted against various growth temperatures. The lines in FIG. 45 show the boundary between the compositionally unstable (phase separation) region and stable region with respect to various temperatures. The region surrounded with the two boundary lines for the same temperature shows the phase separation content region for the each temperature. It has been discovered that the ternary alloys BAlN, BInN, and InAlN have a large phase separation region due to the large lattice mismatch between BN and AlN, between BN and InN, and between InN and AlN. Therefore, the quaternary alloy BInAlN has a wide phase separation region, and also each atomic content of B, Al, and In should be chosen carefully for the application of the devices.

It has been discovered that an BInAlN material system can be provided in which the usual crystal growth temperature is in the approximate range of around 500° C. to around 1000° C. like in the case of InGaAlN. Likewise, it has been discovered that phase separation of the B content, Al content, and in content of BInAlN does not occur significantly at processing temperatures between on the order of 500° C. and on the order of 1000° C. Finally, by combining the two, the content choice region of Al content and In content in BInAlN to avoid phase separation at a crystal growth temperature below around 100° C. is found to be the shadow region in FIG. 45, with the line separating the two regions being approximately defined by the relationship 1.01 x+0.88 y=1 and 0.61 x+1.04 y=1.

Therefore, for each of the two structural embodiments using BInAlN disclosed hereinabove, the phase separation phenomena can be avoided in an BInAlN material system by operating at a crystal growth temperature between on the order of 500° C. and around 1000° C., when the In mole fraction, x, and the AlN mole fraction, y, of the all constituent layers of the laser diodes are made to satisfy approximately the relationship of $0<=x+y<=1$ and $1<=1.01\ x+0.88\ y$, or $0<=x+y<=1$ and $1<=0.61\ x+1.04\ y$. The result is the substantially uniform distribution of B atoms, Al atoms, and in atoms in each constituent layer according to the atomic mole fraction.

Figure 46:
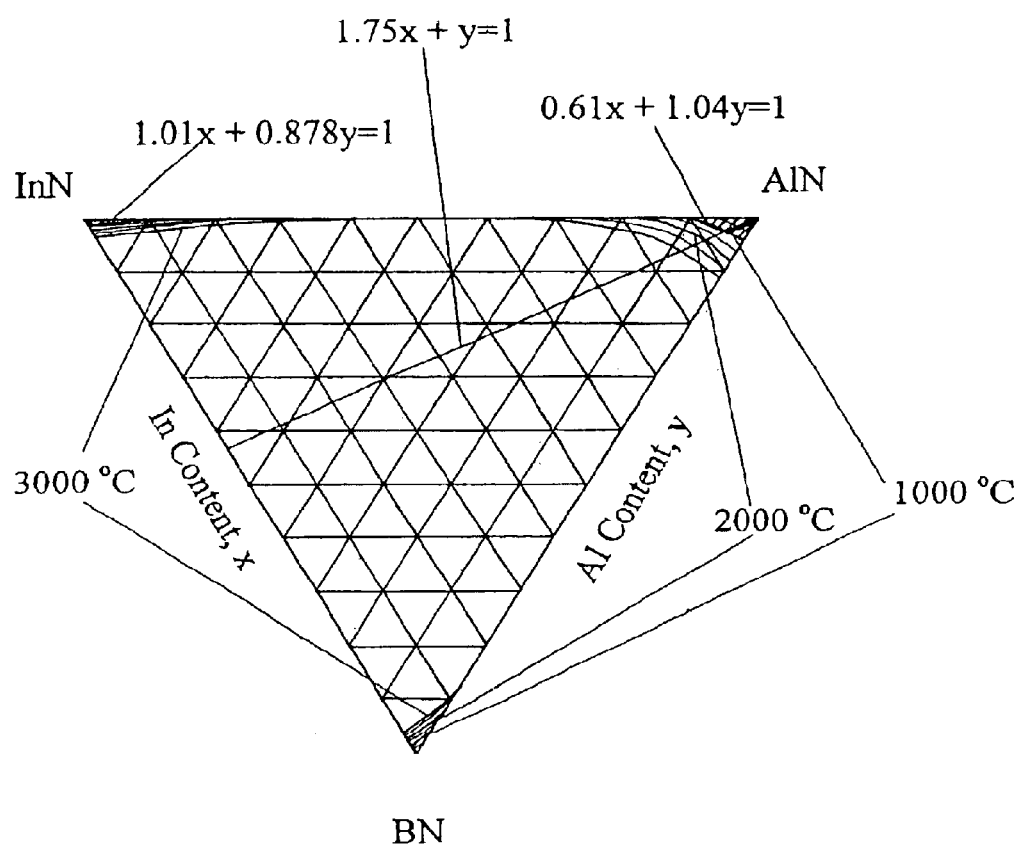
FIG. 46 shows the content choice line of In content and Ga content in BInAlN to avoid phase separation at a growth temperature below approximately 1000° C. which, at the same time, creates a lattice constant of BGaInN substantially equivalent to that of AlN.

FIG. 46 shows the content choice line of In content, x, and Al content, y, in an BInAlN system to avoid phase separation phenomenon at growth temperatures below around 1000° C. The line i FIG. 46 shows the exemplary line of $1.75\ x+y=1.03$. Therefore, by ensuring that the Al content and In content of the constituent BInAlN layers of a laser diode formed on a AlN substrate have a relationship of $1.75\ x+y$ nearly equal to $1.03$, $0<=x+y<=1$, and $1<=0.61\ x+1.04\ y$, a laser diode on a AlN substrate with low defect density and no or very little phase separation can be obtained.

In addition, other semiconductor structures can also be fabricated with BInAlN materials system. As discussed above, Group-III nitride materials, especially GaN and AlN, are promising for use in electronic devices which can operate under high-power and high-temperature conditions—for example, microwave power FETs by using AlGaN/GaN heterostructures. However, as noted previously hereinabove, the different lattice constants of AlGaN and GaN cause the generation of significant defects, limiting the mobility of electrons in the resultant structure and the utility of such materials systems for FET use.

The present invention also substantially overcomes these limitations, in that the BInAlN/AlN material of the present invention has a lattice constant equal to AlN. As discussed hereinabove, a quaternary materials system of $B_{1-x-y}In_xAl_yN$, where the InN mole fraction (x) and AlN mole fraction (y) satisfy the relationships $0<=x+y<=1$, $1<=0.61\ x+1.04\ y$, and $1.75\ +y=1.03\pm 0.1$ not only has a band gap greater than 5 eV, but also has a lattice constant substantially nearly equal to AlN. This permits fabrication of semiconductor structures such as FETs which have substantially uniform atomic content distribution in the various layers. Therefore, by using an BInAlN/AlN material system in accordance with the present invention, whose InN mole fraction, x and AlN mole fraction, y satisfy the above relationships, high-power and high-temperature transistors with low defect density can be realized.

Figure 47A:
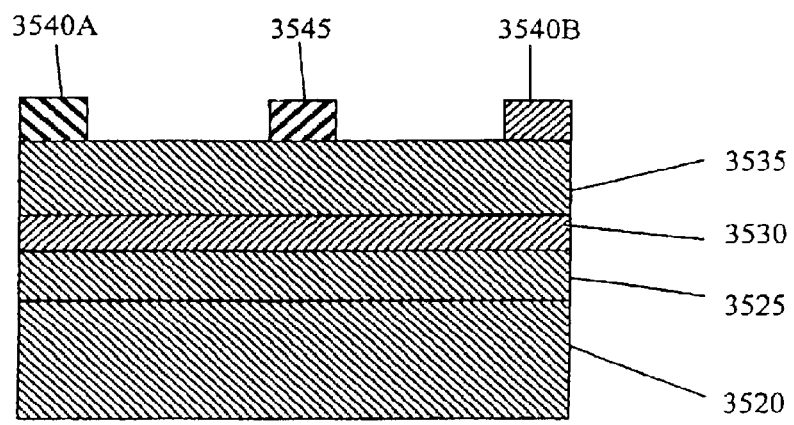
FIGS. 47A and 47B show representations of bipolar and FET transistors constructed in accordance with the materials system of the present invention.

Referring to FIG. 47, there is shown therein an exemplary embodiment of a heterojunction field effect transistor (HFET) using BInAlN/AlN material in accordance with the present invention. On an AlN substrate 3520, a 0.5 μm i-$B_{0.01}In_{0.08}Al_{0.91}N$ layer 3525 is formed, followed by a thin, approximately 10 nm $B_{0.01}In_{0.08}Al_{0.91}N$ conducting channel layer 3530 and a 10 nm AlN layer 3535. Source and drain electrodes 3540A-B, and gate electrode 3545 are formed in a conventional manner. In the structure, the InN mole fraction, x, and AlN mole fraction, y, of the BInAlN layer are set to be 0.08 and 0.91, respectively. In this case, the value of x and y satisfy the relationship of $0<=x+y<=1$, $1<=0.61\ x+1.04\ y$, and $1.75\ x+y=1.03\pm 0.1$. This results in an BInAlN layer substantially without phase separation and with a lattice constant almost equal to AlN. In turn, this permits high electron velocities to be achieved because the two dimensional electron gas formed in the heterointerface of BinAlN and AlN layer is not scattered by any fluctuation in atomic content of the BinAlN layer (such as would be caused in the presence of defects). Moreover, the band gap of the BGaInN is larger than 5 eV so that reliable high-temperature operation can be achieved by using the structure shown in FIG. 47A.

Figure 47B:
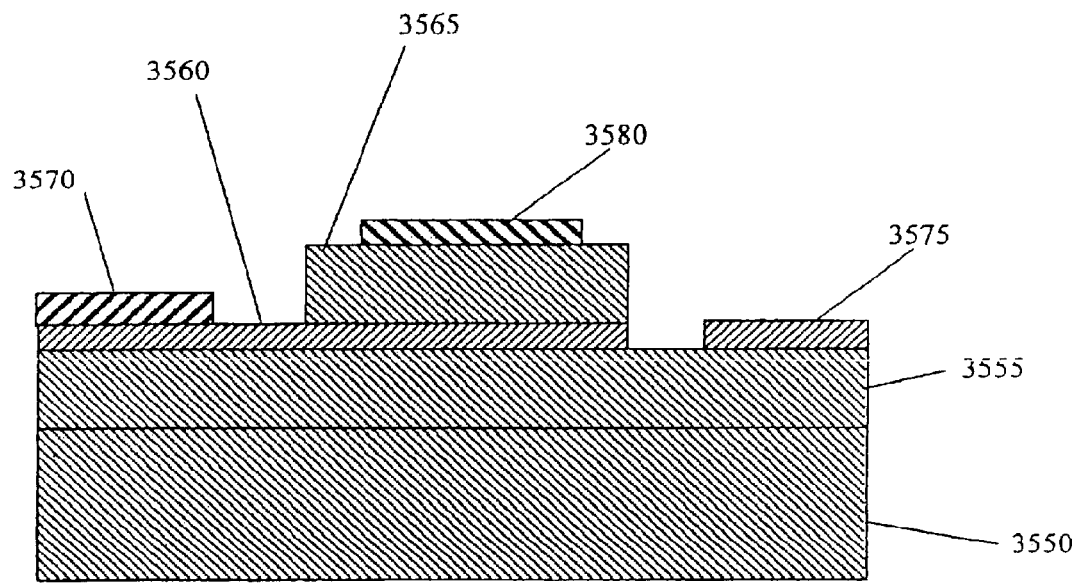

Similarly, FIG. 47B shows an embodiment of a heterojunction bipolar transistor(HBT) in accordance with the present invention. On the AlN substrate 3550, a 400 nm thick n-type AlN collector layer 3555 is formed, followed by a 50 mm thick p-type BInAlN base layer 3560, and a 300 nm thick AlN emitter layer 3565. Base electrode 3570, collector electrode 3575 and emitter electrode 3580 are formed conventionally. As with FIG. 47A, for the exemplary embodiment of FIG. 47B the InN and AlN mole fractions x and y of the BInAlN layer are set to be 0.08 and 0.91, respectively, and x and y are required to satisfy the same relationships as discussed above. As with FIG. 47A, an BInAlN layer without significant phase separation and with a lattice constant equal to AlN is realized, resulting in a very high quality heterojunction of BInAlN/AlN. In addition, the band gap of the AlN emitter layer (6.2 eV) is larger than that of BInAlN base layer (5.8 eV) so that holes generated in the p-type base layer are well confined in that base layer. This results because of the larger valence band discontinuity between AlN and BInAlN than would occur in a AlN homojunction bipolar transistor. This has the benefit of obtaining a large current amplification of collector current relative to base current. Moreover, as mentioned above, the bandgap of the BInAlN and the AlN layer is large so that the transistor can be used reliably in high-temperature applications.

Figure 48:
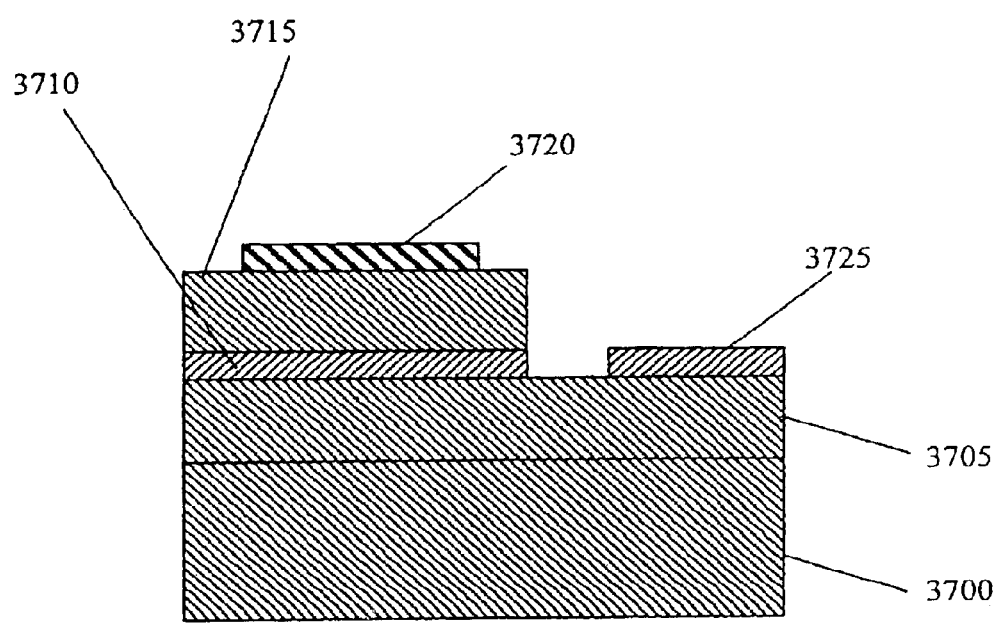
FIG. 48 shows an implementation of the present invention as a phototransistor.

Referring next to FIG. 48, there is shown there an implementation of the present invention as a phototransistor.

$B_{1-x-y}In_xAl_yN$ quaternary material whose InN mole fraction, x and AlN mole fraction, y satisfy the relationship of $0<=x+y<=1$, $1<=0.61\ x+1.04\ y$, offers not only a band gap larger than 5 eV, but also can be fabricated in layers with equal atomic content distribution, so that BInAlN material also can be used for blue photo detector applications. Moreover, the $B_{1-x-y}In_xAl_yN$ quaternary material whose InN mole fraction, x and AlN mole fraction, y satisfy the relationship of $1.75\ x+y1.03$ has a lattice constant nearly equal to AlN. Therefore, by using BInAlN/AlN material whose InN mole fraction, x and AlN mole fraction, y satisfy the above relationship, ultra violet photo detectors with low defect density can be realized. In the event that detection of other frequencies is desired, for example blue light, only slight modification is required.

As shown in FIG. 48, the semiconductor device of the present invention can be implemented as a heterojunction phototransistor(HPT) using BInAlN/AlN material. On the AlN substrate 3700, an AlN collector layer 3705 is formed on the order of 500 nm thick n-type, followed by the formation of a 200 nm thick p-type BInAlN base layer 3710. Thereafter, an emitter layer 3715 on the order of 500 nm thick is formed. On the emitter layer, a ring shaped electrode 3720 is formed to permit light to impinge on the base layer.

In an exemplary structure, the InN mole fraction, x, and AlN mole fraction, y, of the BInAlN layer are set to be 0.08 and 0.91, respectively. In this case, the value of x and y satisfy the relationship of $0<=x+y<=1$, $1<=0.61\ x+1.04\ y$, and $1.75\ x+y=1.03\pm 0.05$ so that a BInAlN layer can be formed with substantially avoids phase separation while having a lattice constant almost equal to AlN, thus permitting the formation of a high quality heterojunction of BInAlN/AlN. The band gap of the AlN emitter layer (6.2 eV which corresponds to the light wavelength of 200 nm) is larger than that of BInAlN base layer (5.8 eV which corresponds to the wavelength of 212 nm). The light impinges on the emitter side. For the embodiment shown, impinging light in the wavelength range between 200 nm and 212 nm is transparent to the emitter layer, so that the light in that range is absorbed in the BInAlN base layer and generates electron and hole pairs. The holes generated by the optical absorption in the p-type base layer are well confined in the base layer because the valence band discontinuity between AlN and BInAlN is larger than that for a conventional AlN homojunction photo transistor. This leads to the induction of a larger emitter current, which offers better electronic neutralization in the base region than in the case of the homojunction photo transistor. Therefore, blue photo detectors with high quantum efficiency and high sensitivity, and the resultant high conversion efficiency from input light to collector current, are obtained. In the event that other lower frequencies are to be detected, the BInAlN base layer may be replaced with, for example for blue-green light, InGaN.

Figure 49:
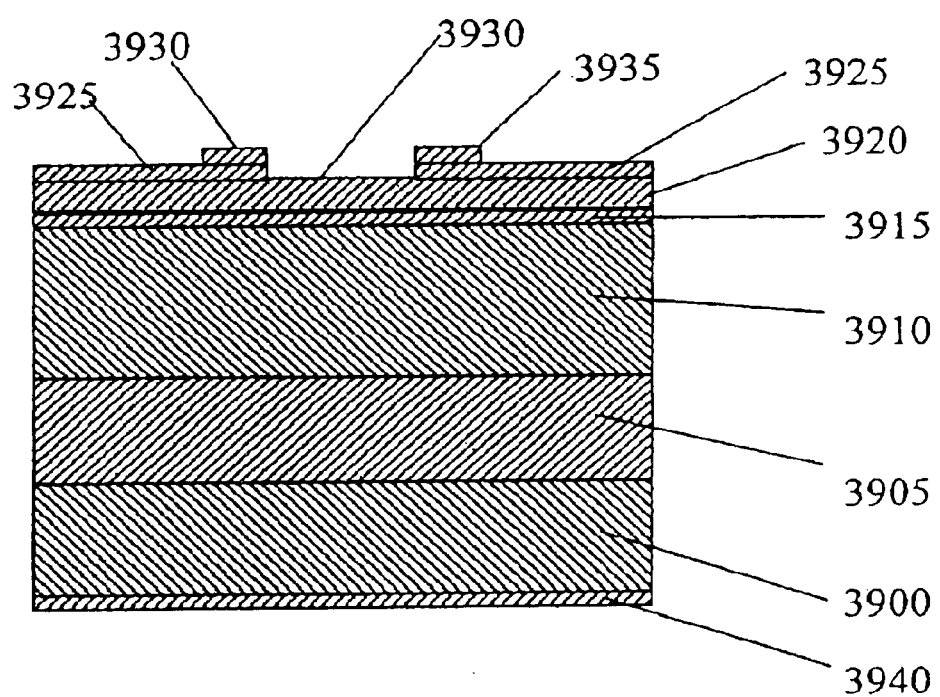
FIG. 49 shows an implementation of the present invention as a photodiode.

In addition to the phototransistor of FIG. 48, it is also possible to implement a photodiode in accordance with the present invention. Referring to FIG. 49, an n-type AlN substrate 3900 is provided, on which is formed an n-type layer 3910 of $B_{1-x-y}In_xAl_yN$ quaternary material or equivalent, which conforms to the relationships discussed above in connection with FIG. 48. An active layer 3915 is thereafter formed, and above that is formed a layer 3920 of p-type $B_{1-x-y}In_xAl_yN$ quaternary material. Then, a p-type second cladding layer 3925 is formed above the layer 3920, and a window 3930 is formed therein to expose a portion of the layer 3920. The window 3930 provides a port by which light can impinge on the layer 3920, causing the creation of holes. A pair of electrodes 3935 and 3940 may be fabricated in a conventional manner, with the electrode 3935 typically being a ring electrode around the window 3930. It will be appreciated that the band gap of the second cladding layer 3925 is preferably larger than the band gap of the layer 3920, which is in turn preferably larger than the band gap of the active layer 3915; such an approach provides sensitivity to the widest range of wavelength of light. If the event a narrower range is desired, a material with a lower band gap than the layer 3920 may be used for the layer 3925. In addition, it is also not necessary to include the layer 3925 in all embodiments, as the layers 3910, 3915 and 3920 provide, in at least some instances, an adequate photosensitive pn-junction.

Having fully described a preferred embodiment of the invention and various alternatives, those skilled in the art will recognize, given the teachings herein, that numerous alternatives and equivalents exist which do not depart from the invention. It is therefore intended that the invention not be limited by the foregoing description, but only by the appended claims.

We claim:

1. A light emitting device comprising:
a certain conduction type of a GaN first cladding layer, an $In_{1-x-t-y1}Ga_{x1}Al_{y1}N$ second cladding layer of said certain conduction type, an $In_{1-x2-y2}Ga_{x2}Al_{y2}N$ active layer, an opposite conduction type of an $In_{1-x3-y3}Ga_{x3}Al_{y3}N$ third cladding layer, an opposite conduction type of GaN fourth cladding layer, all successively formed one upon each other, wherein x1, x2, x3 define the gallium mole fraction, y1, y2 and y3 define the aluminum mole fraction, and x1, y1, x2, y2, x3 and y3 have a relationship of 0<=x1+y1<=1, 0<x2+y2<1,0<=x3+y3<=1, 1<=x1/0.80+y1/0.89, 1<=x2/0.80+y2/0.89, 1<=x3/0.80+y3/0.89, and $Eg_{InN}(1-x1-y1)+Eg_{GaN}x1+Eg_{AlN}y1=Eg_{InN}(1-x2-y2)+Eg_{GaN}x2+Eg_{AlN}y2$, $Eg_{InN}(1-x3-y3)+Eg_{GaN}x3 +Eg_{AlN}y3>Eg_{InN}(1-x3-y3)+Eg_{GaN}x3+Eg_{AlN}y3$ where $Eg_{InN}$, $Eg_{GaN}$, and $Eg_{AlN}$ are the bandgap energy of InN, GaN, and AlN, respectively.

2. A light emitting device comprising:
a certain conduction type of an $In_{1-x1-y1}Ga_{x1}Al_{y1}N$ first cladding layer of said certain conduction type, an $In_{1-x2-y2}Ga_{x2}Al_{y2}N$ active layer, an opposite conduction type of an $In_{1-x3-y3}Ga_{x3}Al_{y3}N$ second cladding layer, said $In_{1-x3-y3}Ga_{x3}Al_{y3}N$ second cladding layer has a ridge structure, all successively formed one upon each other, wherein x1, x2, and x3 define the gallium mole fraction, y1, y2, and y3 define the aluminum mole fraction, and x1, y1, x2, y2, x3, and y3 have a relationship of 0<=x1+y1<=1, 0<x2+y2<1, 0<=x3+y3<=1, 1<=x1/0.80+y1/0.89, 1<=x2/0.80+y2/0.89, 1<=x3/0.80+y3/0.89, $Eg_{InN}(1-x1-y1)+Eg_{GaN}x1+Eg_{AlN}y1>Eg_{InN}(1-x2-y2)+Eg_{GaN}x2+Eg_{AlN}y2$, and $Eg_{InN}(1-x3-y3)+Eg_{GaN}x3+Eg_{AlN}y3>Eg_{InN}(1-x2-y2)+Eg_{GaN}x2+Eg_{AlN}y2$, where $Eg_{InN}$, $Eg_{GaN}$, and $Eg_{AlN}$ are the bandgap energy of InN, GaN, and AlN, respectively.

3. A semiconductor structure comprising:
a first cladding layer of BAlGaN material having a first conduction type,
an BaIGaN active layer, and
a second cladding layer of BAlGaN material having a conduction type opposite the first conduction type, the mole fractions of the constituent elements of each layer being selected to minimize phase separation.

4. A light emitting device according to claim 3, wherein the AlN mole fraction, x, and the GaN, y, of all the constituent layers satisfy the condition that x+1.12 y nearly equals to a constant value.

5. A light emitting device according to claim 3, wherein the AlN mole fraction, x, and the GaN, y, of all of the constituent layers satisfy the condition that x+1.12 y nearly equals to 1.

6. A semiconductor structure comprising:
a first cladding layer of BAlGaN material having a first conduction type,
an BAlGaN active layer, and
a second cladding layer of BAlGaN material having a conduction type opposite the first conduction type, the crystal growth temperature and the mole fractions of the constituent elements of each layer being selected to minimize phase separation.

7. A light emitting device comprising:
a first conduction type of an BAlGaN first cladding layer without phase separation, an BAlGaN active layer without phase separation, and a second conduction type of BAlGaN second cladding layer without phase separation, said BAlGn second cladding layer having a ridge structure, all successively formed one upon each other.

8. A light emitting device according to claim 7, wherein the AlN mole fraction, x, and the GaN, y, of all the constituent layers satisfy the condition that x+1.12 y nearly equals constant value.

9. A light emitting device according to claim 7, wherein the GaN mole fraction, x, and the AlN, y, of all the constituent layers satisfy the condition that x+1.12 y nearly equals 1.

10. A light emitting device comprising:
a certain conduction type of an $B_{1-x1-y1}Al_{x1}Ga_{y1}N$ first cladding layer, an $B_{1-x2-y2}Al_{x2}Ga_{y2}N$ active layer, an opposite conduction type of an $B_{1-x3-y3}Al_{x3}Ga_{y3}N$ third cladding layer, all successively formed on one upon each other, wherein x1, x2, x3 define the gallium mole fraction, y1, y2 and y3 define the aluminum mole fraction, and x1, y1, x2, y2, x3 and y3 have a relationship of $0<=x1+y1<=1$, $0<x2+y2<1$, $0<=x3+y3<=1$, $1<=1.04x1+1.03y1$, $1<=1.04x2+1.03y2$, $1<=1.04x3+1.03y3$, and $Eg_{BN}(1-x1-y1)+Eg_{AlN}x1+Eg_{GaN}y1>Eg_{BN}(1-x2-y2)+Eg_{AlN}x2+Eg_{GaN}y2$, $Eg_{BN}(1-x3-y3)+Eg_{AlN}x3+Eg_{GaN}y3>Eg_{BN}(1-x3-y3)+Eg_{AlN}x3+Eg_{GaN}y3$ where $Eg_{BN}$, $Eg_{GaN}$, and $Eg_{AlN}$ are the bandgap energy of BN, GaN, and AlN, respectively.

11. A light emitting device according to claim 10, wherein said active layer is an BAlGaN single or multiple quantum well active layer whose AlN mole fraction, xw, and GaN mole fraction, yw of all the constituent layers of said active layer satisfy the relationship of $0<xw+yw<1$ and $1<=1.04 xw+1.03 yw$.

12. A light emitting device according to claim 10, wherein the condition of $xs+1.2 ys$ nearly equals to a constant value is satisfied, wherein xs and ys are the AlN mole fraction and the GaN mole fraction, respectively in each constituent BAlGaN layers.

13. A light emitting device according to claim 10, wherein the relationship of $xs+1.2 ys$ nearly equals 1 is satisfied, where xs and ys are the AlN mole fraction and the GaN mole fraction, respectively in each constituent BAlGaN layers.

14. A light emitting device comprising:

a certain conduction type of an $B_{1-x1-y1}Al_{x1}Ga_{y1}N$ first cladding layer of said certain conduction type, an $B_{1-x2-y2}Al_{x2}Ga_{y2}N$ active layer, an opposite conduction type of an $B_{1-x3-y3}Al_{x3}Ga_{y3}N$ second cladding layer, said $B_{1-x3-y3}Al_{x3}Ga_{y3}N$ second cladding layer has a ridge strict, all successively formed one upon each other, wherein x1, x2, and x3 define the gallium mole fraction, y1, y2, and y3 define the aluminum mole fraction, and x1, y1, x2, y2, x3, and y3 have a relationship of $0<=x1+y1<=1.0<x2+y2<1,0<=x3+y3<=1$, $1<=1.04x1+1.03y1$, $1<=1.04x2+1.03y2$, $1<=1.04x3+1.03y3$, $Eg_{BN}(1-x1-y1)+Eg_{AlN}x1+Eg_{GaN}y1<Eg_{BN}(1-x2-y2)+Eg_{AlN}x2+Eg_{GaN}y2$, and $Eg_{BN}(1-x3-y3)+Eg_{AlN}x3+Eg_{GaN}y3>Eg_{BN}(1-x2-y2)+Eg_{AlN}x2+Eg_{GaN}y2$, where $Eg_{BN}$, $Eg_{AlN}$, and $Eg_{GaN}$ are the bandgap energy of BN, AlN, and GaN, respectively.

15. A light emitting device according to claim 14, wherein said active layer is an BAlGaN single or multiple quantum well active layer whose AlN mole fraction, xw, and GaN mole fraction, yw of all the constituent layers satisfy the relationship of $0<xw+yw<1$ and $1<=1.03 yw$.

16. A light emitting device according to claim 14, wherein the condition of $xs+1.2 ys$ nearly equals to a constant value is satisfied, where xs and ys are the AlN mole fraction and the GaN mole fraction, respectively in each constituent BAlGaN layers.

17. A light emitting device according to claim 14, wherein the relationship of $xs+1.12 ys$ nearly equals 1 is satisfied, wherein xs and ys are the AlN mole fraction and the GaN mole fraction, respectively in each constituent BAlGaN layers.

18. A semiconductor structure comprising:

a first cladding layer of BGaInN material having a first conduction type, an BGaInN active layer, and a second cladding layer of BGaInN material having a conduction type opposite the first conduction type, the mole fractions of the constituent elements of each layer being selected to minimize phase separation.

19. A semiconductor structure comprising:

a first cladding layer of GBaInN material having a first conduction type, an BGaInN active layer, and a second cladding layer of BGaInN material having a conduction type opposite the first conduction type, the crystal growth temperature and the mole fractions of the constituent elements of each layer being selected to minimize phase separation.

20. A light emitting device according to claim 19, wherein the GaN mole fraction, x and the InN, y, of all the constituent layers satisfy the condition that $x+1.56 y$ nearly equals to a constant value.

21. A light emitting device according to claim 19, wherein the GaN mole fraction, x, and the InN, y of all the constituent layers satisfy the condition that $x+1.56 y$ nearly equals to 1.

22. A light emitting device comprising:

a first conduction type of an BGaInN first cladding layer without phase separation, an BGaInN active layer without phase separation, and a second conduction type of BGaInN second cladding layer without phase separation, said BGaInN second cladding layer having a ridge structure, all successively formed one upon each other.

23. A light emitting device according to claim 22, wherein the GaN mole fraction, x, and the InN, y, of all the constituent layers satisfy the condition that $x+1.56 y$ nearly equals constant value.

24. A light emitting device according to claim 22, wherein the GaN mole fraction, x, and the InN, y, of all the constituent layers satisfy the condition that $x+1.56 y$ nearly equals 1.

25. A light emitting device comprising:

a certain conduction type of an $B_{1-x1-y1}Ga_{x1}In_{y1}N$ first cladding layer, an $B_{1-x2-y2}Ga_{x2}In_{y2}N$ active layer, an opposite conduction type of an $B_{1-x3-y3}Ga_{x3}In_{y3}N$ third cladding layer, all successively formed one upon each other, wherein x1, x2, x3, define the gallium mole fraction, y1, y2 and y3 define the aluminum mole fraction, and x1, y1, x2, y2, x3 and y3 have a relationship of $0<=x1<=1$, $0<x2+y2<1$, $0<=x3+y3<=1$, $1<=1.03$ $x1+0.88$ $y1$ or $1<=0.95$ $x1+1.03$ $y1$, $1<=1.03$ $x2+0.88$ $y2$ or $1<=0.95$ $x2+1.03$ $y2$, $1<=1.03$ $x3+0.88$ $y3$ or $1<=0.95x3+1.03$ $y3$, $1<=1.04x3+1.03$ $y3$, and $Eg_{BN}(1-x1-y1)+Eg_{GaN}x1+Eg_{InN}y1>Eg_{BN}(1-x2-y2)+Eg_{GaN}x2+Eg_{InN}y2$, $Eg_{BN}(1-x3-y3)+Eg_{GaN}X3+Eg_{InN}y3>$ $Eg_{BN}(1-x3-y3)+Eg_{GaN}x3+Eg_{InN}y3$ where $Eg_{BN}$, $Eg_{InN}$, and $Eg_{GaN}$ are the bandgap energy of BN, InN, and GaN, respectively.

26. A light emitting device according to claim 25, wherein said active layer is an GBaInN single or multiple quantum well active layer whose GaN mole fraction, xw, and InN mole fraction, yw of all the constituent layers of said active layer satisfy the relationship of $0<xw+yw<1$ and $1<=1.03$ $xw+0.88$ $yw$ or $1<=0.95$ $xw+1.03$ $yw$.

27. A light emitting device according to claim 25, wherein the condition of $xs+1.56 ys$ nearly equals to a constant value is satisfied, wherein xs and ys are the GaN mole fraction and the InN mole fraction, respectively in each constituent BGaInN layers.

28. A light emitting device according to claim 25, wherein the relationship of $xs+1.56 ys$ nearly equals 1 is satisfied, where xs and ys are the GaN mole fraction and the InN mole fraction, respectively in each constituent BGaInN layers.

29. A light emitting device comprising:

a certain conduction type of an $B_{1-x1-y1}Ga_{x1}In_{y1}N$ first cladding layer of said certain conduction type, an $B_{1-x2-y2}Ga_{x2}In_{y2}N$ active layer, an opposite conduction type of an $B_{1-x3-y3}Ga_{x3}In_{y3}N$ second cladding layer, said $B_{1-x3-y3}Ga_{x3}In_{y3}N$ second cladding layer has a ridge strict, all successively formed one upon each other, wherein x1, x2, and x3 define the gallium mole fraction, y1, y2, and y3 define the aluminum mole fraction, and x1, y1, x2, y2, x3, and y3 have a relationship of 0<=x1+y1<=1, 0<x2+y2<1, 0<=x3+y3<=1, 1<=1.03 x1+0.88 y1 or 1<=0.95 x1+1.03 y1, 1<=1.03 x2+0.88 y2 or 1<=0.95 x2+1.03 y2, 1<=1.03 x3x3+0.88 y3 or 1<=0.95 x3+1.03 y3, 1<=1.04 x3, 1<=1.04 x3+1.03 y3, and $Eg_{BN}(1-x1-y1)+Eg_{GaN}x1+Eg_{InN}y1>Eg_{BN}(1-x2-y2)+Eg_{GaN}x2+Eg_{InN}y2$, $Eg_{BN}(1-x3-y3)+Eg_{GaN}x3+Eg_{InN}y3>Eg_{BN}(1-x3-y3)+Eg_{GaN}x3+Eg_{InN}Y3$ where $Eg_{BN}$, $Eg_{InN}$, and $Eg_{GaN}$ are the bandgap energy of BN, InN, and GaN, respectively.

30. A light emitting device according to claim 29, wherein said advance layer is an BGaInN single or multiple quantum well active layer whose GaN mole fraction, xw, and InN mole fraction, yw of all the constituent layers satisfy the relationship of 0<xw+yw<1 and 1<=1.03 xw+0.88 yw or 1<=0.95 xw+1.01 yw.

31. A light emitting device according to claim 29, wherein the condition of xs+1.56 ys nearly equals to a constant value is satisfied, where xs and ys are the GaN mole fraction and the InN mole fraction, respectively in each constituent BGaInN layers.

32. A light emitting device according to claim 29, wherein the relationship of xs+1.56 ys nearly equals 1 is satisfied, wherein xs and ys are the GaN mole fraction and the InN mole fraction, respectively in each constituent BGaInN layers.

33. A semiconductor structure comprising:
a first cladding layer of BInAlN material having a first conduction type,
an BInAlN active layer, and
a second cladding layer of BInAlN material having a conduction type opposite the first conduction type, the mole fractions of the constituent elements of each layer being selected to minimize phase separation.

34. A semiconductor structure comprising:
a first cladding layer of BInAlN material having a first conduction type,
an BInAlN active layer, and
a second cladding layer of BInAlN material having a conduction type opposite the first conduction type, the crystal growth temperature and the mole fractions of the constituent elements of each layer being selected to minimize phase separation.

35. A light emitting device according to claim 34, wherein the InN mole fraction, x, and the AlN, y, of all the constituent layers satisfy the condition that 1.75 x+y nearly equals to a constant value.

36. A light emitting device according to claim 34, wherein the InN mole fraction, x, and the AlN, y, of all the constituent layers satisfy the condition that 1.75 x+y nearly equals to 1.

37. A light emitting device according to claim 34, wherein said active layer is an BInAlN single or multiple quantum well active layer whose InN mole fraction, xw, and AlN mole fraction, yw of all the constituent layers satisfy the relationship of 0<xw+yw<1 and 1<=1.01 xw+0.88 yw or 1<=0.61 xw+1.04 yw.

38. A light emitting device according to claim 34, wherein the condition of 1.75 xs+ys nearly equals to a constant value is satisfied, where xs and ys are the InN mole fraction and the AlN mole fraction, respectively in each constituent BInAlN layers.

39. A light emitting device according to claim 34, wherein the relationship of 1.75 xs+ys nearly equals 1 is satisfied, wherein xs and ys are the InN mole fraction and the AlN mole fraction, respectively in each constituent BInAlN layers.

40. A light emitting device comprising:
a first conduction type of an BInAlN first cladding layer without phase separation, an BInAlN active layer without phase separation, and a second conduction type of BInAlN second cladding layer without phase separation, said BInAlN second cladding layer having a ridge structure, all successively formed one upon each other.

41. A light emitting device according to claim 40, wherein the InN mole fraction, x, and the AlN, y, of all the constituent layers satisfy the condition that 1.75 x+y nearly equals constant value.

42. A light emitting device according to claim 40, wherein the InN mole fraction, x, and the AlN, y, of all the constituent layers satisfy the condition that 1.75 x+y nearly equals 1.

43. A light emitting device comprising:
a certain conduction type of an $B_{1-x1-y1}In_{x1}Al_{y1}N$ first cladding layer, an $B_{1-x2-y2}In_{x2}Al_{y2}N$ active layer, an opposite conduction type of an $B_{1-x3-y3}In_{x3}Al_{y3}N$ third cladding layer, all successively formed one upon each other, wherein x1, x2, x3 define the gallium mole fraction, y1, y2 and y3 define the aluminum mole fraction, and x1, y1, x2, y2, x3 and y3 have a relationship of 0<=x1+y1<=1, 0<x2+y2<1, 0<=x3+y3<=1, 1<=1.01 x1+0.88 y1 or 1<=0.61 x1+1.04 y1, 1<=1.01 x2+0.88 y2 or 1<=0.61 x2+1.04 y2, 1<=1.01 x3+0.88 y3 or 1<=0.61 x3+1.04 y3, and $Eg_{BN}(1-x1-y1)+Eg_{InN}x1+Eg_{AlN}y1>Eg_{BN}(1-x2-y2)+Eg_{InN}x2+Eg_{AlN}y2$, $Eg_{BN}(1-x3-y3)+Eg_{InN}x3+Eg_{AlN}y3>Eg_{BN}(1-x3-y3)+Eg_{InN}x3+Eg_{AlN}y3$ where $Eg_{BN}$, $Eg_{InN}$, and $Eg_{AlN}$ are the bandgap energy of BN, InN, and AlN, respectively.

44. A light emitting device according to claim 43, wherein said active layer is an BInAlN single or multiple quantum well active layer whose InN mole fraction, xw, and AlN mole fraction, yw of all the constituent layers of said active layer satisfy the relationship of 0<xw+yw<1 and 1<=1.01 xw+0.88 yw or 1<=0.61 xw+1.04 yw.

45. A light emitting device according to claim 43, wherein the condition of 1.75 xs+ys nearly equals to a constant value is satisfied, wherein xs and ys are the InN mole fraction and the AlN mole fraction, respectively in each constituent BInAlN layers.

46. A light emitting device according to claim 43, wherein the relationship of 1.75 xs+ys nearly equals 1 is satisfied, where xs and ys are the InN mole fraction and the AlN mole fraction, respectively in each constituent BInAlN layers.

47. A light emitting device comprising:
a certain conduction type of an $B_{1-x1-y1}In_{x1}Al_{y1}N$ first cladding layer of said certain conduction type, an $B_{1-x2-y2}In_{x2}Al_{y2}N$ active layer, an opposite conduction type of an $B_{1-x3-y3}In_{x3}Al_{y3}N$ second cladding layer, said $B_{1-x3-y3}In_{x3}Al_{y3}N$ second cladding layer has ridge structure, all successively formed one upon each other, wherein x1, x2, and x3 define the gallium mole fraction, y1, y2, and y3 define the aluminum mole fraction, and x1, y1, x2, y2, x3, and y3 have a relationship of 0<=x1+y1<=1, 0<x2+y2<1, 0<=x3+y3<=1, 1<=1.01x1+0.88 y1 or 1<=0.61 x1+1.04 y1, 1<=1.01 x2+0.88 y2 or 1<=0.61 x2+1.04 y2, 1>=1.01 x3+0.88 y3 or 1<=0.61 x3+1.04 y3, and $Eg_{BN}(1-x1-y1)+Eg_{InN}x1+Eg_{AlN}y1>Eg_{BN}(1-x2-y2)+Eg_{InN}x2+Eg_{AlN}y2$, $Eg_{BN}(1-x3-y3)+Eg_{InN}x3+Eg_{AlN}y3>Eg_{BN}(1-x3-y3)+Eg_{InN}X3+Eg_{AlN}y3$ where $Eg_{BN}$, $Eg_{InN}$, and $Eg_{AlN}$ are the bandgap energy of BN, InN, and AlN, respectively.

* * * * *